(12) United States Patent
Jiang et al.

(10) Patent No.: US 10,811,427 B1
(45) Date of Patent: Oct. 20, 2020

(54) SEMICONDUCTOR STRUCTURE AND MANUFACTURING METHOD THEREOF

(71) Applicant: MACRONIX INTERNATIONAL CO., LTD., Hsinchu (TW)

(72) Inventors: Yu-Wei Jiang, Hsinchu (TW); Kuo-Pin Chang, Zhubei (TW); Chieh-Fang Chen, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/387,650

(22) Filed: Apr. 18, 2019

(51) Int. Cl.
*H01L 27/1158* (2017.01)
*H01L 21/762* (2006.01)
*H01L 29/417* (2006.01)

(52) U.S. Cl.
CPC .... *H01L 27/1158* (2013.01); *H01L 21/76224* (2013.01); *H01L 29/41741* (2013.01)

(58) Field of Classification Search
None
See application file for complete search history.

(56) References Cited

U.S. PATENT DOCUMENTS

| 8,163,616 | B2* | 4/2012 | Kang | .................. H01L 27/115 257/326 |
| 10,629,608 | B2* | 4/2020 | Yeh | ..................... H01L 27/1157 |
| 2010/0038699 | A1 | 2/2010 | Katsumata et al. | |
| 2012/0248518 | A1 | 10/2012 | Li et al. | |
| 2015/0060992 | A1 | 3/2015 | Taekyung et al. | |
| 2019/0081060 | A1* | 3/2019 | Lu | .................... H01L 27/11578 |

FOREIGN PATENT DOCUMENTS

| CN | 106340521 | A | 1/2017 |
| TW | 201639126 | A | 11/2016 |
| TW | 201705451 | A | 2/2017 |
| TW | 201737471 | A | 10/2017 |

OTHER PUBLICATIONS

Notice of Allowance dated Dec. 25, 2019 in Taiwan application (No. 108113673).

* cited by examiner

*Primary Examiner* — Steven M Christopher
(74) *Attorney, Agent, or Firm* — McClure, Qualey & Rodack, LLP

(57) ABSTRACT

A semiconductor structure includes a substrate, conductive layers, dielectric layers, an isolation structure, a first memory structure, and a second memory structure. The conductive layers and the dielectric layers are interlaced and stacked on the substrate. The isolation structure is disposed on the substrate and through the conductive layers and the dielectric layers. Each of the first and second memory structures has a radius of curvature. The first and second memory structures penetrate through the conductive layers and the dielectric layers and are disposed on opposite sidewalls of the isolation structure. Each of the first and second memory structures includes protecting structures and a memory structure layer including a memory storage layer. The protecting structures are disposed at two ends of the memory storage layer, and an etching selectivity to the protecting structures is different from an etching selectivity to the memory storage layer.

7 Claims, 80 Drawing Sheets

S10

S20

S20

S30

S30

S40

S40

S50

S50

S50

S60

S60

S70

S70

S70

S80

S80

S80

S80

S80

S90

S90

S90

S90

S90

S100

S100

S100

S100

S100

S100

S110

S110

S110

S110

S110

S120

S120

S120

S120

S130

S130

S130

S130

S130

S140

100

S140

S150

S150

S150

S160

S160

S160

S160

S170

S180

S190

500

SEMICONDUCTOR STRUCTURE AND MANUFACTURING METHOD THEREOF

BACKGROUND

Field of Invention

The present disclosure relates to a semiconductor structure and a manufacturing method of the semiconductor structure.

Description of Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof are in need.

As such, it is desirable to develop a three-dimensional (3D) memory device with larger number of multiple stacked planes to achieve greater storage capacity, improved qualities, all the while remaining in a small size.

SUMMARY

The disclosure relates in general to a semiconductor structure and a manufacturing method thereof. In the semiconductor structure of the disclosure, a pair of vertical memory structures both have horizontal C-shaped cross sections and are separated from each other by an isolation trench; accordingly, the memory density in a unit area is increased, and hence a greater memory storage capacity is achieved.

According to an embodiment of the present disclosure, the semiconductor structure includes a substrate, a plurality of conductive layers, a plurality of dielectric layers, an isolation structure, a first memory structure, and a second memory structure. The conductive layers and the dielectric layers are interlaced and stacked on the substrate. The isolation structure is disposed on the substrate and through the conductive layers and the dielectric layers. Each of the first memory structure and the second memory structure has a radius of curvature. The first memory structure and the second memory structure penetrate through the conductive layers and the dielectric layers are disposed on opposite sidewalls of the isolation structure. Each of the first memory structure and the second memory structure includes a memory structure layer, a channel layer, and at least two protecting structures. The memory structure layer includes a memory storage layer. The channel layer is disposed between the memory structure layer and the isolation structure. The protecting structures are disposed at two ends of the memory storage layer, in which an etching selectivity to the protecting structures is different from an etching selectivity to the memory storage layer.

In an embodiment of the present disclosure, the memory structure layer further includes a blocking layer and a tunneling layer. The blocking layer is disposed on sidewalls of the conductive layers and the dielectric layers. The memory storage layer is disposed between the blocking layer and the tunneling layer. The protecting structures are disposed between the blocking layer and the tunneling layer and adjoin the memory storage layer.

In an embodiment of the present disclosure, each of the first memory structure and the second memory structure further includes a dielectric structure and a conductive plug layer, the dielectric structure is disposed between the channel layer and the isolation structure, and the conductive plug layer is disposed on the dielectric structure.

In an embodiment of the present disclosure, each of the conductive layers further includes a barrier layer and a metal layer disposed on the barrier layer.

In an embodiment of the present disclosure, the semiconductor structure further includes a plurality of high-k dielectric layers disposed between the dielectric layers and the barrier layers, respectively.

In an embodiment of the present disclosure, the memory structure layer and the channel layer corresponding to the first memory structure are respectively interconnected with the memory structure layer and the channel layer corresponding to the second memory structure at a bottom surface of the isolation structure.

In an embodiment of the present disclosure, the memory structure layer and the channel layer corresponding to the first memory structure are respectively separated from the memory structure layer and the channel layer corresponding to the second memory structure by the isolation structure.

In an embodiment of the present disclosure, each of the channel layers is in contact with the substrate.

In an embodiment of the present disclosure, the semiconductor structure further includes two contact structures, each electrically connected to the first memory structure and the second memory structure.

In an embodiment of the present disclosure, the semiconductor structure further includes at least a signal line interconnecting the corresponding one of the conductive structures.

In an embodiment of the present disclosure, the semiconductor structure further includes two signal lines connecting to the conductive structures, respectively.

According to an embodiment of the present disclosure, the manufacturing method of the semiconductor structure includes the following steps of: forming a plurality of insulating layers and a plurality of dielectric layers on a substrate, in which the insulating layers and the dielectric layers are interlaced and stacked on the substrate; forming a memory structure cluster on the substrate and through the insulating layers and the dielectric layers, in which the memory structure cluster includes a channel layer, a conductive plug layer, and a memory structure layer including a memory storage layer; forming a trench through the insulating layers, the dielectric layers, and the memory structure cluster, such that the memory structure cluster is separated into a first memory structure and a second memory structure, and portions of the insulating layers and portions of the memory storage layer are exposed from the trench; removing the exposed portions of the insulating layers and the exposed portions of the memory storage layer to respectively form a first group of spaces and a second group of spaces; filling a plurality of protecting structures in the first group of spaces and the second group of spaces; removing portions of the protecting structures such that the insulating layers are exposed from the first group of spaces; replacing the insulating layers with a plurality of conductive layers.

In an embodiment of the present disclosure, replacing the insulating layers with the conductive layers includes: removing the insulating layers, after the insulating layers are exposed, to form a third group of spaces between the dielectric layers; filling a plurality of conductive layers in the first group of spaces and the third group of spaces.

In an embodiment of the present disclosure, the manufacturing method of the semiconductor structure further includes: forming an isolation structure in the trench and on the memory structure cluster and a topmost layer of the dielectric layers after filling the conductive layers in the first group of spaces and the third group of spaces.

In an embodiment of the present disclosure, the memory structure cluster further includes a dielectric structure, the tunneling layer is disposed between the dielectric structure and the memory structure layer, and forming the memory structure cluster on the substrate and through the insulating layers and the dielectric layers includes: forming a recess with an elliptical profile, in which the recess penetrates the insulating layers and the dielectric layers; forming the memory structure layer in the recess and on the topmost layer of the dielectric layers; forming the channel layer on the memory structure layer; forming the dielectric structure on the channel layer to fill the recess; replacing a top portion of the dielectric structure with the conductive plug layer; removing a portion of the memory structure layer, a portion of the conductive plug layer, and a portion of the channel layer which are exceeded outside the recess.

In an embodiment of the present disclosure, forming the trench through the insulating layers, the dielectric layers, and the memory structure cluster includes: removing portions of the insulating layers, portions of the dielectric layers, a portion of the channel layer, and a portion of the conductive plug layer, such that the memory structure layer and the channel layer corresponding to the first memory structure are respectively interconnected with the memory structure layer, the channel layer, and the dielectric structure corresponding to the second memory structure at a bottom of the trench.

In an embodiment of the present disclosure, forming the trench through the insulating layers, the dielectric layers, and the memory structure cluster includes: removing portions of the insulating layers, portions of the dielectric layers, a portion of the channel layer, and a portion of the conductive plug layer, such that the memory structure layer and the channel layer corresponding to the first memory structure are respectively separated from the memory structure layer and the channel layer corresponding to the second memory structure by the trench.

In an embodiment of the present disclosure, the manufacturing method of the semiconductor structure further includes: forming an isolation layer on the memory structure cluster and the topmost layer of the dielectric layers; forming two contact structures, each electrically connected to the first memory structure and the second memory structure.

In the aforementioned embodiments of the present disclosure, the first memory structure and the second memory structure are separated from each other by the isolation structure, such that the memory density in a unit area is increased, and hence a greater memory storage capacity is achieved. Furthermore, the conductive layers stacked between the dielectric layers can help improve the program speed as well as the erase speed of the semiconductor structure due to the lower resistance. Moreover, the aforementioned embodiments of the present disclosure also provide a method of replacing the insulating layers with the conductive layers while preserving the memory storage layer which is made of the same material as the insulating layers, thereby simplifying the process of manufacturing the semiconductor structure.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
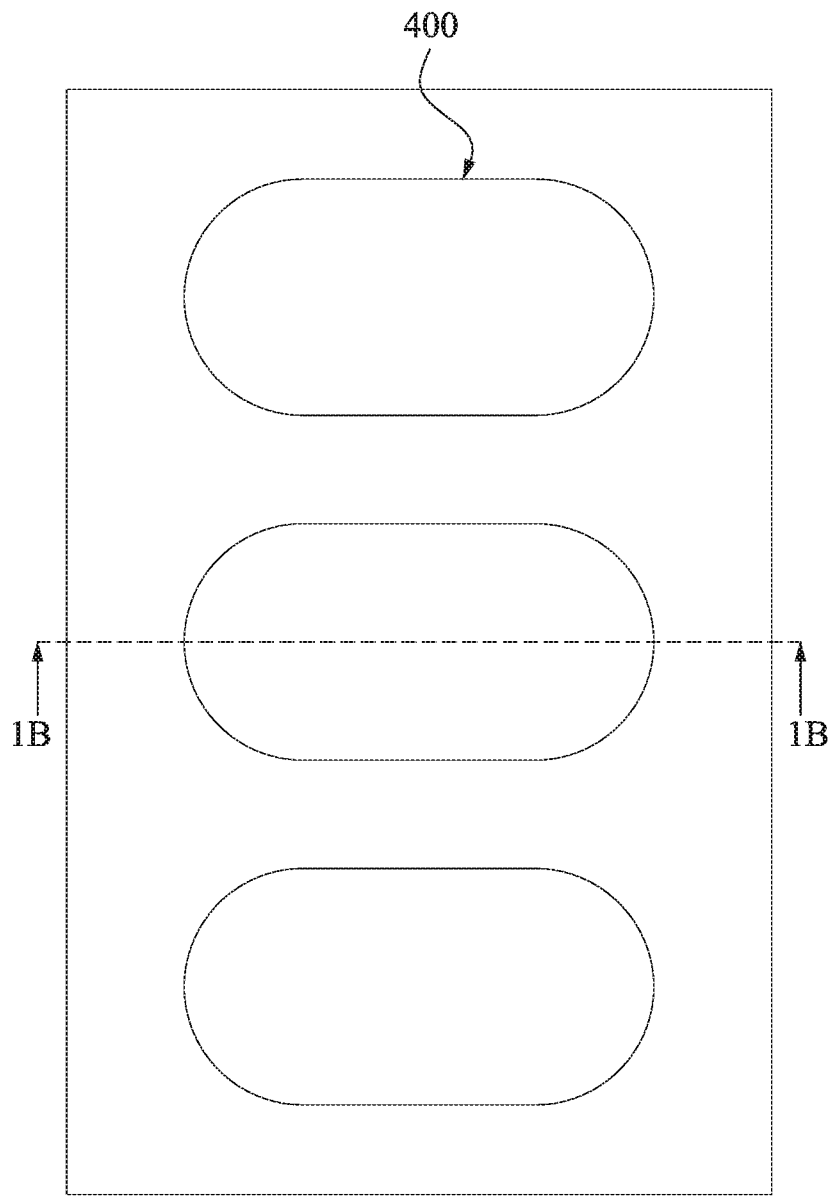
FIGS. 1A, 2A, 3A, 4A, 5A, 6A, 7A, 8A, 9A, 10A, 11A, 12A, 13A, and 14A are top views of a process at various stages of a manufacturing method of a semiconductor structure according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

In the embodiments of the present disclosure, a semiconductor structure and a method of manufacturing the same are provided. For the purpose of simplicity and clarity, the method of manufacturing the semiconductor structure will be discussed first in the article. Furthermore, the term "top view" may be used herein for ease of description to refer to as a cross-sectional view of a topmost layer of the semiconductor structure in order to highlight the technical features of the inventive concept. Besides, some of the secondary elements may be omitted in the drawings accompanying the following embodiments.

FIGS. 1A-1B, 2A-2B, 3A-3C, 4A-4C, 5A-5C, 6A-6C, 7A-7D, 8A-8F, 9A-9F, 10A-10F, 11A-11F, 12A-12F, 13A-13E, and 14A-14E are views of a process at various stages of a manufacturing method of a semiconductor structure 100 according to an embodiment of the present disclosure. For the purpose of simplicity and clarity, the elements covered beneath in the semiconductor structure 100 are illustrated in solid lines in the drawings.

Figure 1B:
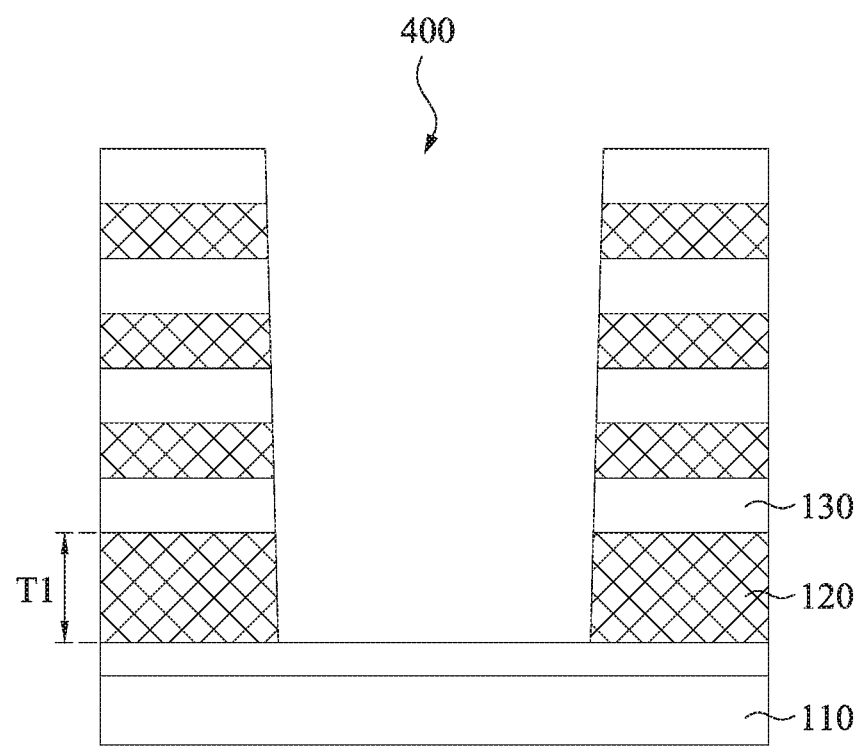
FIGS. 1B, 2B, 3B-3C, 4B-4C, 5B-5C, 6B-6C, 7B-7D, 8B-8F, 9B-9F, 10B-10F, 11B-11F, 12B, 12D-12F, 13B-13E, and 14B-14E are cross-sectional views of a process at various stages of a manufacturing method of a semiconductor structure according to an embodiment of the present disclosure.

Reference is made to FIGS. 1A and 1B, in which FIG. 1A is a top view of step S10 of forming the semiconductor structure 100, and FIG. 1B is a cross-sectional view taken along line 1B-1B in FIG. 1A. In step S10, a substrate 110 is provided, and a plurality of insulating layers 120 and a plurality of dielectric layers 130 are interlaced and stacked on the substrate 110. After the stacked layers are provided on the substrate 110, a recess 400 is then formed. The recess 400 penetrates through the insulating layers 120 and the dielectric layers 130 and stops below a bottommost layer of the insulating layers 120. As shown in FIG. 1A, the recess 400 has an elliptical profile, in a top view, and the long axis (the longer diameter) of the elliptical cross section may be as long as about 150 nm. In some embodiments of the present disclosure, a thickness T of the bottommost layer of the insulating layers 120 may be larger than a thickness of other layers of the insulating layers 120.

Figure 2A:
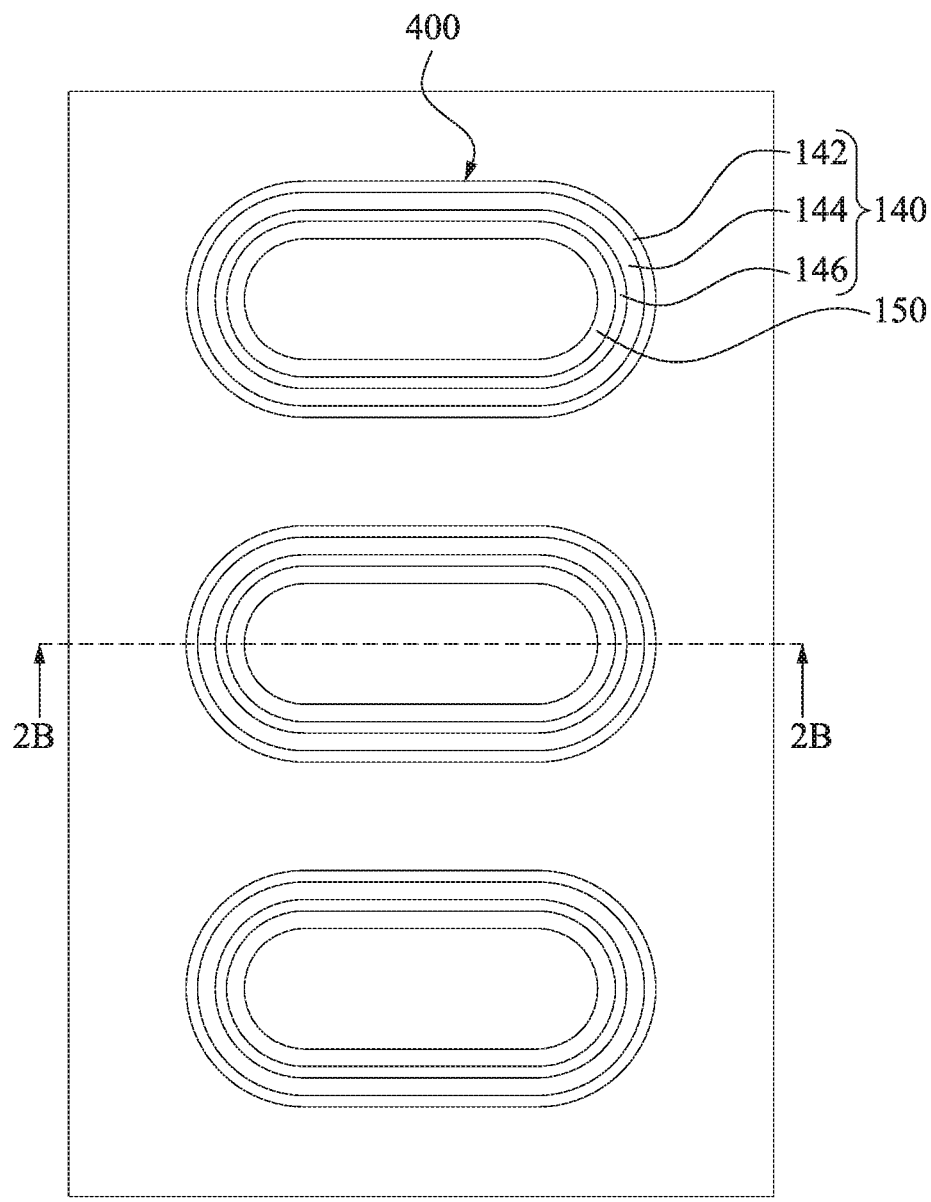
Figure 2B:
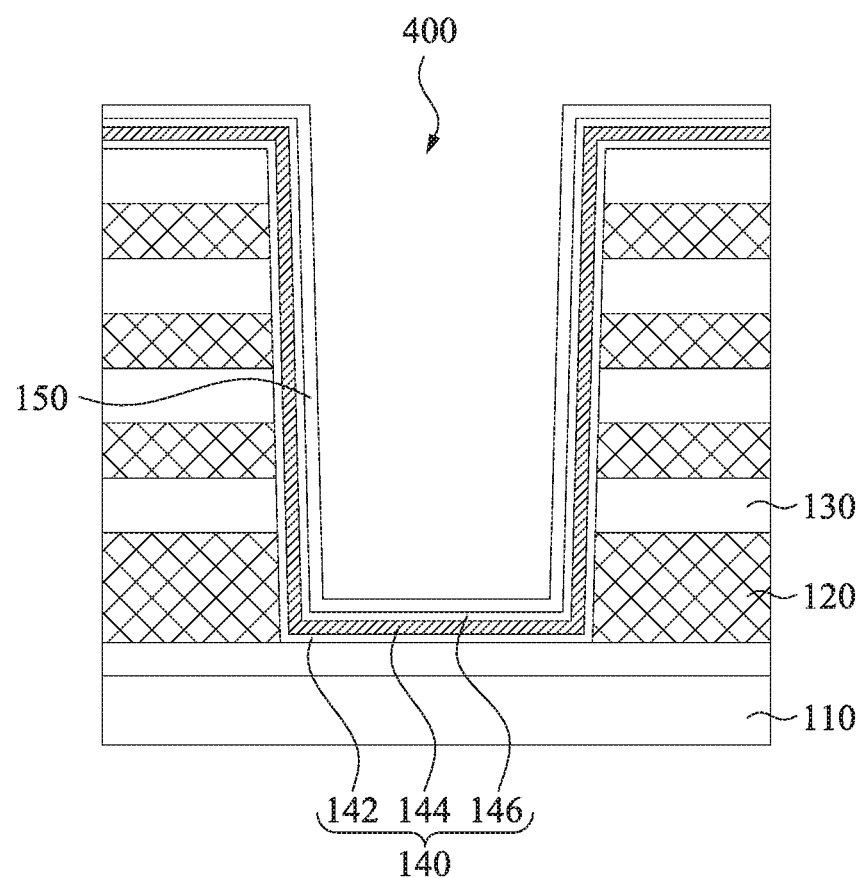

Reference is made to FIGS. 2A and 2B, in which FIG. 2A is a top view of step S20 of forming the semiconductor structure 100, and FIG. 2B is a cross-sectional view taken along line 2B-2B in FIG. 2A. In step S20, a memory structure layer 140 is conformally formed in the recess 400 and on a topmost layer of the dielectric layers 130, and a channel layer 150 is then conformally formed on the memory structure layer 140. The memory structure layer 140 includes a blocking layer 142, a memory storage layer 144, and a tunneling layer 146. The blocking layer 142 is disposed on sidewalls of the insulating layers 120 and the dielectric layers 130 and the topmost layer of the dielectric layers 130, the memory storage layer 144 is disposed on the blocking layer 142, and the tunneling layer 146 is disposed on the memory storage layer 144. In some embodiments of the present disclosure, the blocking layer 142 and the tunneling layer 146 may be made of a material including silicon oxide or other dielectric, the memory storage layer 144 may be made of a material including silicon nitride or other material that is able to trap electrons, and the channel layer 150 may be made of a material including undoped polysilicon, but the present disclosure is not limited in this regard.

Figure 3A:
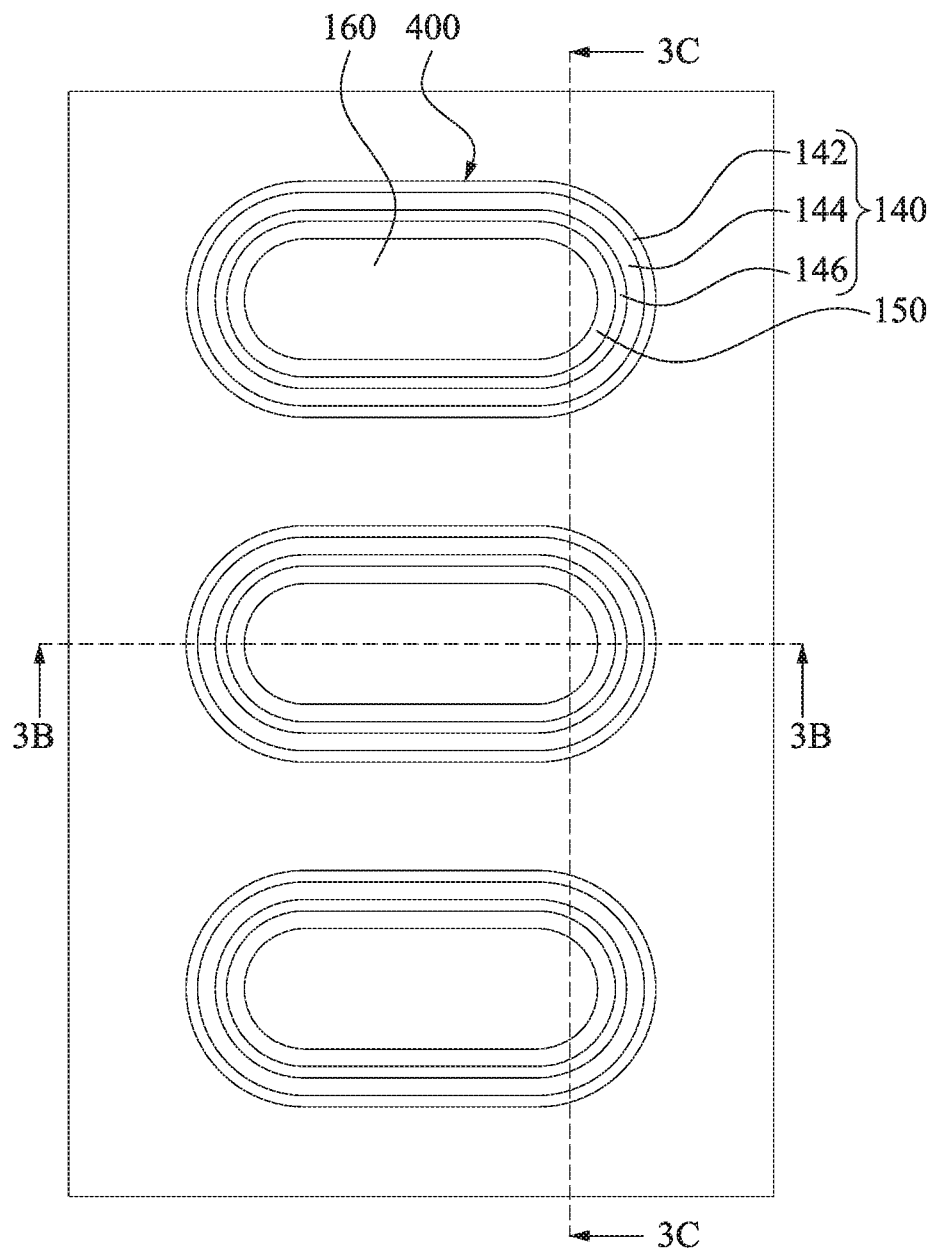
Figure 3B:
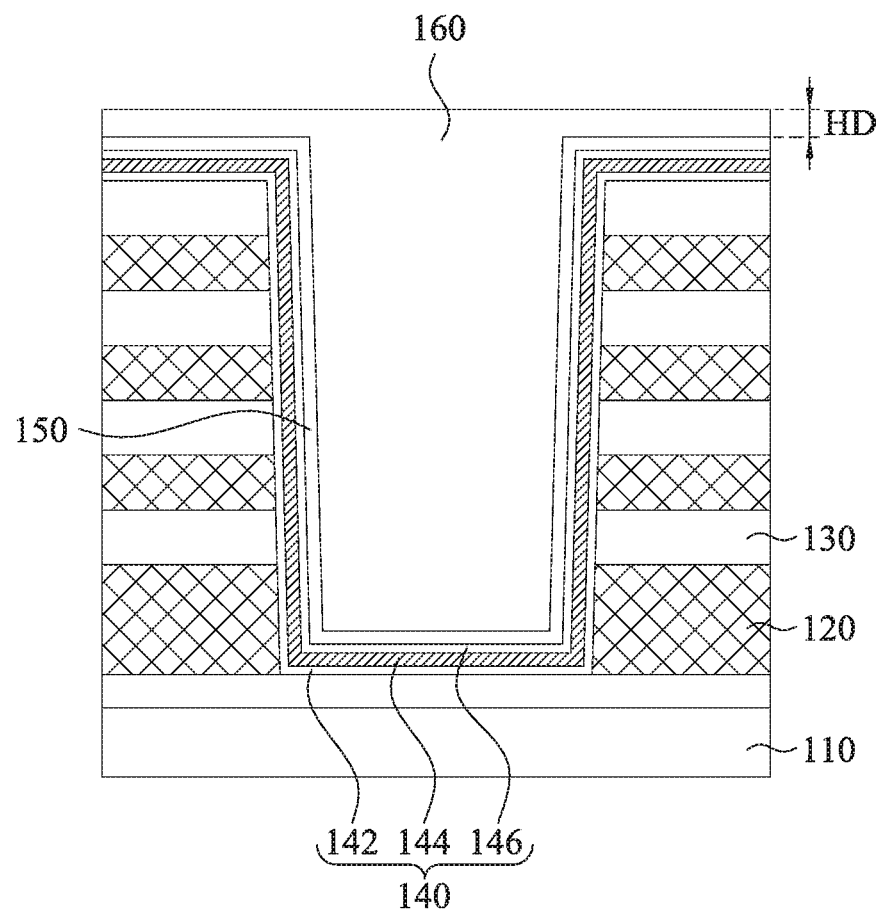
Figure 3C:
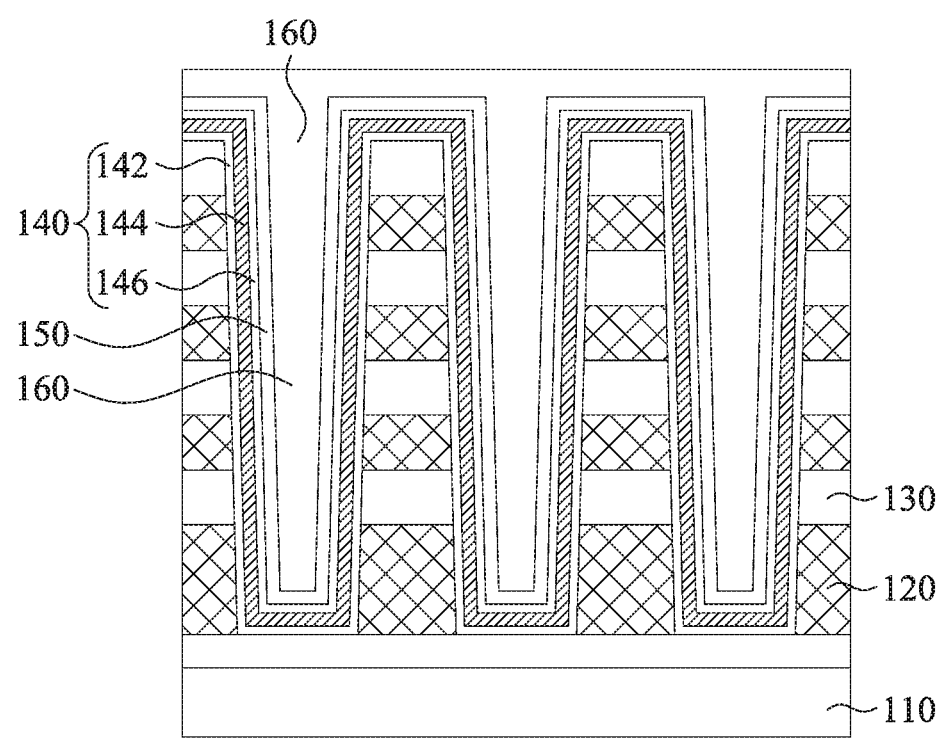

Reference is made to FIGS. 3A-3C, in which FIG. 3A is a top view of step S30 of forming the semiconductor structure 100, FIG. 3B is a cross-sectional view taken along line 3B-3B in FIG. 3A, and FIG. 3C is a cross-sectional view taken along line 3C-3C in FIG. 3A. In step S30, a dielectric structure 160 is disposed on the channel layer 150 to fill the recess 400 and formed over the topmost layer of the dielectric layers 130. A portion of the dielectric structure 160 which is formed over the topmost layer of the dielectric layers 130 is higher than a top surface of the channel layer 150 by a height HD. In some embodiments of the present disclosure, the dielectric structure 160 may be made of a material including silicon oxide or other dielectric.

Figure 4A:
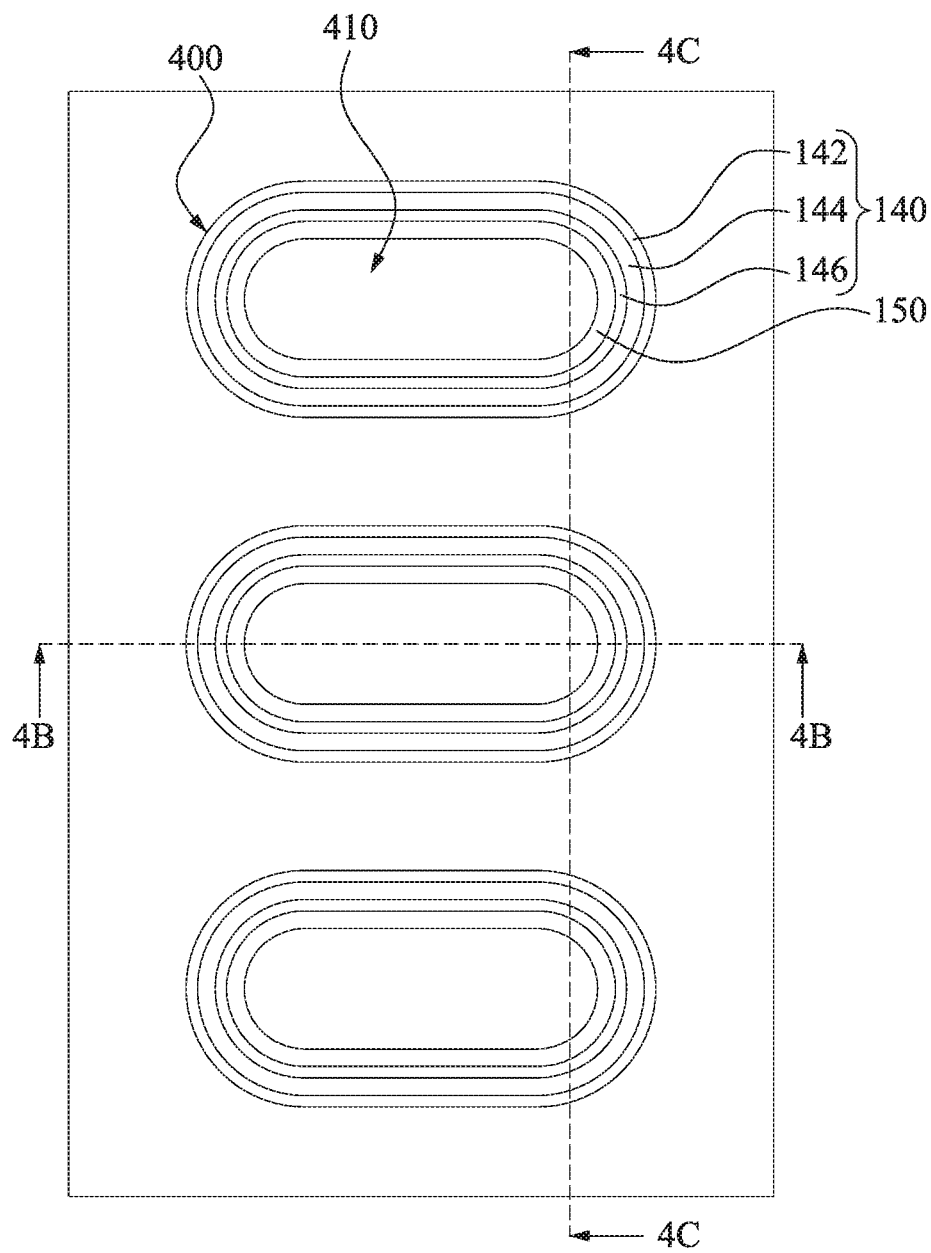
Figure 4B:
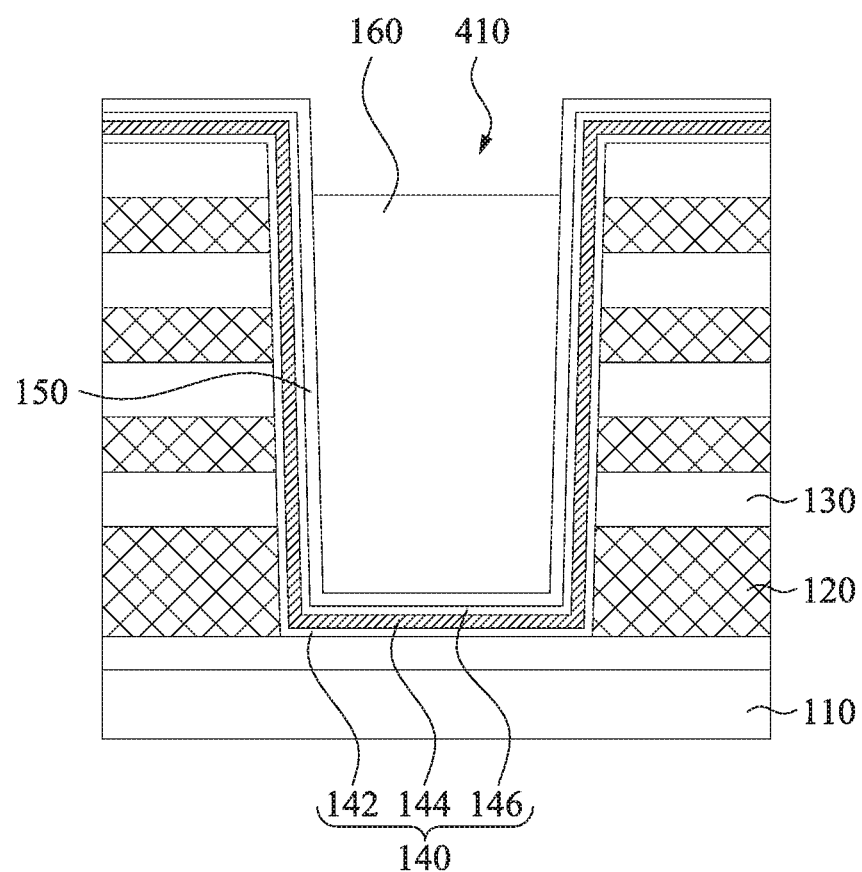
Figure 4C:
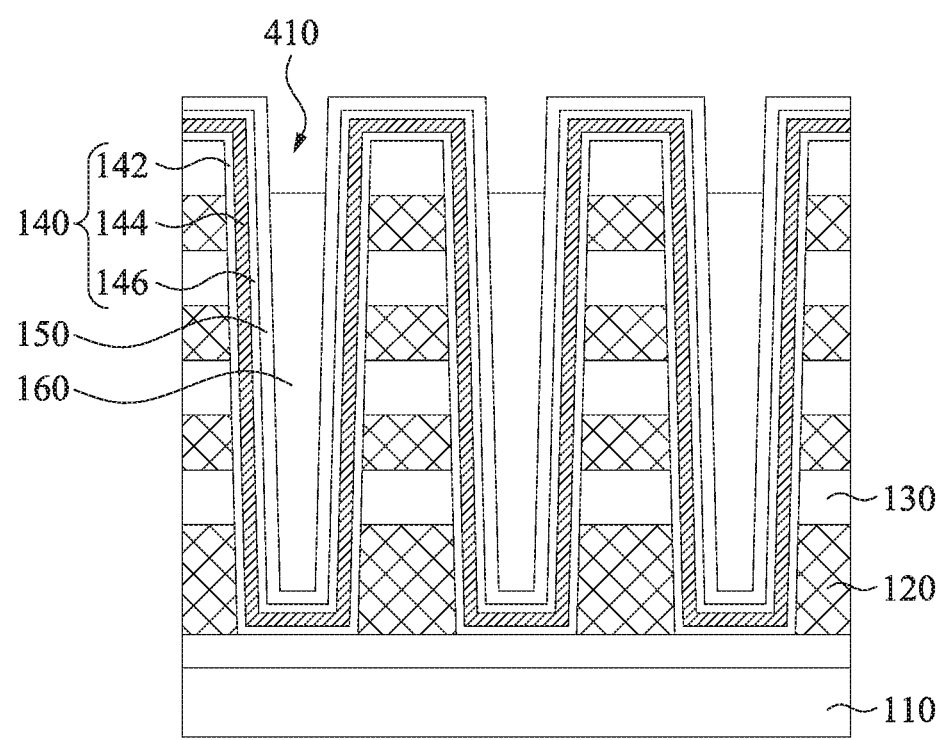

Reference is made to FIGS. 4A-4C, in which FIG. 4A is a top view of step S40 of forming the semiconductor structure 100, FIG. 4B is a cross-sectional view taken along line 4B-4B in FIG. 4A, and FIG. 4C is a cross-sectional view taken along line 4C-4C in FIG. 4A. In step S40, a top portion of the dielectric structure 160 is removed by a selective etching process, thereby forming an etched space 410 shown in FIGS. 4A-4C. The selective etching process may be a wet etching process or a dry etching process performed based on the difference in an etching selectivity between the oxide material and the polysilicon material, such that the dielectric structure 160 is removed while the channel layer 150 is preserved. As for the etching depth of the dielectric structure 160 in the recess 400, the selective etching process may stop at a desired position by a time mode control.

Figure 5A:
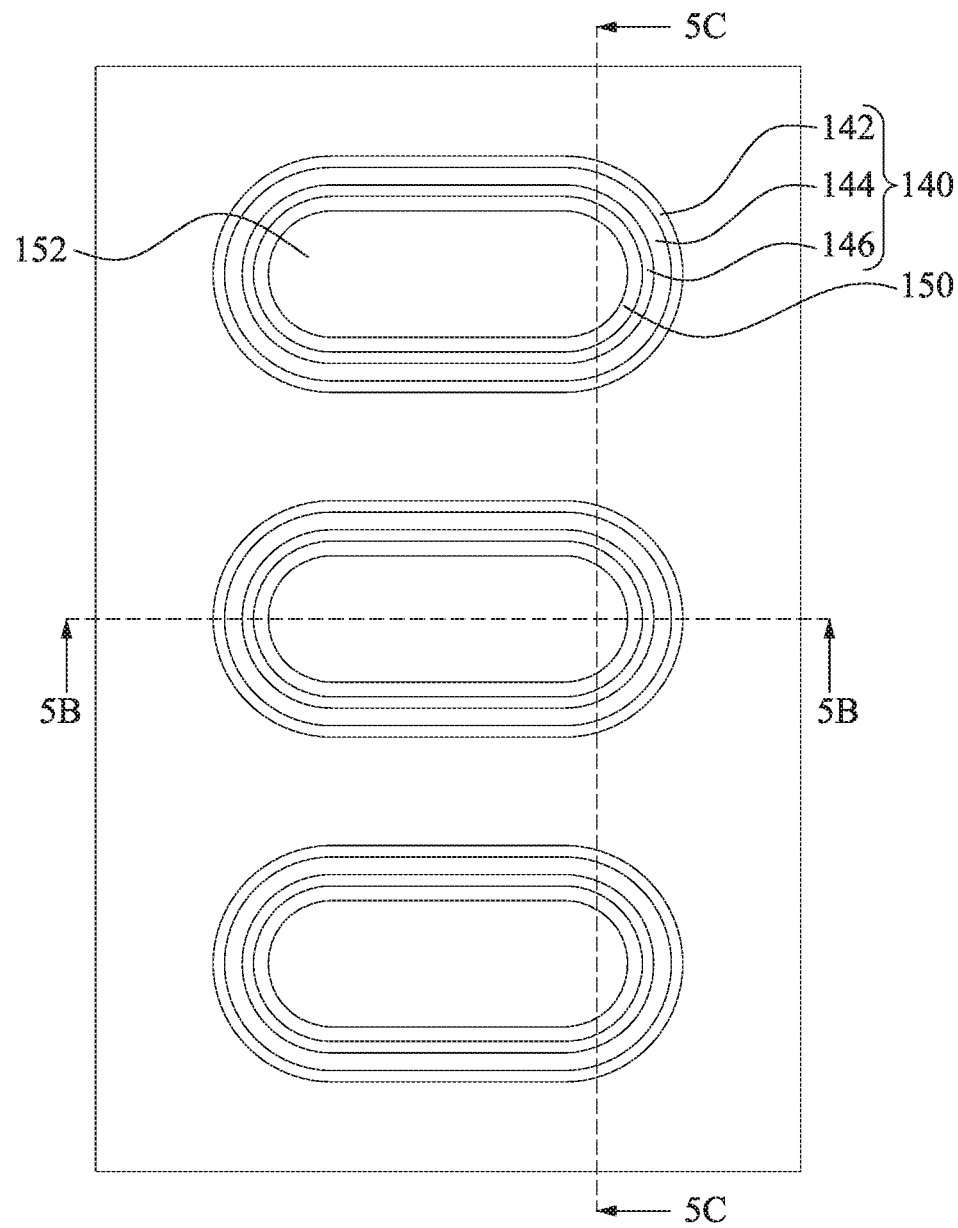
Figure 5B:
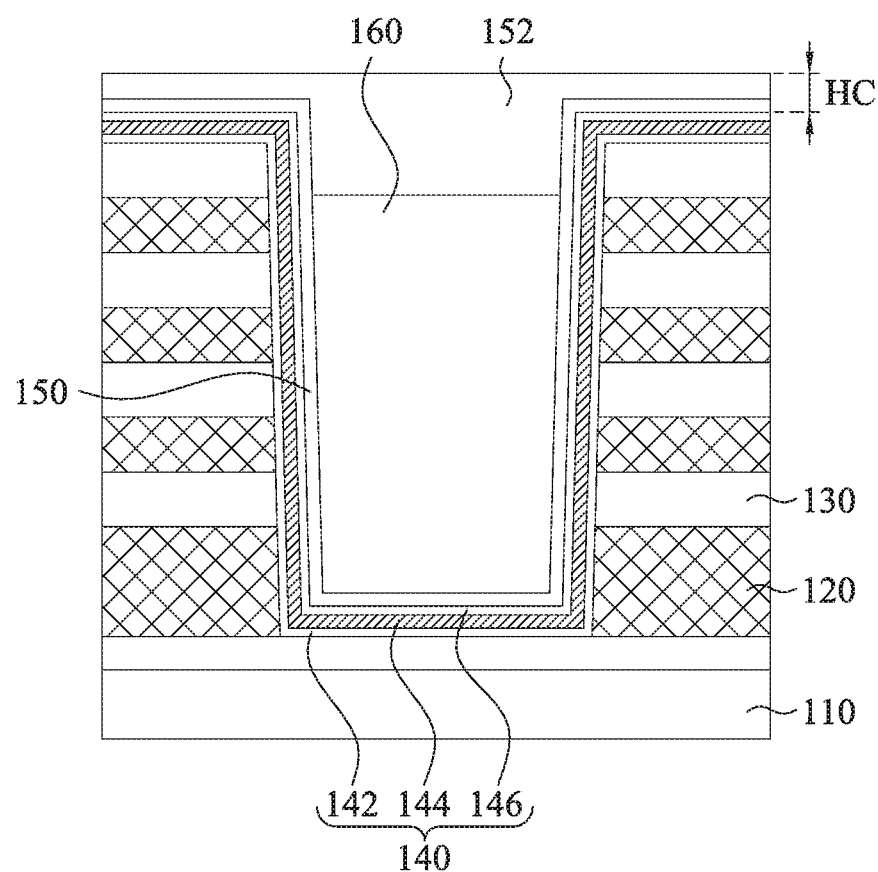
Figure 5C:
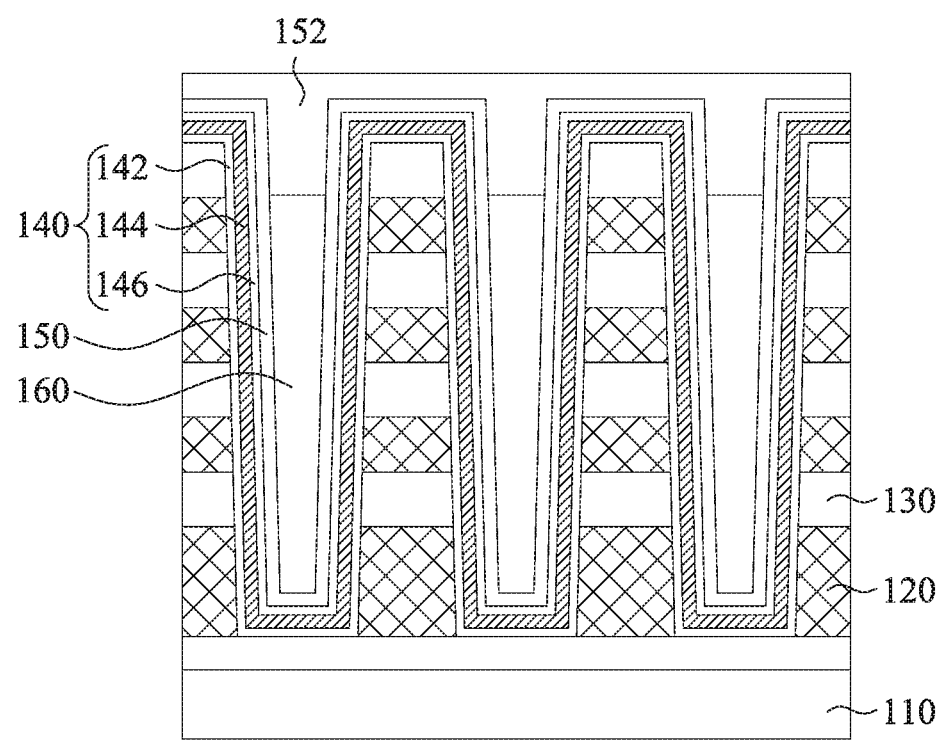

Reference is made to FIGS. 5A-5C, in which FIG. 5A is a top view of step S50 of forming the semiconductor structure 100, FIG. 5B is a cross-sectional view taken along line 5B-5B in FIG. 5A, and FIG. 5C is a cross-sectional view taken along line 5C-5C in FIG. 5A. In step S50, the etched space 410 is then refilled with a material including the same material as that of the channel layer 150, such as doped polysilicon, to form a conductive plug layer 152, resulting in a replacement of the top portion of the dielectric structure 160 with the conductive plug layer 152. As a result, the conductive plug layer 152 is disposed on the dielectric structure 160. In some embodiments of the present disclosure, the height HC (shown in FIG. 5B) of the conductive plug layer 152 on a top surface of the memory structure layer 140 may be larger than the height HD (shown in FIG. 3B) of the dielectric structure 160 on the top surface of the channel layer 150 before the selective etching process, but the present disclosure is not limited in this regard.

Figure 6A:
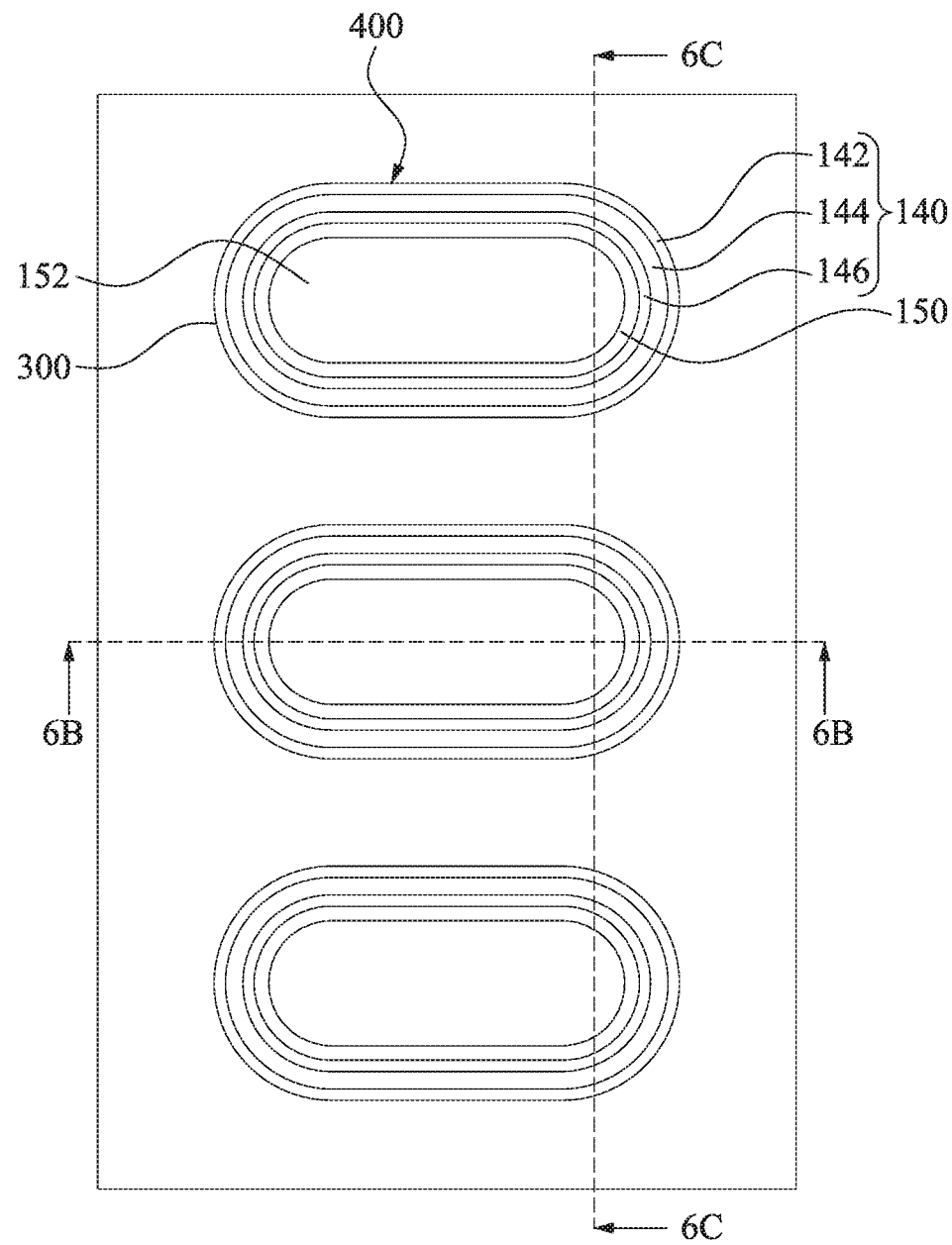
Figure 6B:
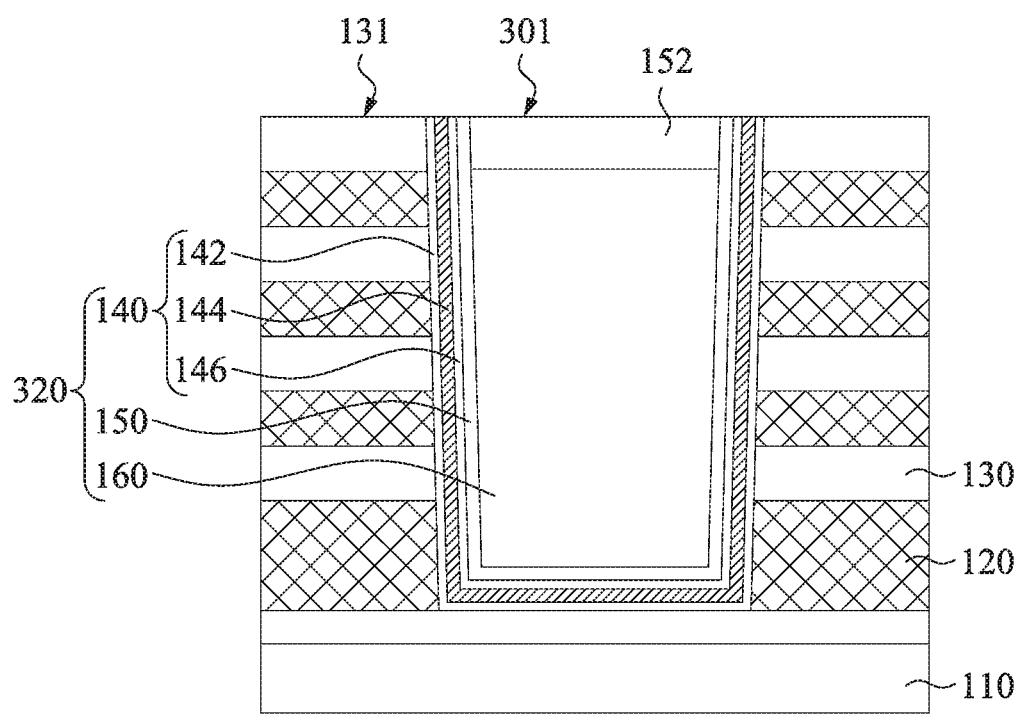
Figure 6C:
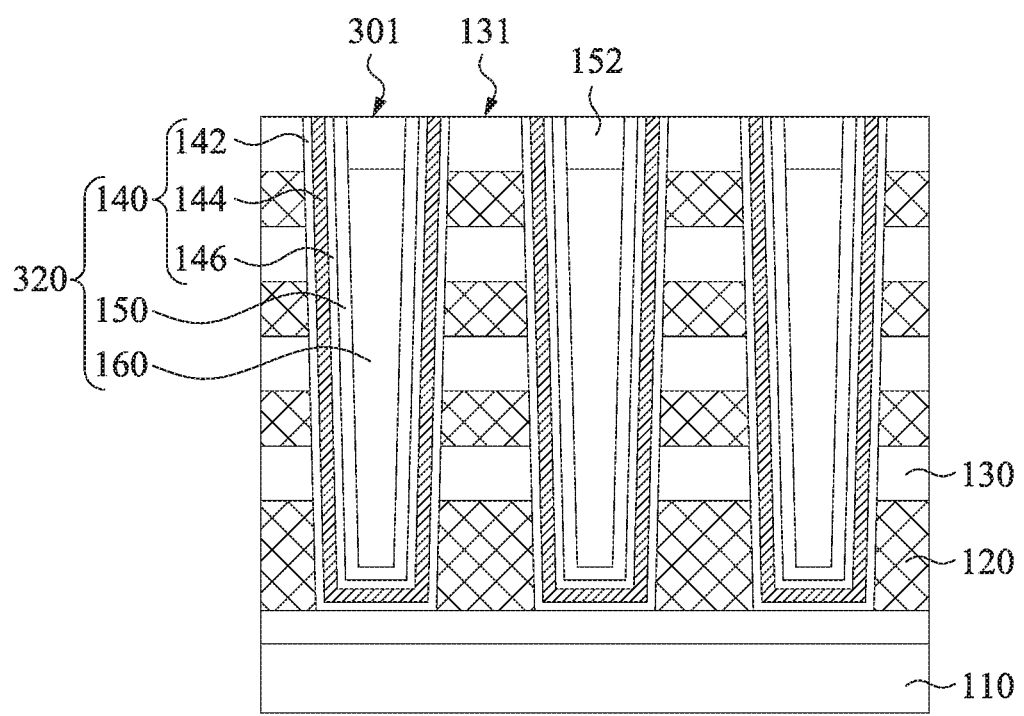

Reference is made to FIGS. 6A-6C, in which FIG. 6A is a top view of step S60 of forming the semiconductor structure 100, FIG. 6B is a cross-sectional view taken along line 6B-6B in FIG. 6A, and FIG. 6C is a cross-sectional view taken along line 6C-6C in FIG. 6A. In step S60, a portion of the memory structure layer 140, a portion of the conductive plug layer 152, and a portion of the channel layer 150 which are exceeded outside the recess 400 are removed by a planarization process such as a chemical-mechanical polishing (CMP) process, such that a top surface 131 of the topmost layer of the dielectric layers 130 is exposed. After the planarization process, the memory structure cluster 300 including the memory structure layer 140, the channel layer 150, the conductive plug layer 152, and the dielectric structure 160 is formed over the substrate 110 and through the insulating layers 120 and the dielectric layers 130, shown in FIGS. 6A-6B. In some embodiments of the present disclosure, a top surface 301 of the memory structure cluster 300 is substantially level with a top surface 131 of the topmost layer of the dielectric layers 130.

Figure 7A:
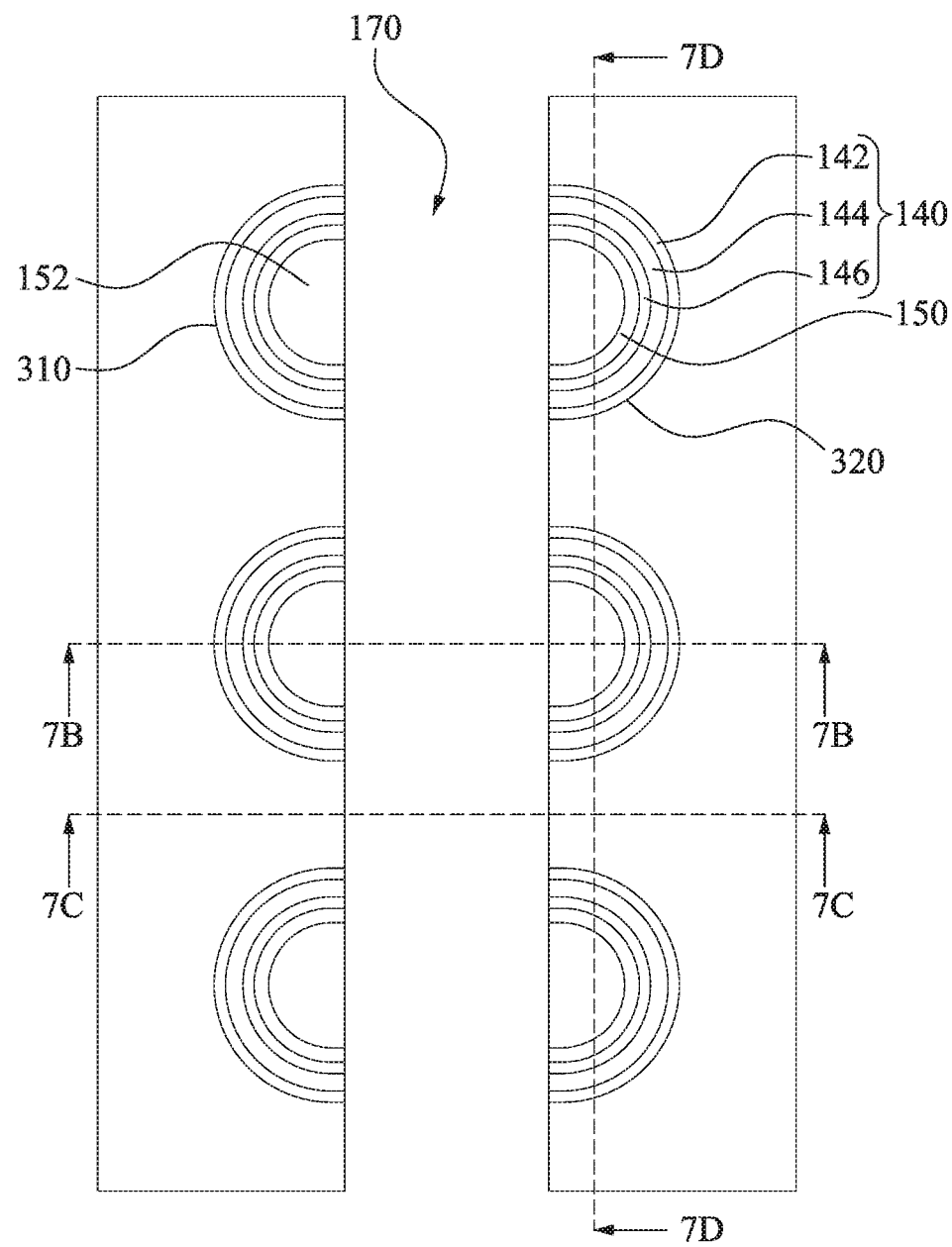
Figure 7B:
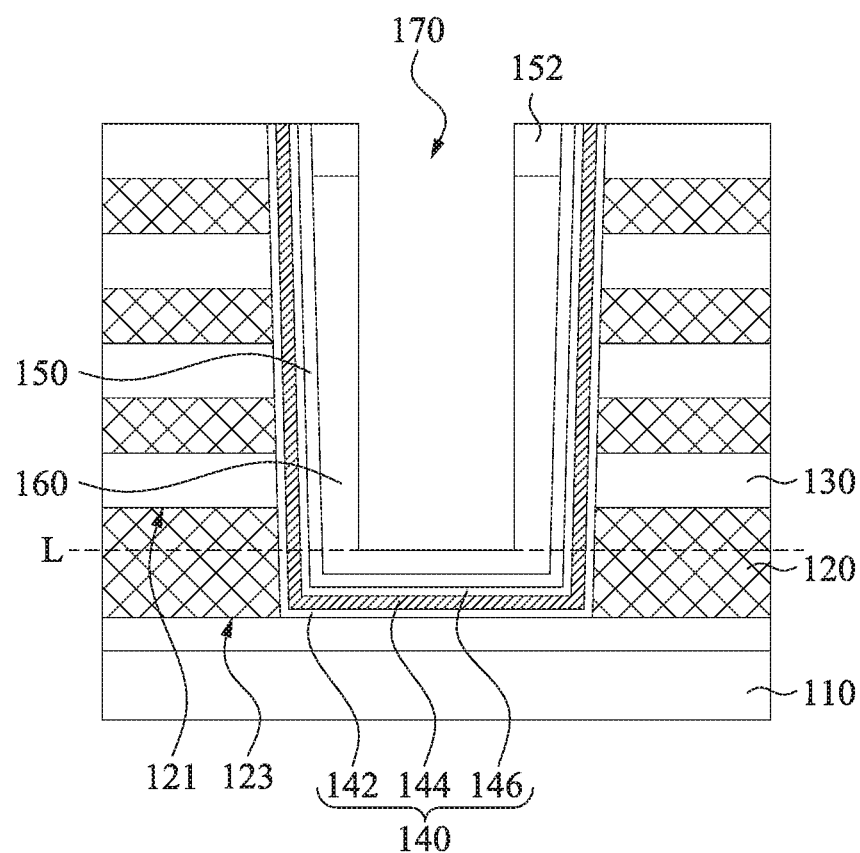
Figure 7C:
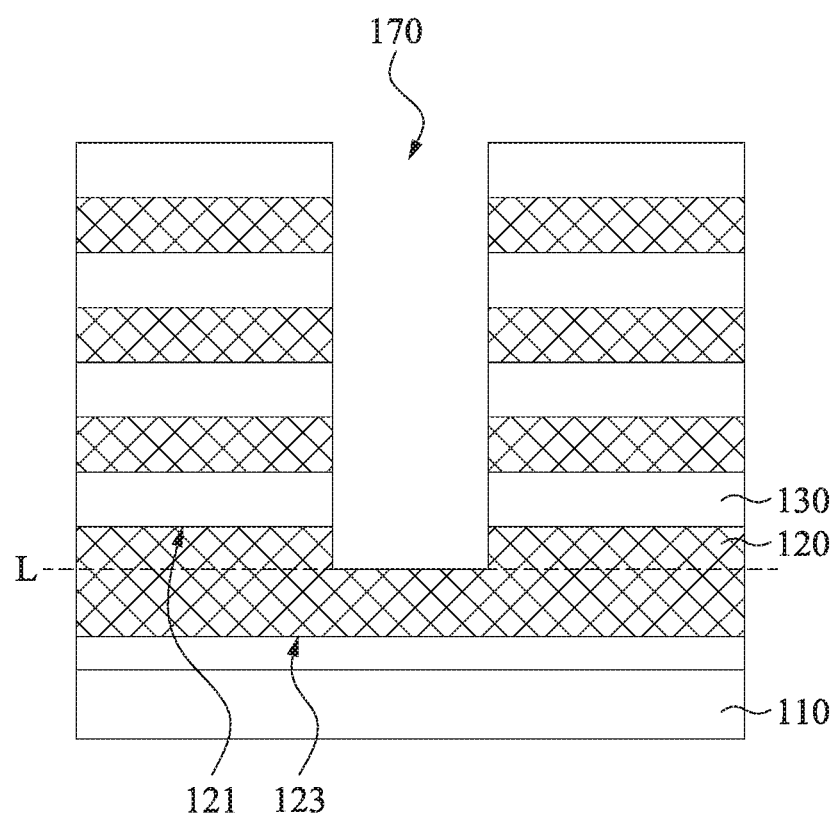
Figure 7D:
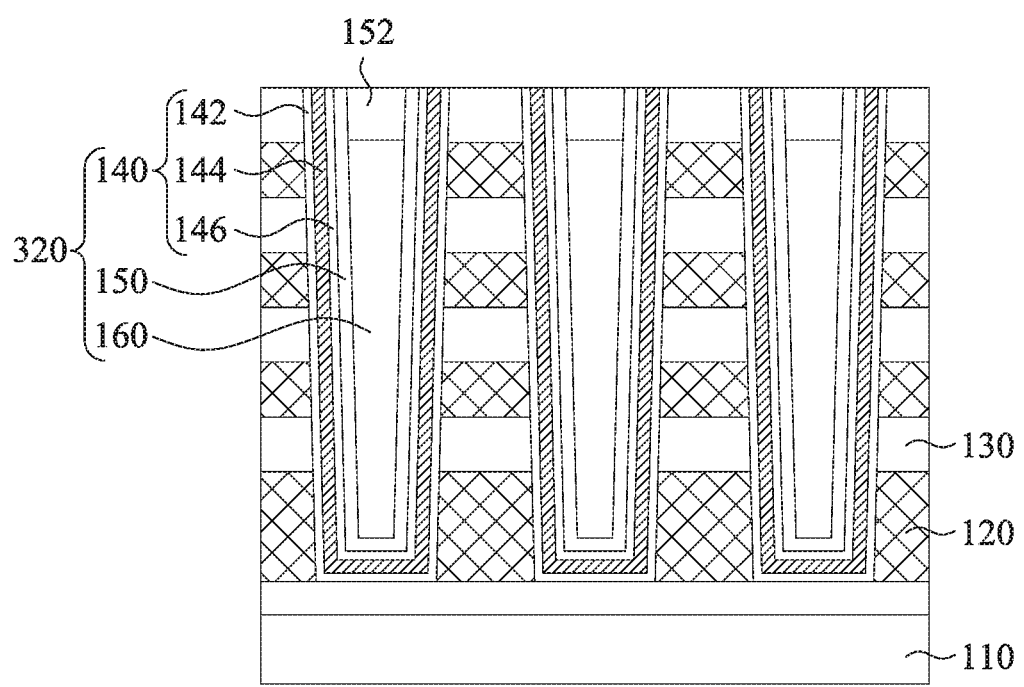

Reference is made to FIGS. 7A-7D, in which FIG. 7A is a top view of step S70 of forming the semiconductor structure 100, FIG. 7B is a cross-sectional view taken along line 7B-7B in FIG. 7A, FIG. 7C is a cross-sectional view taken along line 7C-7C in FIG. 7A, and FIG. 7D is a cross-sectional view taken along line 7D-7D in FIG. 7A. In step S70, portions of the dielectric layers 130, portions of the insulating layers 120, a portion of the channel layer 150, a portion of the conductive plug layer 152, and a portion of the dielectric structure 160 are removed by an etching process to form a trench 170. After the trench 170 is formed, the memory structure cluster 300 is separated into a first memory structure 310 and a second memory structure 320 shown in FIG. 7A, such that portions of the insulating layers 120, portions of the dielectric layers 130, portions of the memory structure layer 140 (including the blocking layer 142, the memory storage layer 144, and the tunneling layer 146), portions of channel layer 150, a portion of the conductive plug layer 152, and portions of dielectric structure 160 are exposed from the trench 170. As a result, the memory structure layer 140, the channel layer 150, and the dielectric structure 160 corresponding to the first memory structure 310 are respectively interconnected with the memory structure layer 140, the channel layer 150, and the dielectric structure 160 corresponding to the second memory structure 320, at a bottom of the trench 170. In the present embodiment, the radius of curvature of the first memory structure 310 is identical to the radius of curvature of the second memory structure 320, but the present disclosure is not limited in this regard. In other embodiments, the radius of curvature of the first memory structure 310 may be different from the radius of curvature of the second memory structure 320.

As shown in FIGS. 7A-7C, the etching process stops at an etching stop line L between a top surface 121 and a bottom surface 123 of the bottommost layer of the insulating layers 120, such that the dielectric structure 160 is exposed from a bottom of the trench 170, and the memory structure layer 140, the channel layer 150, and the dielectric structure 160 corresponding to the first memory structure 310 are respectively interconnected with the memory structure layer 140, the channel layer 150, and the dielectric structure 160 corresponding to the second memory structure 320. In some embodiments, as mentioned in FIG. 1B, the bottommost layer of the insulating layers 120 has the larger thickness, thereby providing additional etching flexibility, such that the etching process can stop at the etching stop line L in time by a time mode control. In some embodiments of the present disclosure, the etching process may be a plasma etching process. Furthermore, each of the first memory structure 310 and the second memory structure 320 has a C-shaped cross section complementing each other, and the first memory structure 310 and the second memory structure 320 are bilaterally symmetrical with respect to the trench 170.

Figure 8A:
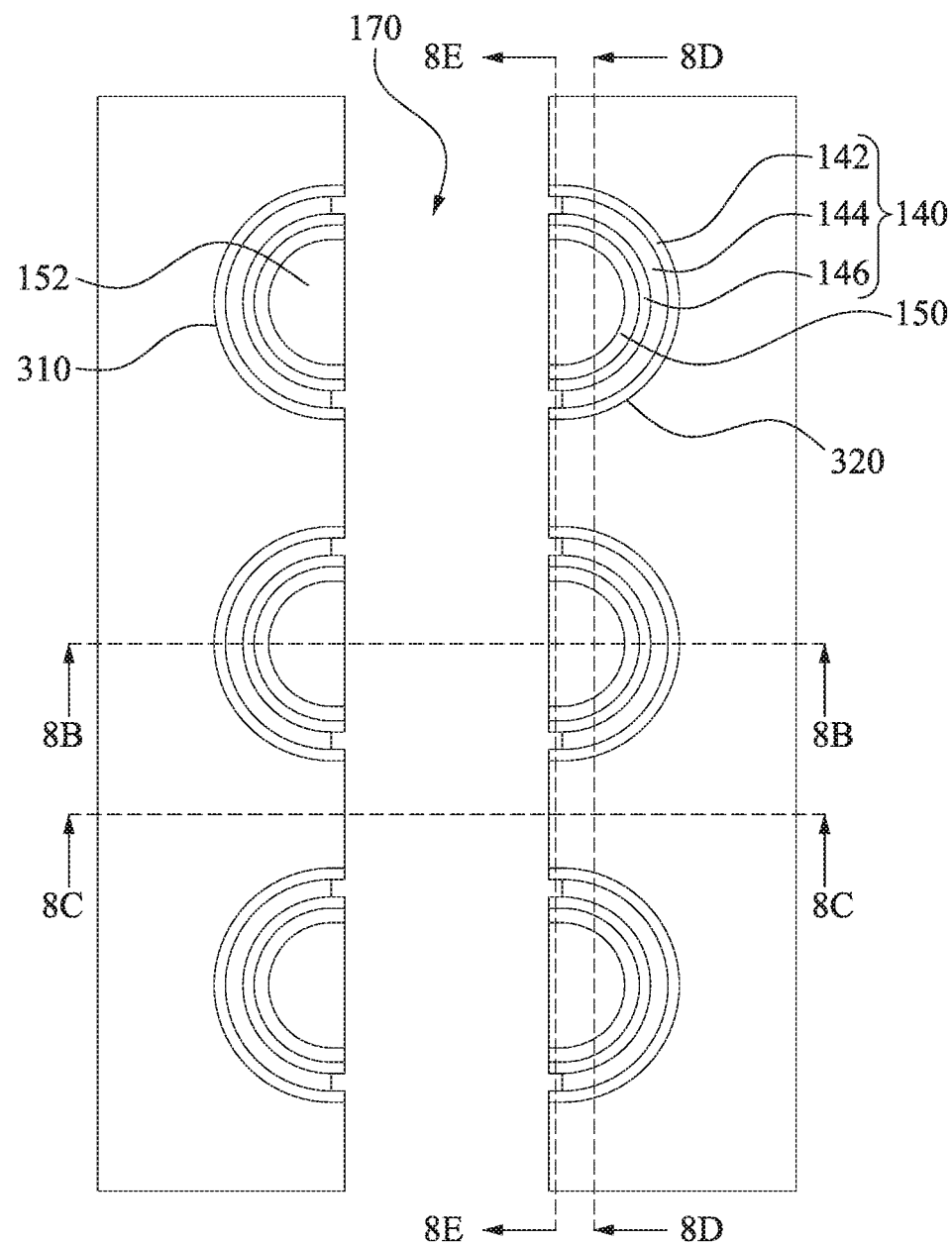
Figure 8B:
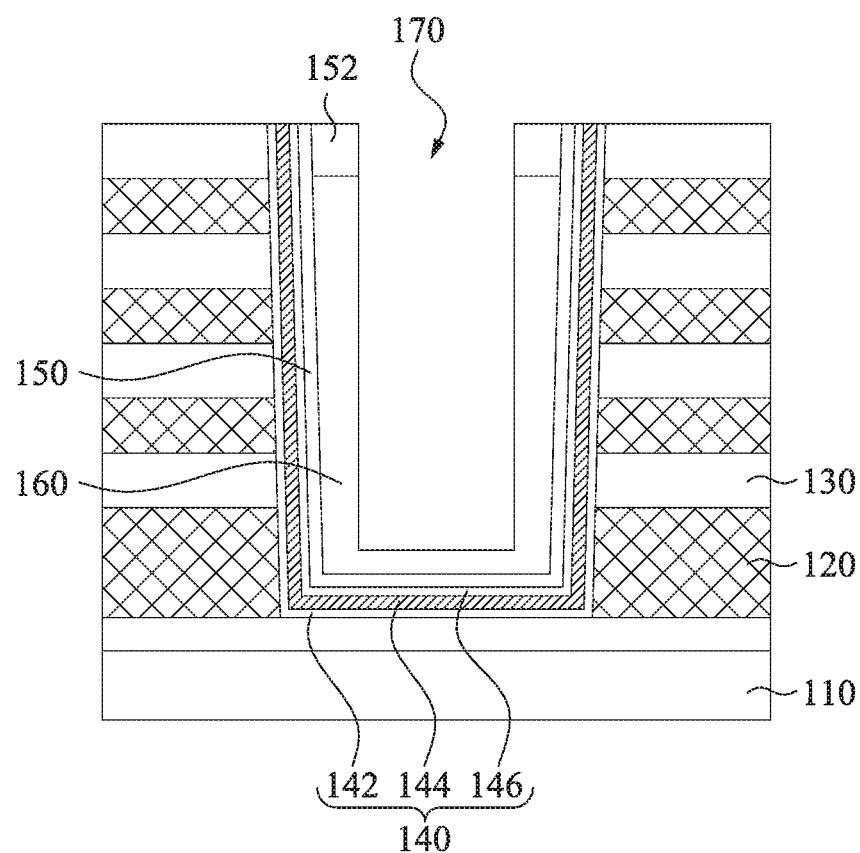
Figure 8C:
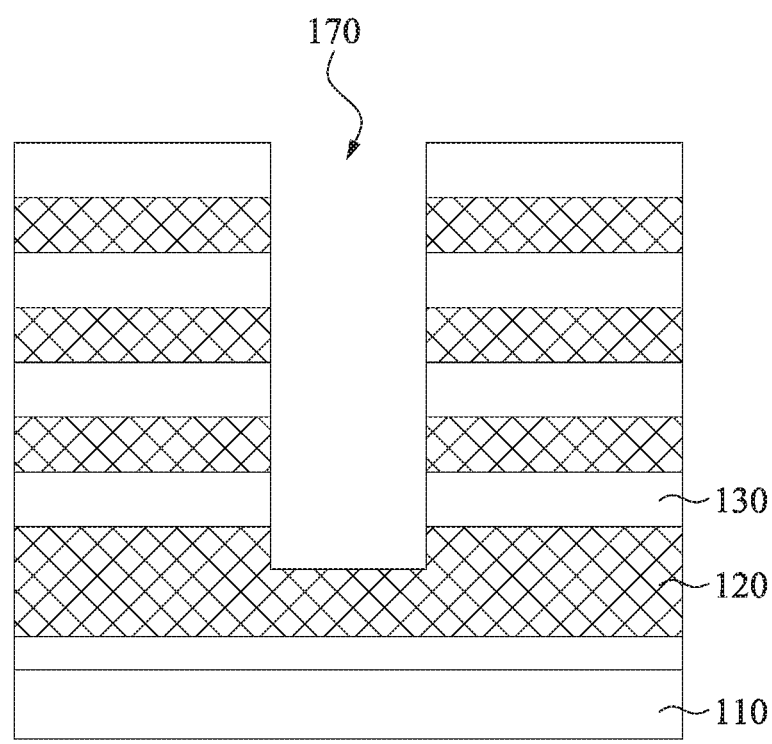
Figure 8D:
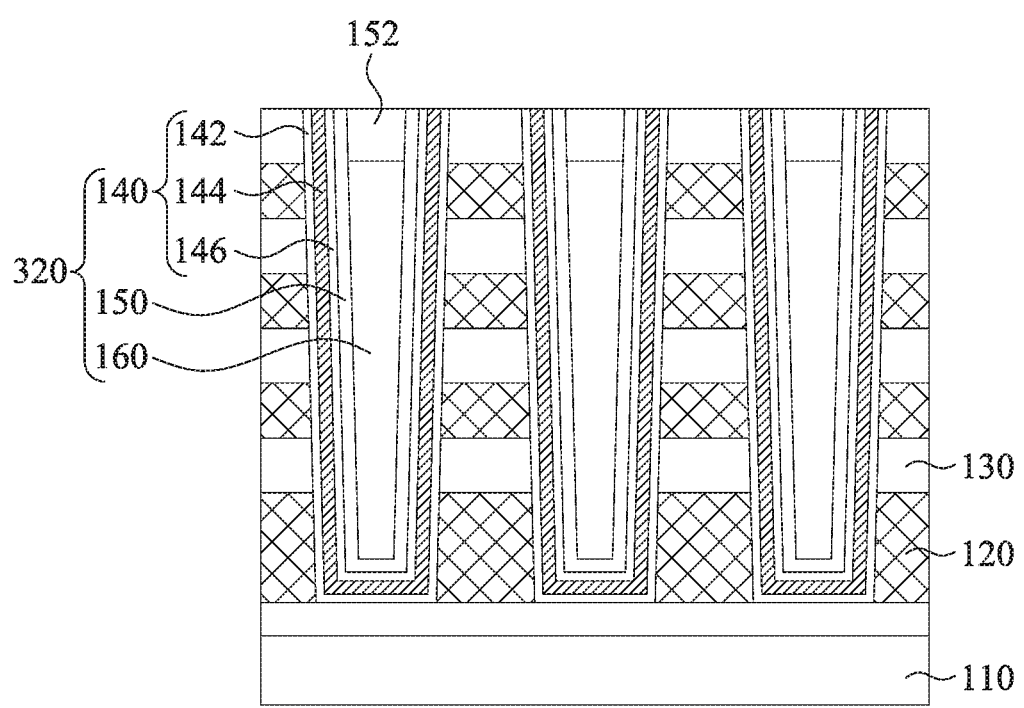
Figure 8E:
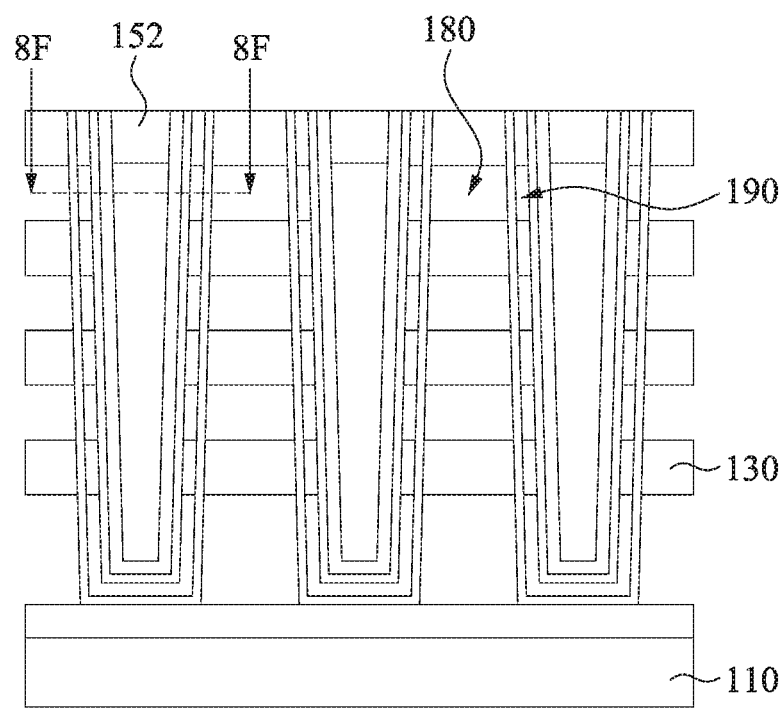
Figure 8F:
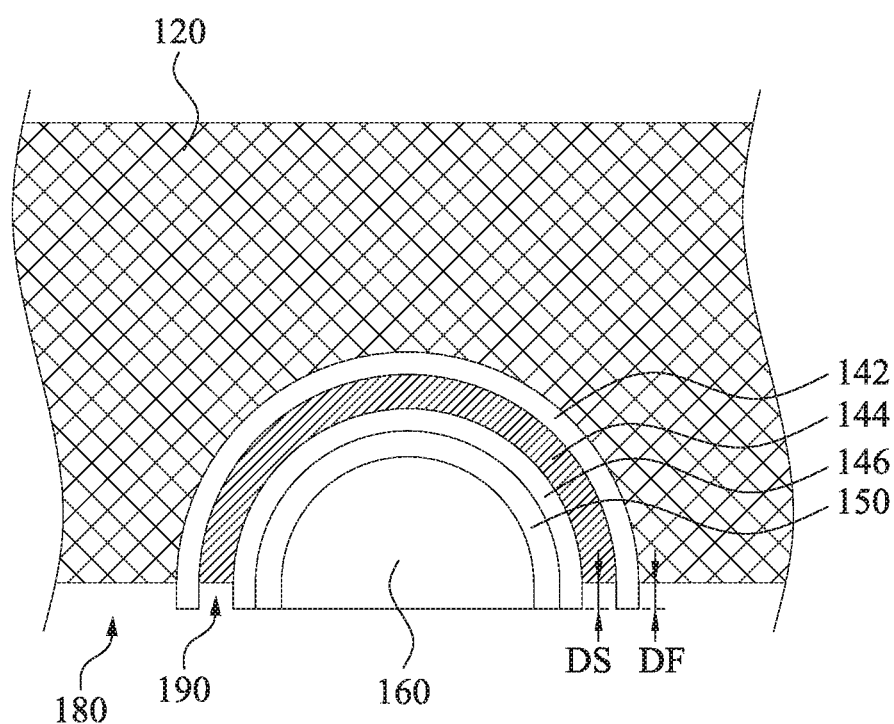

Reference is made to FIGS. 8A-8F, in which FIG. 8A is a top view of step S80 of forming the semiconductor structure 100, FIG. 8B is a cross-sectional view taken along line 8B-8B in FIG. 8A, FIG. 8C is a cross-sectional view taken along line 8C-8C in FIG. 8A, FIG. 8D is a cross-sectional view taken along line 8D-8D in FIG. 8A, FIG. 8E is a cross-sectional view taken along line 8E-8E in FIG. 8A, and FIG. 8F is a cross-sectional view taken along line 8F-8F in FIG. 8E. In step S80, the exposed portions of the insulating layers 120 and the exposed portions of the memory storage layer 144 that are exposed from the trench 170 are removed by a selective etching process to respectively form a first group of spaces 180 and a second group of spaces 190 shown in FIGS. 8E-8F, thereby resulting in a structural difference between a portion of the memory structure cluster 300 (including the first memory structure 310 and the second memory structure 320) near the trench 170 (shown in FIG. 8E) and a portion of the memory structure cluster 300 slightly away from the trench (shown in FIG. 8D). For example, as shown in FIG. 8D, the insulating layers 120 are preserved between the dielectric layers 130, and the memory storage layer 144 is also preserved between the blocking layer 142 and the tunneling layer 146; on the other hand, as shown in FIG. 8E, the insulating layers 120 and the memory storage layer 144 are both removed to respectively formed the first group of spaces 180 between the dielectric layers 130 and the second group of spaces 190 between the blocking layer 142 and the tunneling layer 146.

As shown in FIGS. 8A and 8F, the first group of spaces 180 are also formed between the insulating layers 120 and the trench 170. Furthermore, the second group of spaces 190 are respectively formed on edges of the first memory structure 310 and the second memory structure 320 and are respectively formed between the trench 170 and the memory storage layer 144. For example, the selective etching process is performed based on the difference in an etching selectivity between the nitride material, the oxide material, and the polysilicon material, such that the exposed portions of the insulating layers 120 and the exposed portions of the memory storage layer 144 are removed while the blocking layer 142, the tunneling layer 146, the channel layer 150, and the dielectric structure 160 are preserved. In some embodiments of the present disclosure, the etching depth DF of the first group of spaces 180 is about the same as the etching depth DS of the second group of spaces 190, and the etching depth DF, DS may be as deep as about 100 Å, but the present disclosure is not limited in this regard.

Figure 9A:
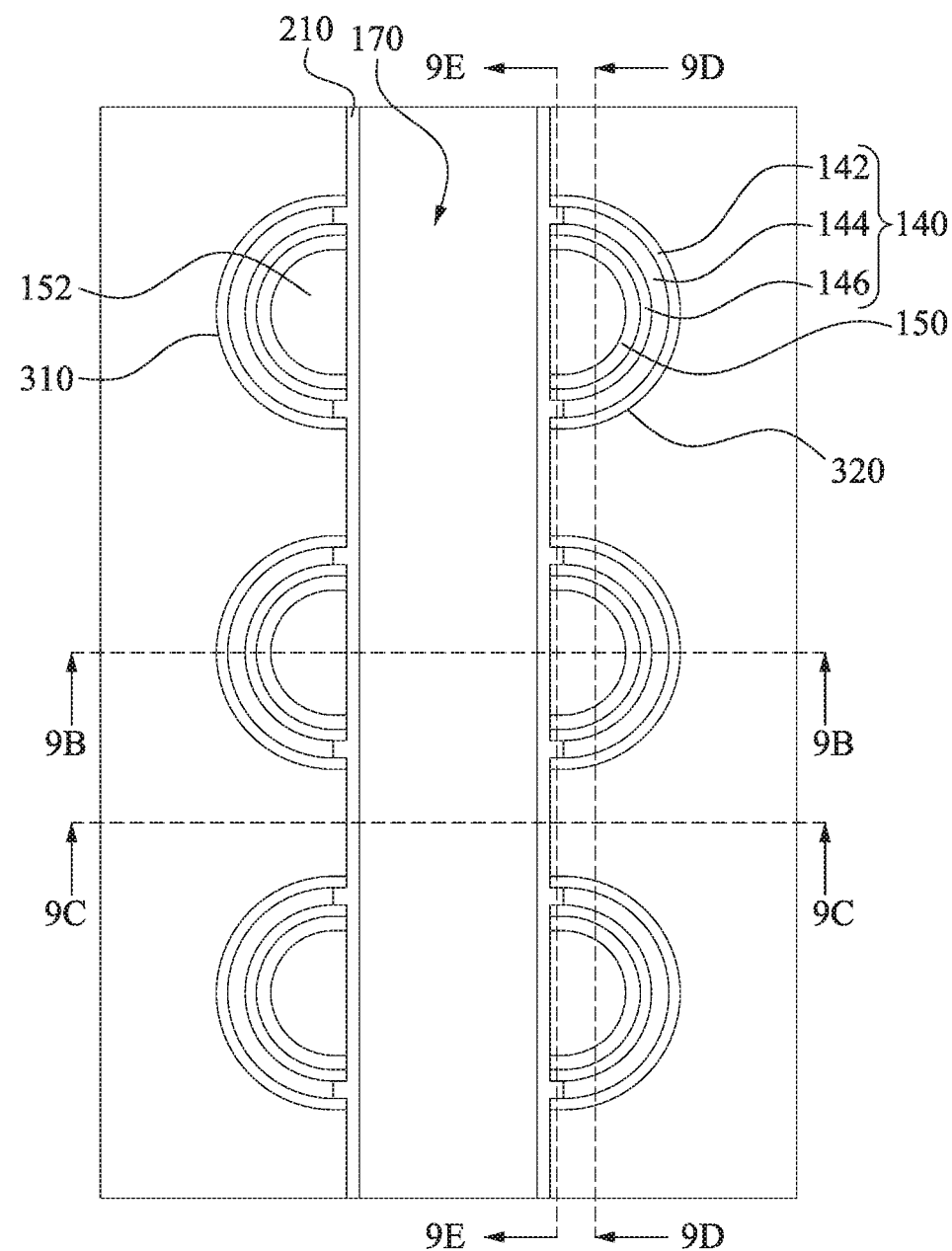
Figure 9B:
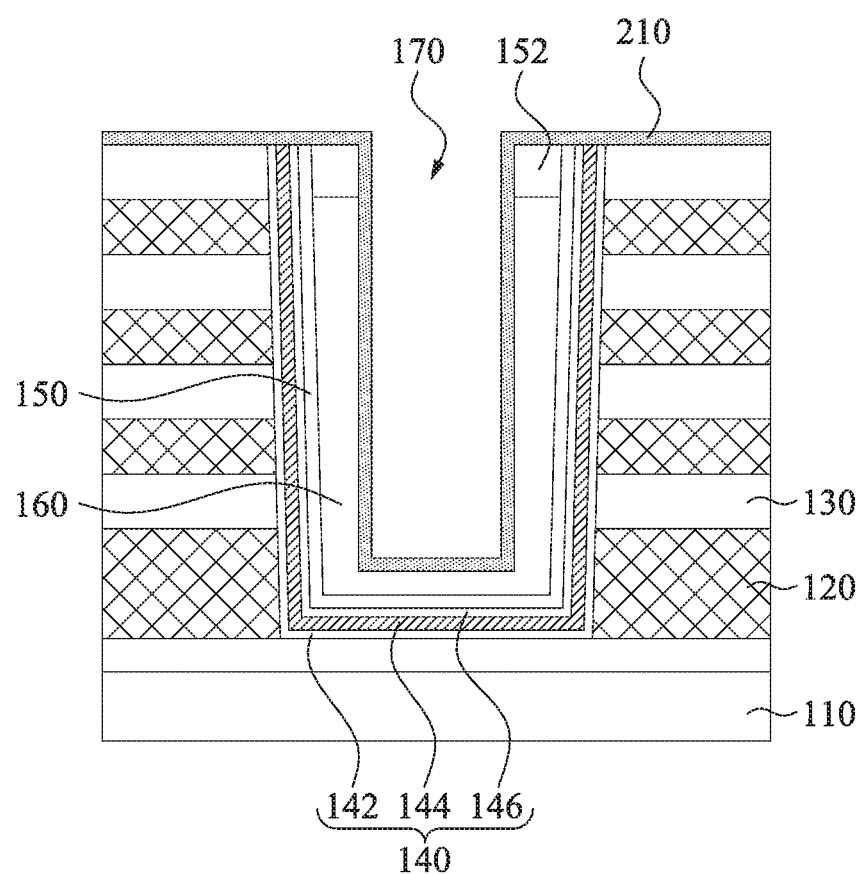
Figure 9C:
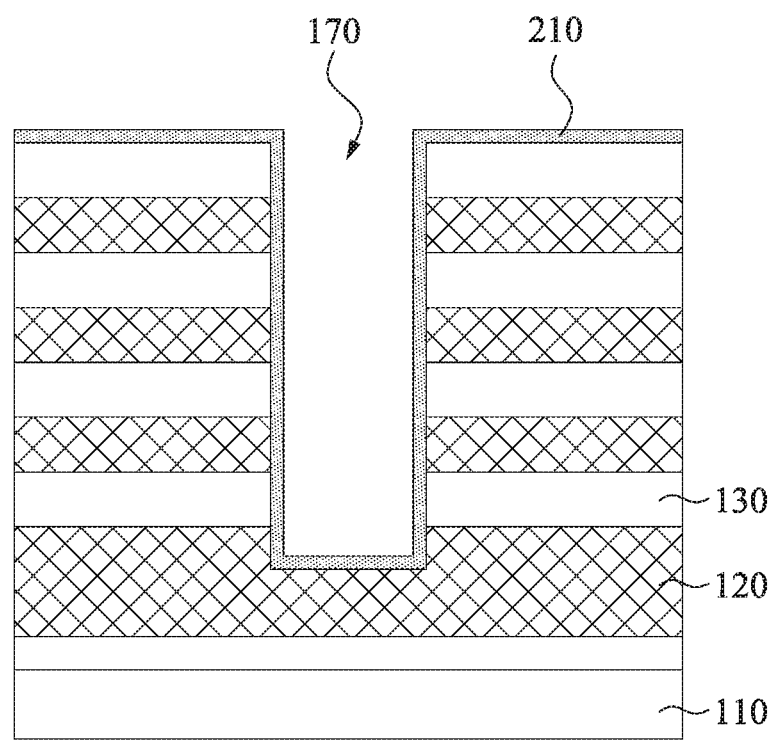
Figure 9D:
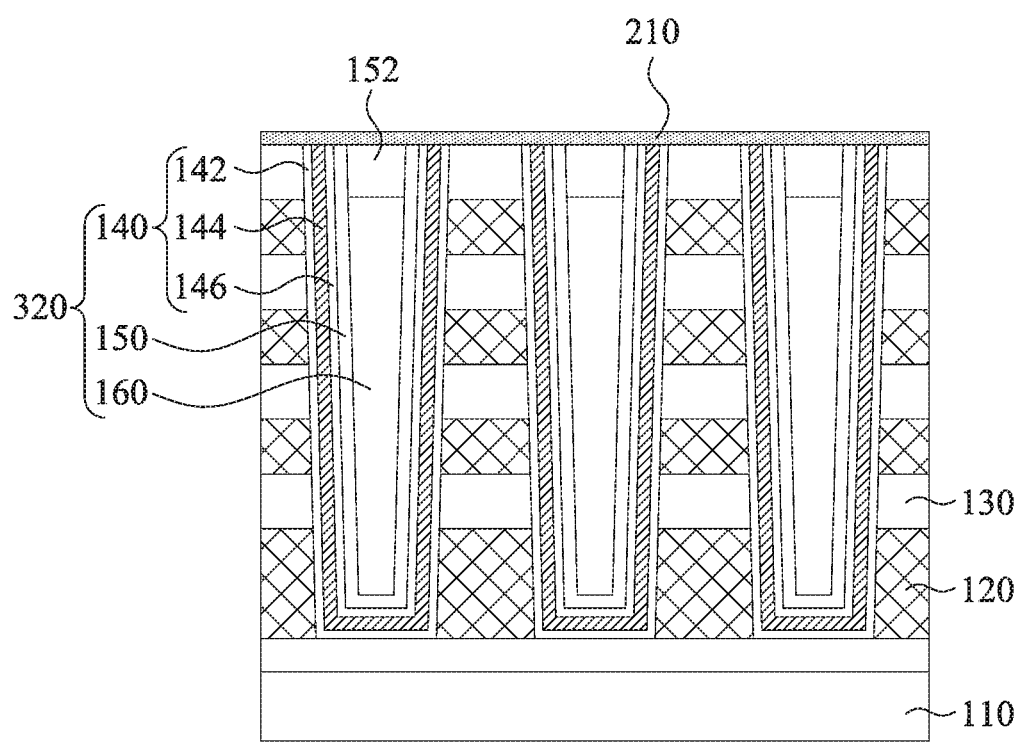
Figure 9E:
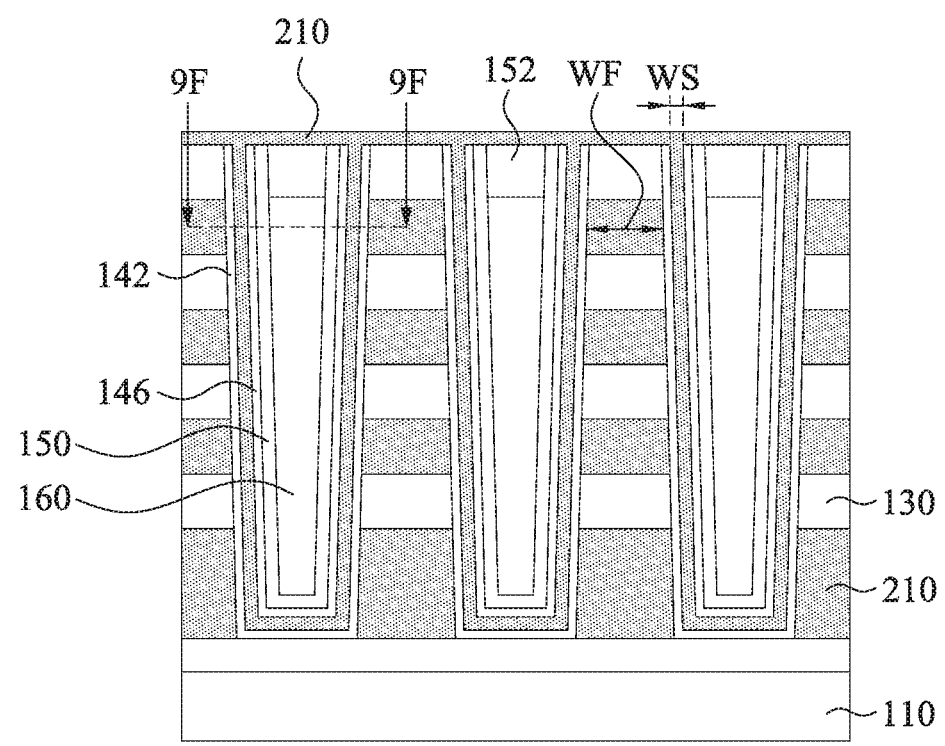
Figure 9F:
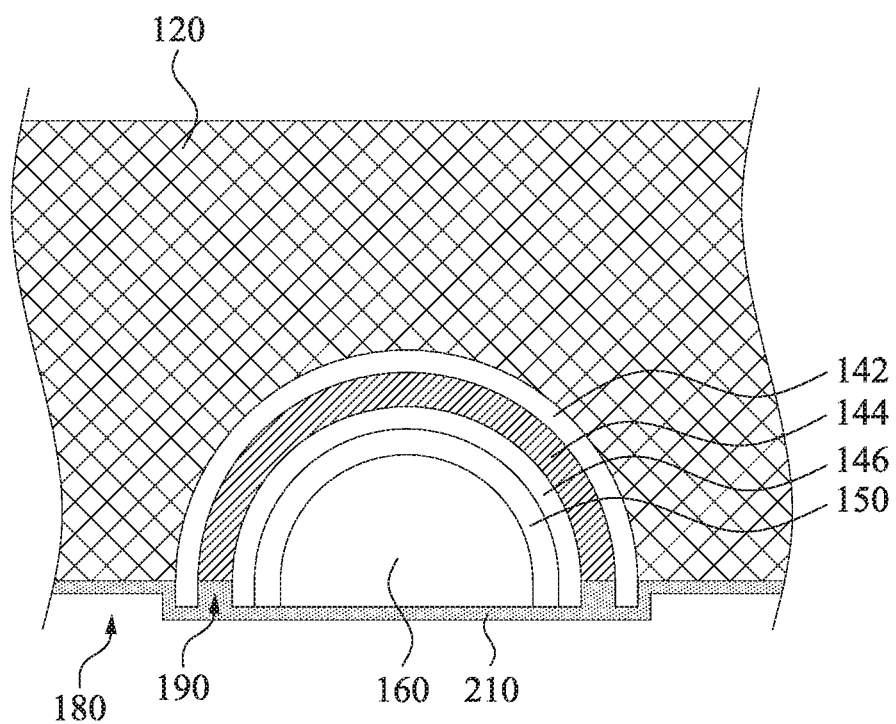

Reference is made to FIGS. 9A-9F, in which FIG. 9A is a top view of step S90 of forming the semiconductor structure 100, FIG. 9B is a cross-sectional view taken along line 9B-9B in FIG. 9A, FIG. 9C is a cross-sectional view taken along line 9C-9C in FIG. 9A, FIG. 9D is a cross-sectional view taken along line 9D-9D in FIG. 9A, FIG. 9E is a cross-sectional view taken along line 9E-9E in FIG. 9A, and FIG. 9F is a cross-sectional view taken along line 9F-9F in FIG. 9E. In step S90, after the removal of the exposed portions of the insulating layers 120 and the exposed portions of the memory storage layer 144 by the selective etching process, the protecting structures 210 are deposited on the first memory structure 310, the second memory structure 320, and the topmost layer of the dielectric layers 130 and in the trench 170. The protecting structures 210 are also filled in the first group of spaces 180 and the second group of spaces 190, shown in FIGS. 9E-9F. Since the width WF of the first group of spaces 180 is larger than the width WS of the second group of spaces 190, the first group of spaces 180 may not be completely filled with the protecting structures 210 while the second group of spaces 190 is entirely filled with the protecting structures 210. In other words, as shown in FIG. 9F, the protecting structures 210 in the first group of spaces 180 may be regarded as thin layers disposed on sidewalls of the blocking layer 142 and the insulating layers 120. In some embodiments of the present disclosure, the protecting structures 210 may be made of a material including silicon oxide or other dielectric, but the present disclosure is not limited in this regard.

Similar to the step S80 previously discussed, a structural difference between a portion of the memory structure cluster 300 (including the first memory structure 310 and the second memory structure 320) near the trench 170 (shown in FIG. 9E) and a portion of the memory structure cluster 300 slightly away from the trench (shown in FIG. 9D) also occurs in this step. Namely, as shown in FIG. 9D, the insulating layers 120 are preserved between the dielectric layers 130, and the memory storage layer 144 is also preserved between the blocking layer 142 and the tunneling layer 146; on the other hand, as shown in FIG. 9E, the protecting structures 210 are formed in the first group of spaces 180 (shown in FIG. 8E) between the dielectric layers 130 and the second group of spaces 190 (shown in FIG. 8E) between the blocking layer 142 and the tunneling layer 146.

Figure 10A:
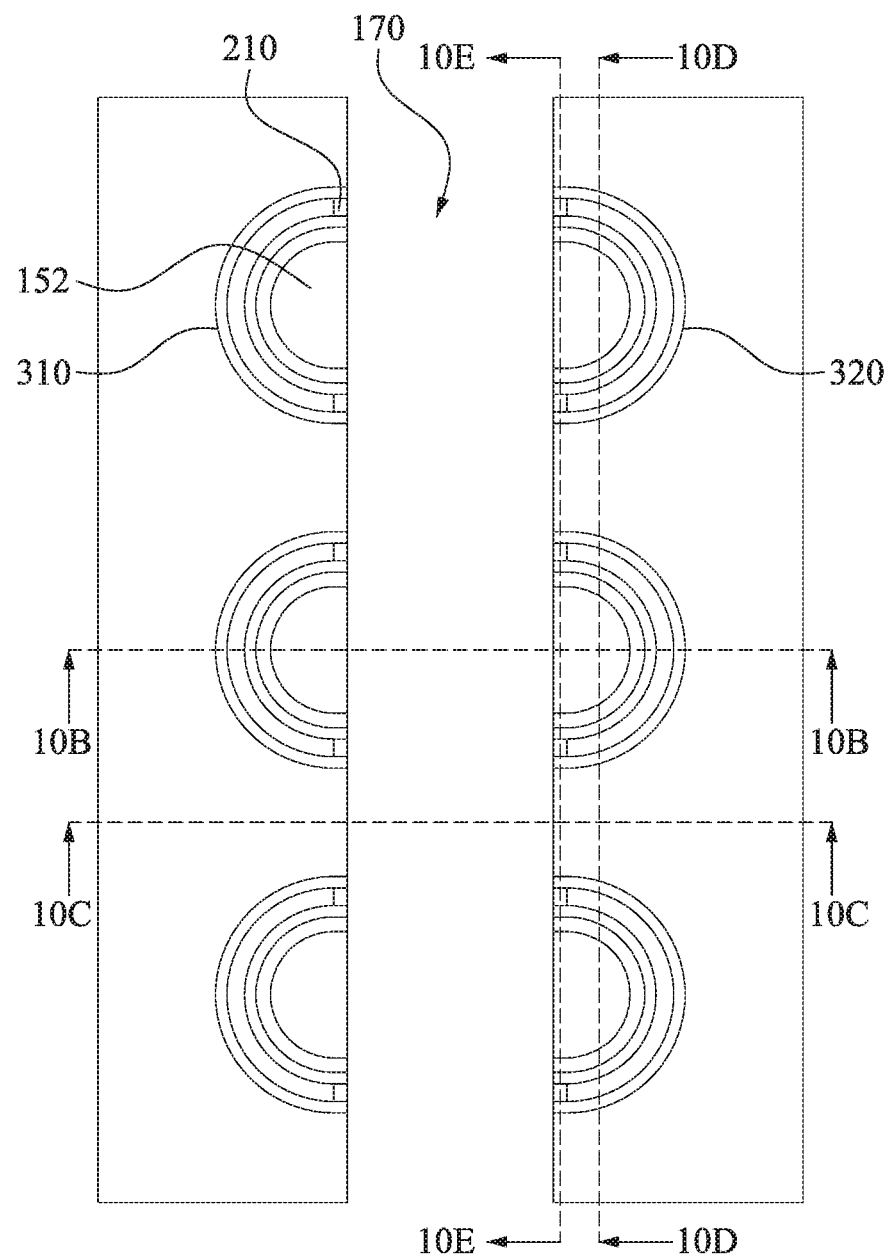
Figure 10B:
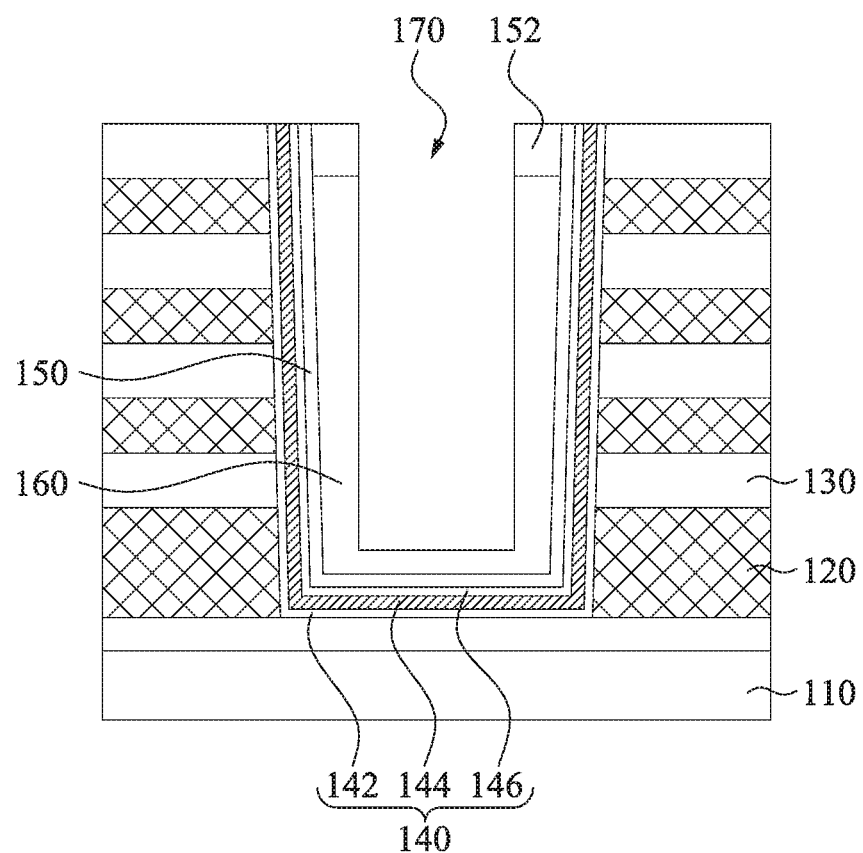
Figure 10C:
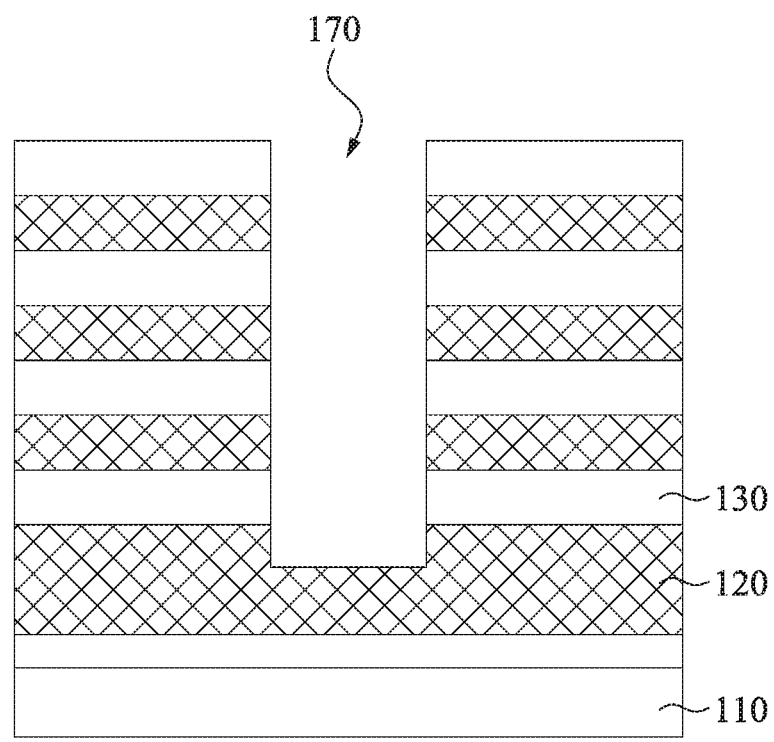
Figure 10D:
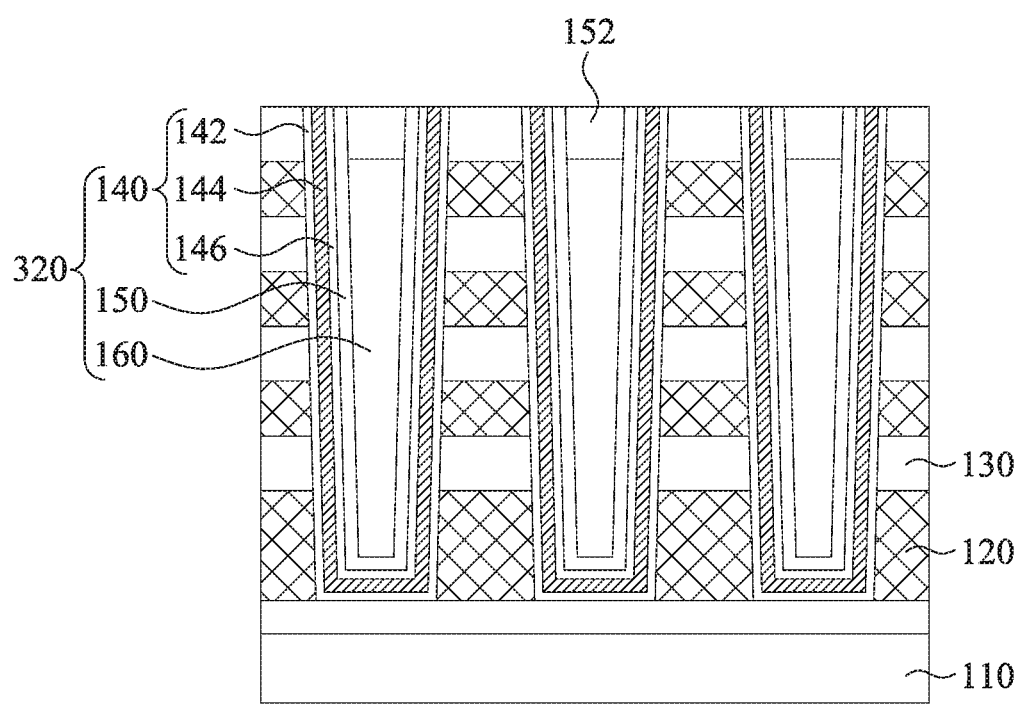
Figure 10E:
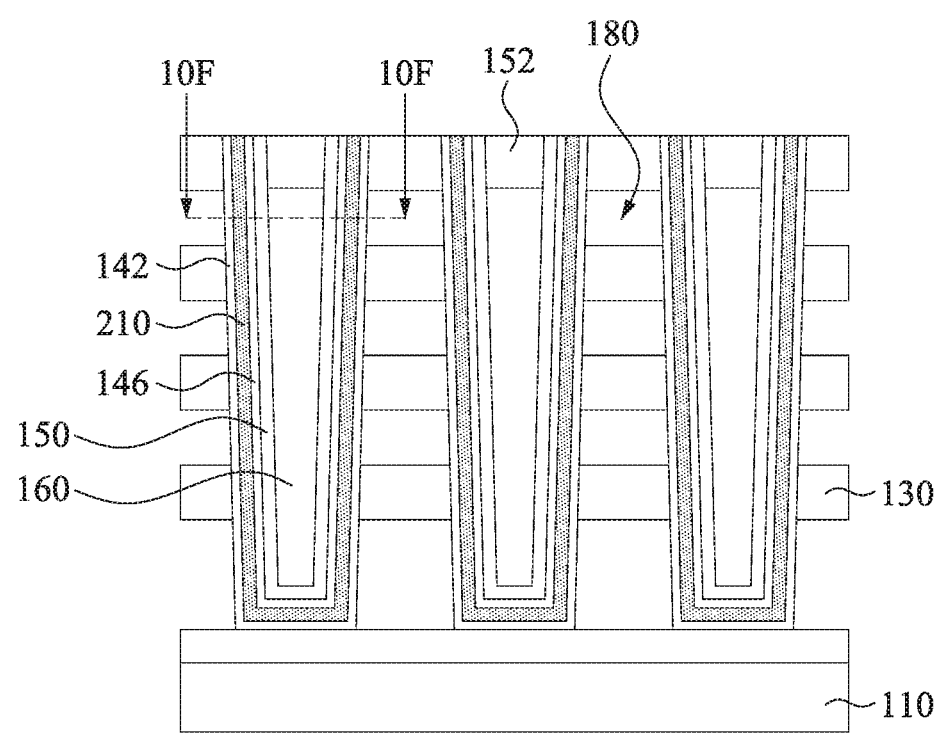
Figure 10F:
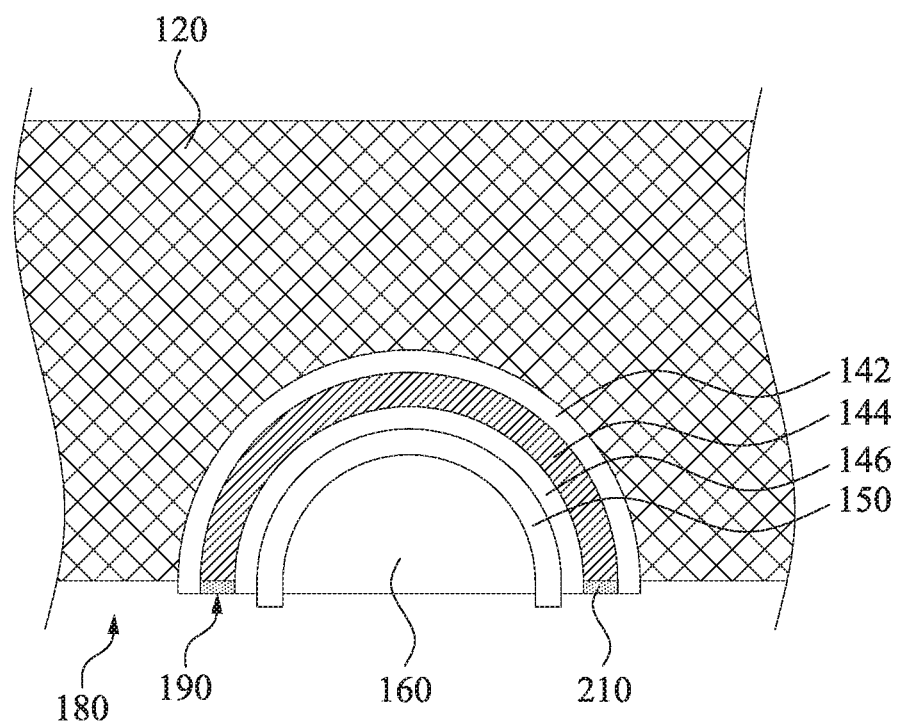

Reference is made to FIGS. 10A-10F, in which FIG. 10A is a top view of step S100 of forming the semiconductor structure 100, FIG. 10B is a cross-sectional view taken along line 10B-10B in FIG. 10A, FIG. 10C is a cross-sectional view taken along line 10C-10C in FIG. 10A, FIG. 10D is a cross-sectional view taken along line 10D-10D in FIG. 10A, FIG. 10E is a cross-sectional view taken along line 10E-10E in FIG. 10A, and FIG. 10F is a cross-sectional view taken along line 10F-10F in FIG. 10E. In step S100, the protecting structures 210 on the first memory structure 310, the second memory structure 320, the topmost layer of the dielectric layers 130, and in the trench 170 are removed by a selective etching process. Furthermore, the protecting structures 210 in the first group of spaces 180 are also being entirely removed while the protecting structures 210 in the second group of spaces 190 are being partially removed by the selective etching process, shown in FIGS. 10E-10F. In some embodiments, the etching process stops when the insulating layers 120 are exposed from the first group of spaces 180, and since the protecting structures 210 in the first group of spaces 180 are smaller in depth than the protecting structures 210 in the second group of spaces 190, the protecting structures 210 remain partially in the second group of spaces 190 when the etching process stops. Moreover, since the dielectric structure 160, the blocking layer 142, and the tunneling layer 146 may also be made of a material including silicon oxide or other dielectric, the etching process in this step may also be performed on the dielectric structure 160, the blocking layer 142, and the tunneling layer 146, thereby resulting in a partially removal of the dielectric structure 160, the blocking layer 142, and the tunneling layer 146, shown in FIG. 10F.

As a result, as shown in FIGS. 10A and 10F, the protecting structures 210 are on edges of the first memory structure 310 and the second memory structure 320 and are respectively between the blocking layer 142 and the tunneling layer 146. In other words, the protecting structures 210 are disposed between the memory storage layer 144 and the trench 170 and at two ends of the memory storage layer 144, and adjoin the memory storage layer 144. In detail, since the second group of spaces 190 are formed between the blocking layer 142 and the tunneling layer 146, the second group of spaces 190 may be regarded as concave portions. The concave portions are at opposite two ends of the memory structure layer 140, and the protecting structures 210 are disposed in the concave portions, respectively.

Figure 11A:
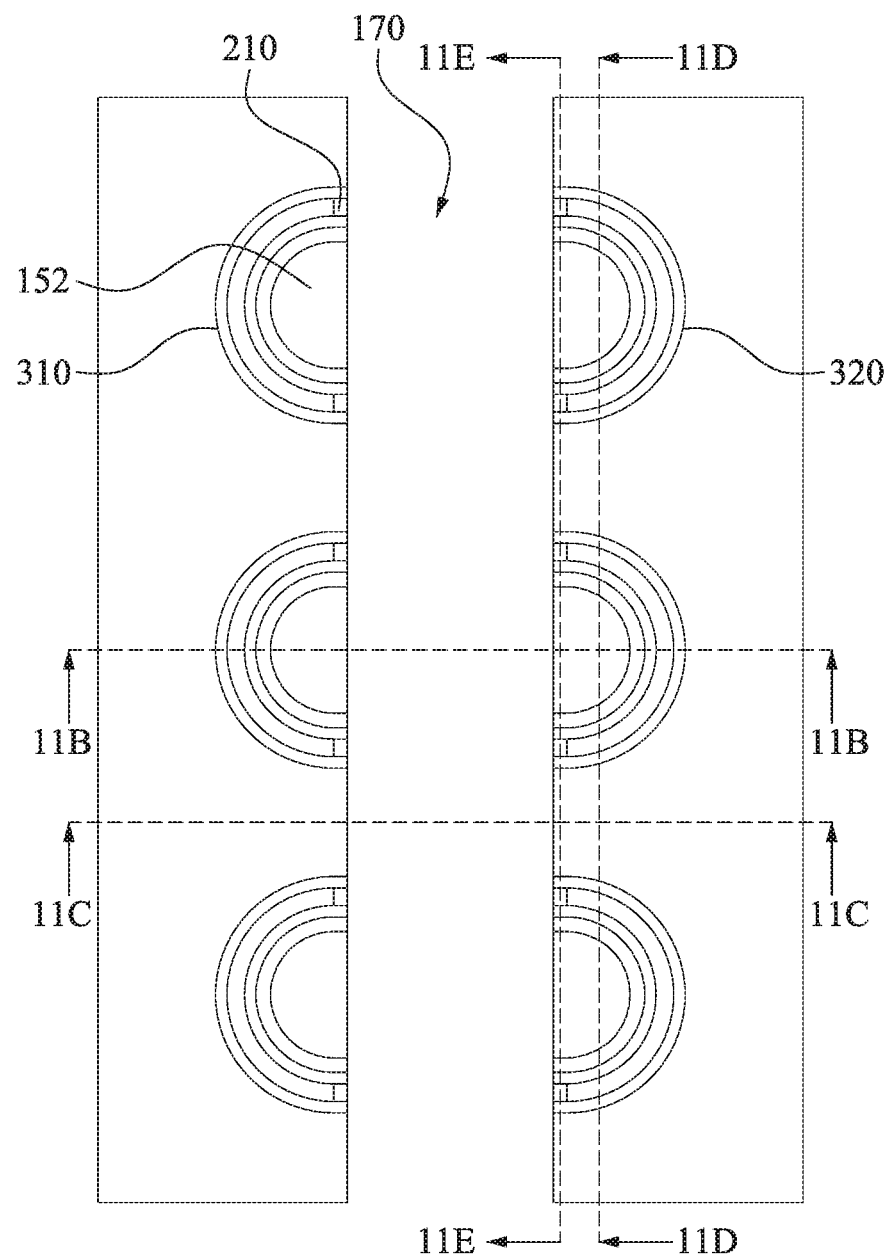
Figure 11B:
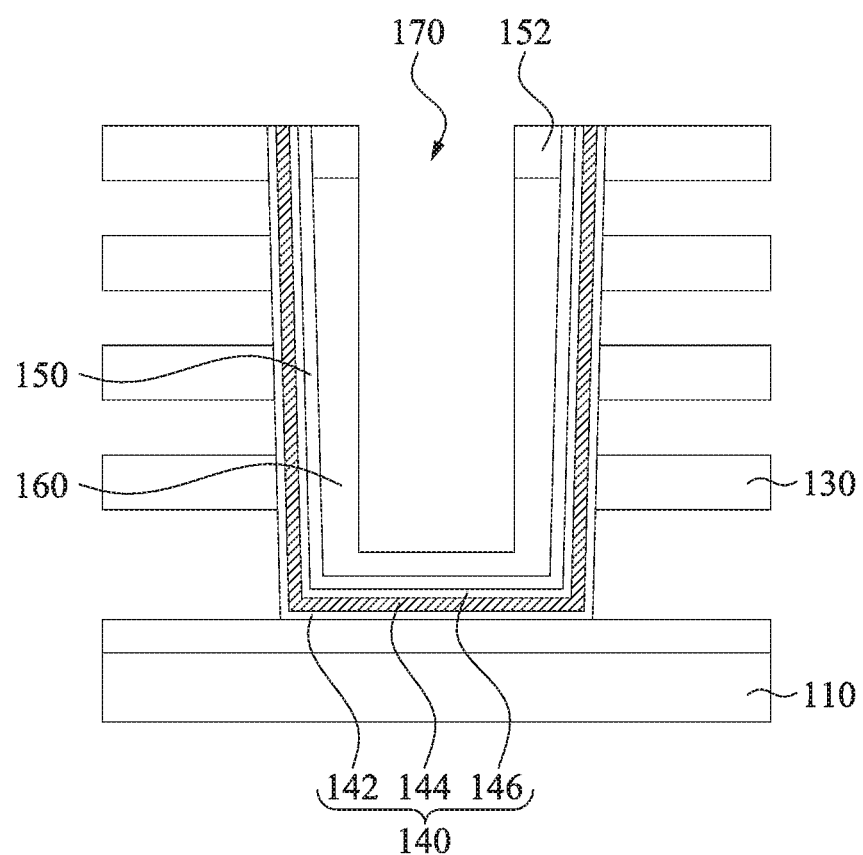
Figure 11C:
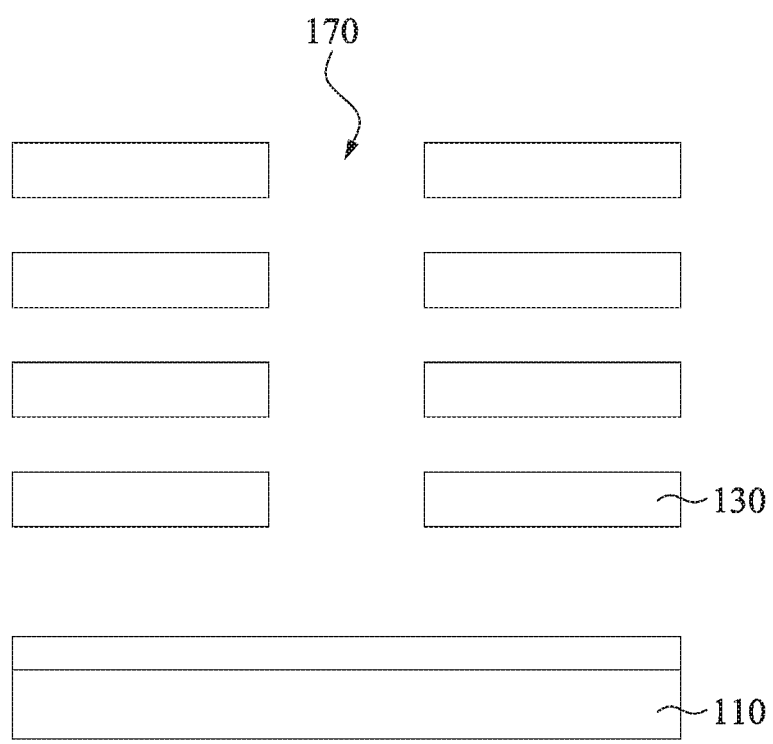
Figure 11D:
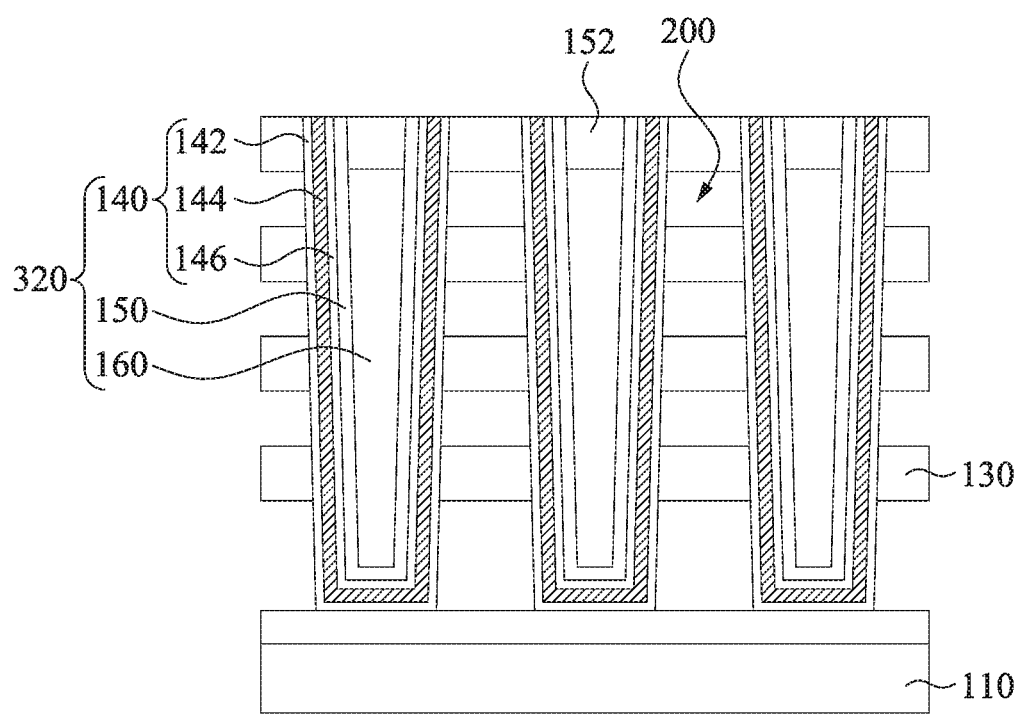
Figure 11E:
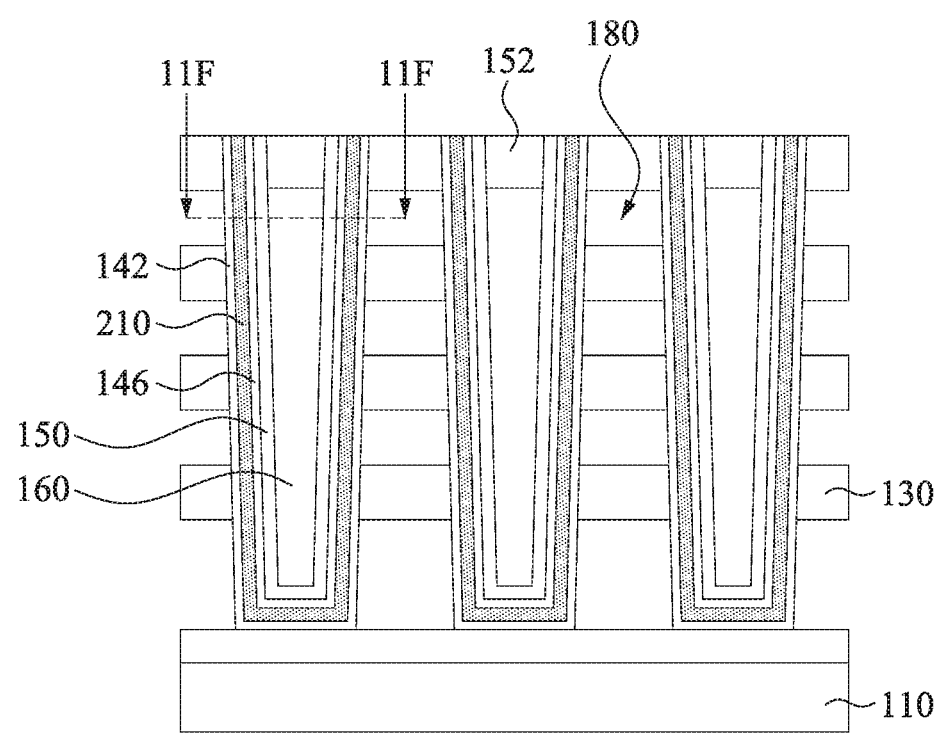
Figure 11F:
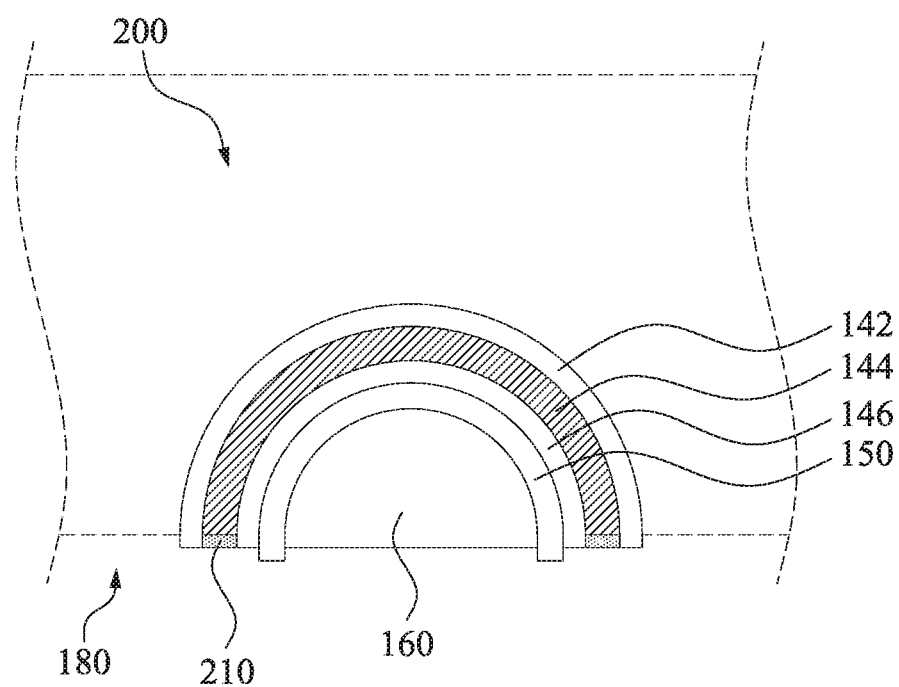

Reference is made to FIGS. 11A-11F, in which FIG. 11A is a top view of step S110 of forming the semiconductor structure 100, FIG. 11B is a cross-sectional view taken along line 11B-11B in FIG. 11A, FIG. 11C is a cross-sectional view taken along line 11C-11C in FIG. 11A, FIG. 11D is a cross-sectional view taken along line 11D-11D in FIG. 11A, FIG. 11E is a cross-sectional view taken along line 11E-11E in FIG. 11A, and FIG. 11F is a cross-sectional view taken along line 11F-11F in FIG. 11E. In step S110, the insulating layers 120 between the dielectric layers 130 are then being removed by a selective etching process to form the third group of spaces 200 shown in FIGS. 11D-11F, in which the first group of spaces 180 and the third group of spaces 200 are both between the dielectric layers 130. In some embodiments of the present disclosure, the selective etching process may be a chemical etching process in hot phosphoric acid removing the insulating layers 120 which may be made of a material including silicon nitride. Since the memory storage layer 144 which may also made of a material including silicon nitride is protected by the protecting structures 210 shown in FIG. 11F, the memory storage layer 144 is not removed during the etching process. As a result, the memory storage layer 144 and the protecting structures 210 may be preserved between the blocking layer 142 and the tunneling layer 146, shown in FIGS. 11A and 11F.

Figure 12A:
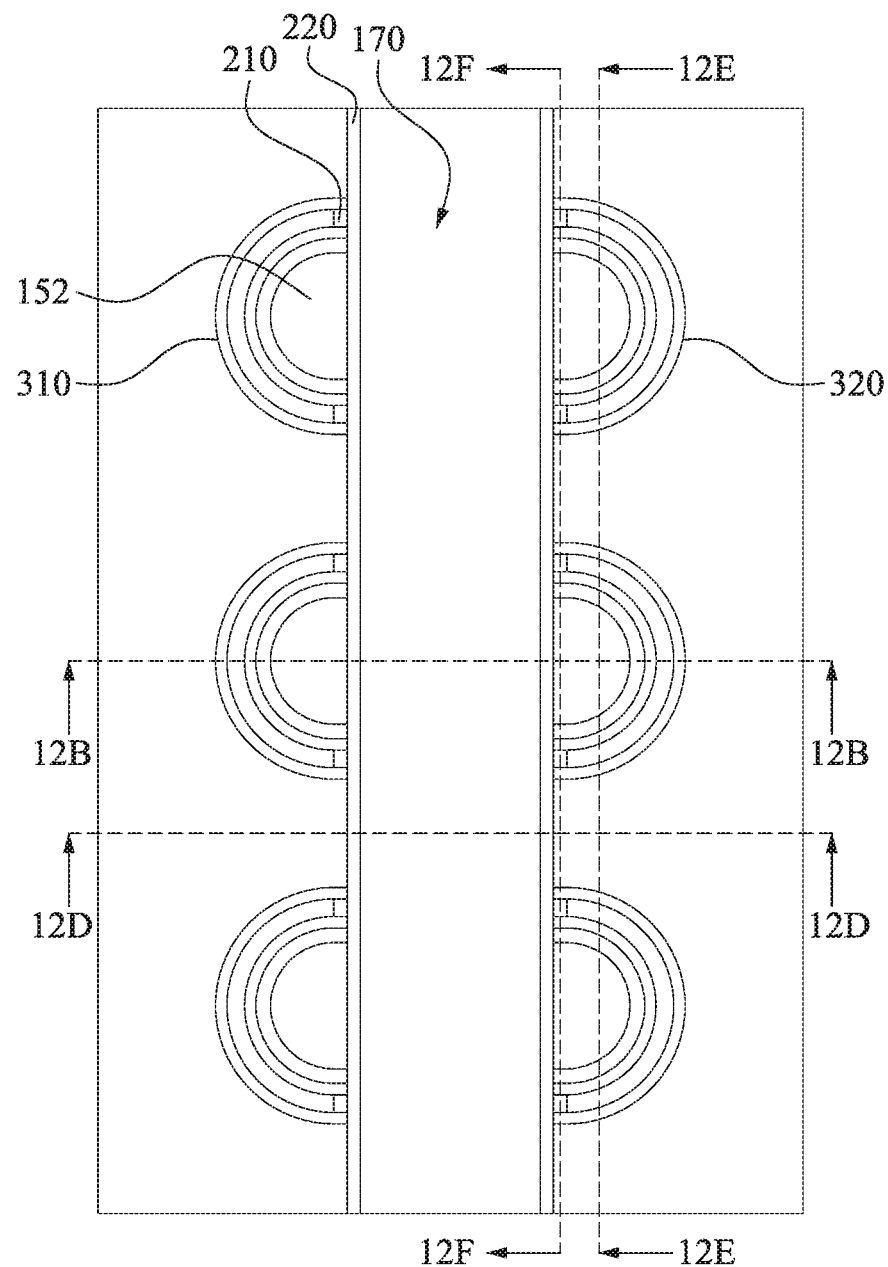
Figure 12B:
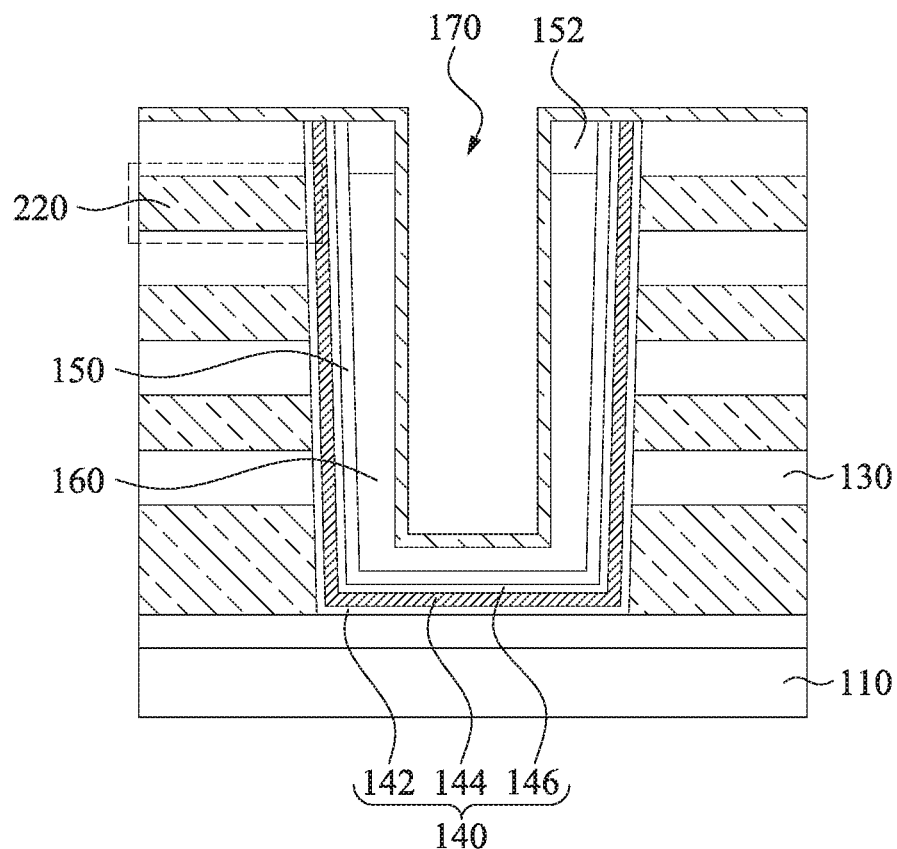
Figure 12C:
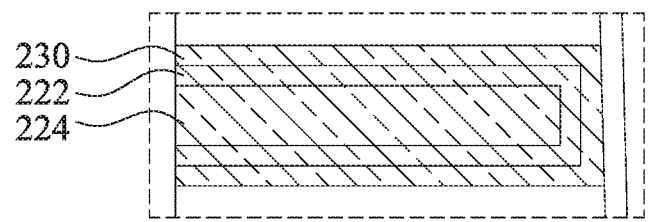
FIG. 12C is a partial enlargement diagram of FIG. 12B.
Figure 12D:
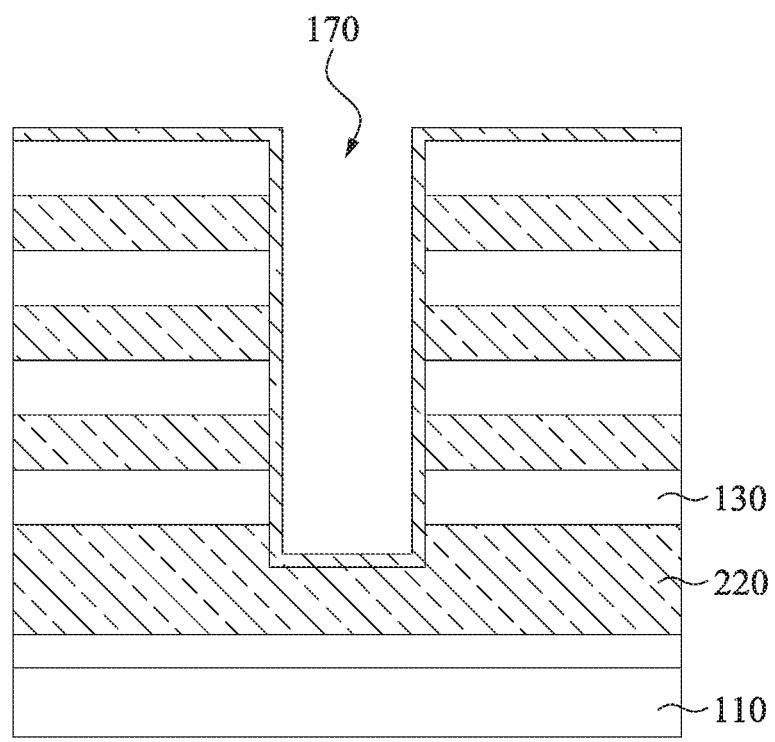
Figure 12E:
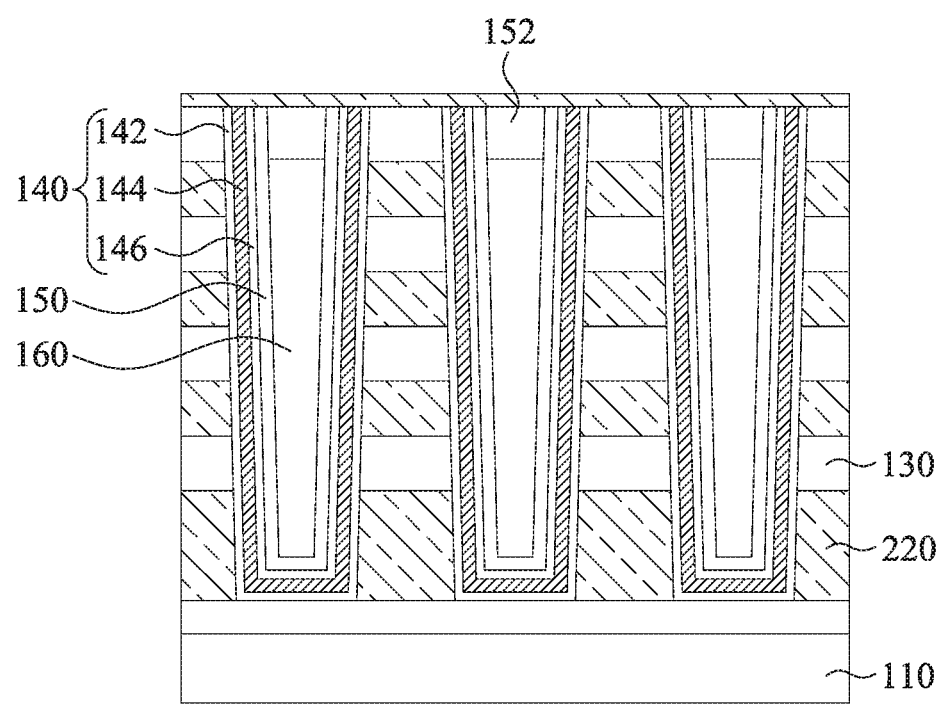
Figure 12F:
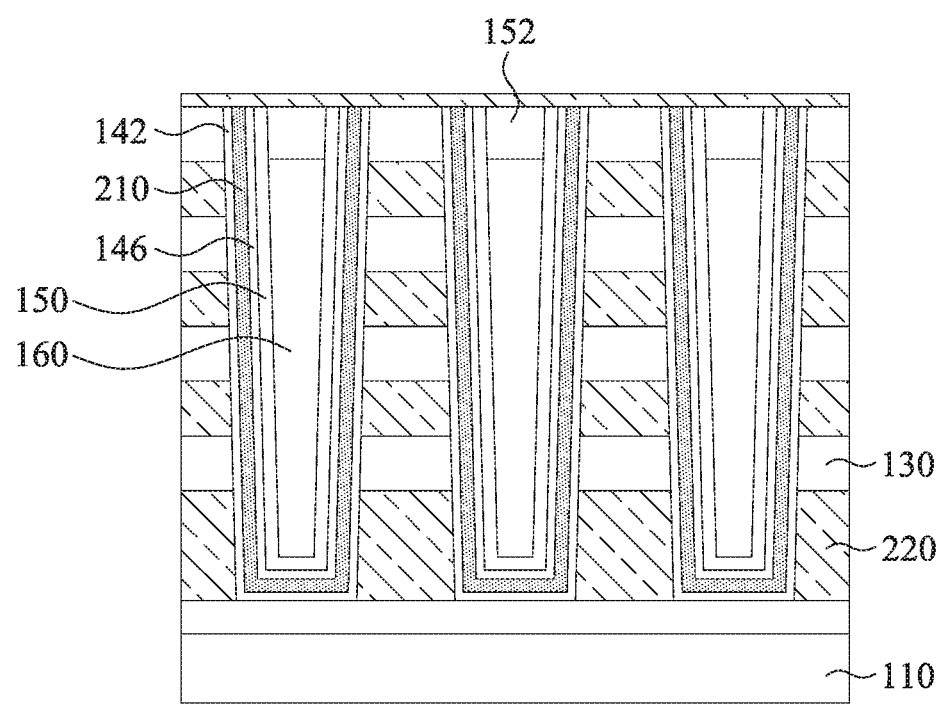

Reference is made to FIGS. 12A-12F, in which FIG. 12A is a top view of step S120 of forming the semiconductor structure 100, FIG. 12B is a cross-sectional view taken along line 12B-12B in FIG. 12A, FIG. 12C is a partial enlargement diagram of FIG. 12B, FIG. 12D is a cross-sectional view taken along line 12D-12D in FIG. 12A, FIG. 12E is a cross-sectional view taken along line 12E-12E in FIG. 12A, and FIG. 12F is a cross-sectional view taken along line 12F-12F in FIG. 12A. In step S120, after the removal of the insulating layers 120 by the selective etching process, conductive layers 220 are disposed on a top surface of the semiconductor structure 100 and between the dielectric layers 130. For example, the conductive layers 220 are disposed on the first memory structure 310, the second memory structure 320, and the topmost layer of the dielectric layers 130 and in the trench 170. Furthermore, as shown in FIGS. 12B-12F, the conductive layers 220 are also being disposed in the first group of spaces 180 (shown in FIG. 11E) and the third group of spaces 200 (shown in FIG. 11D) which are between the dielectric layers 130, thereby resulting in a replacement of the insulating layers 120 with the conductive layers 220. As shown in FIG. 12C, each of the conductive layers 220 includes a barrier layer 222 disposed on each of the dielectric layers 130 and a metal layer 224 disposed on the barrier layer 222. The conductive layers 220 may be disposed by a chemical vapor deposition (CVD) process. In some embodiments of the present disclosure, the barrier layer 222 may be made of a material including titanium nitride, and the metal layer 224 may be made of a material including tungsten or other metal, but the present disclosure is not limited in this regard.

In the aforementioned embodiments of the present disclosure, the manufacturing method of the semiconductor structure 100 provides a method of replacing the insulating layers 120 with the conductive layers 220 while preserving the memory storage layer 144 which is made of the same material as the insulating layers 120, thereby simplifying the manufacturing process.

In some embodiments of the present disclosure, high-k dielectric layers 230 are disposed on the first memory structure 310, the second memory structure 320, and the topmost layer of the dielectric layers 130, in the trench 170, and between the dielectric layers 130 and the barrier layers 222, shown in FIG. 12C. For example, the high-k dielectric layers 230 may be disposed before the conductive layers 220 are disposed. Furthermore, the high-k dielectric layers 230 may be made of a material including aluminum oxide or other dielectric.

Figure 13A:
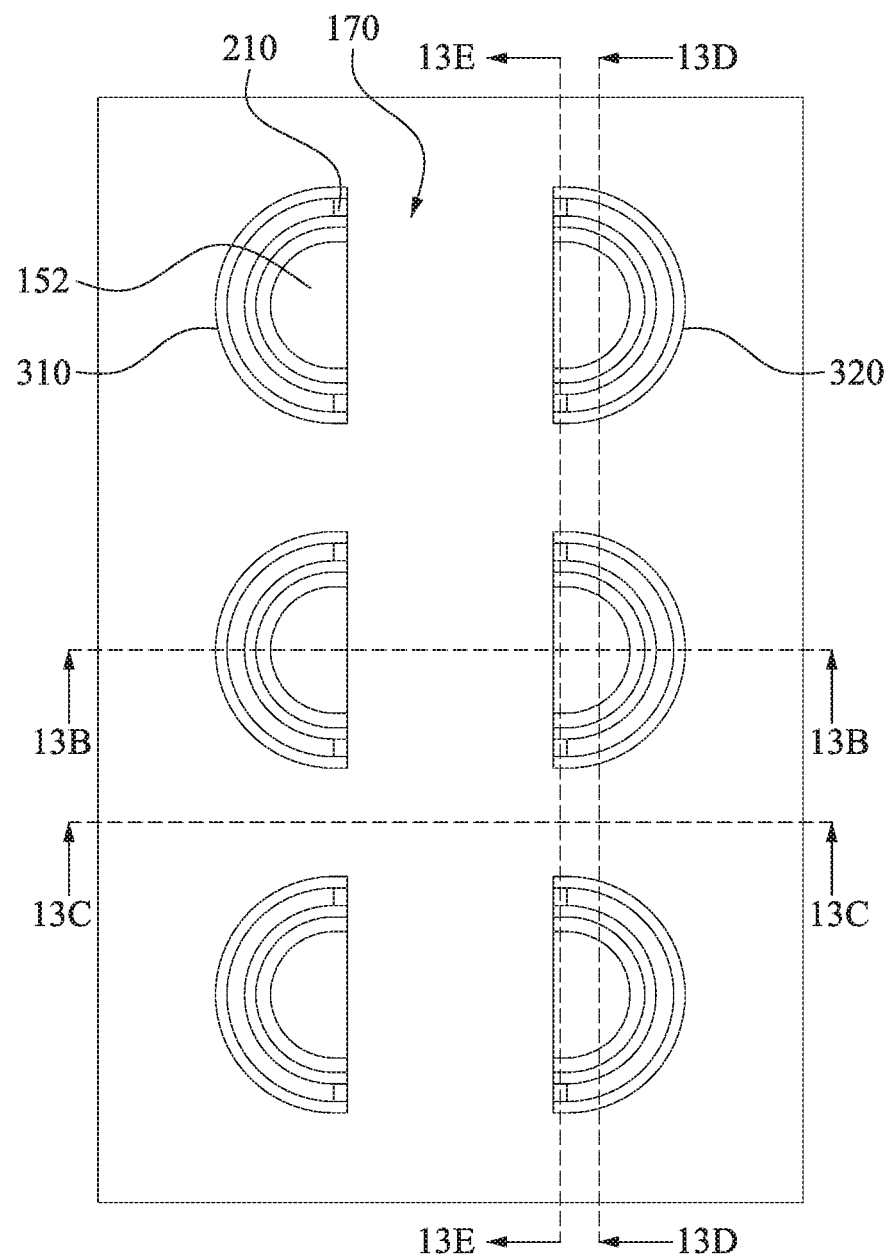
Figure 13B:
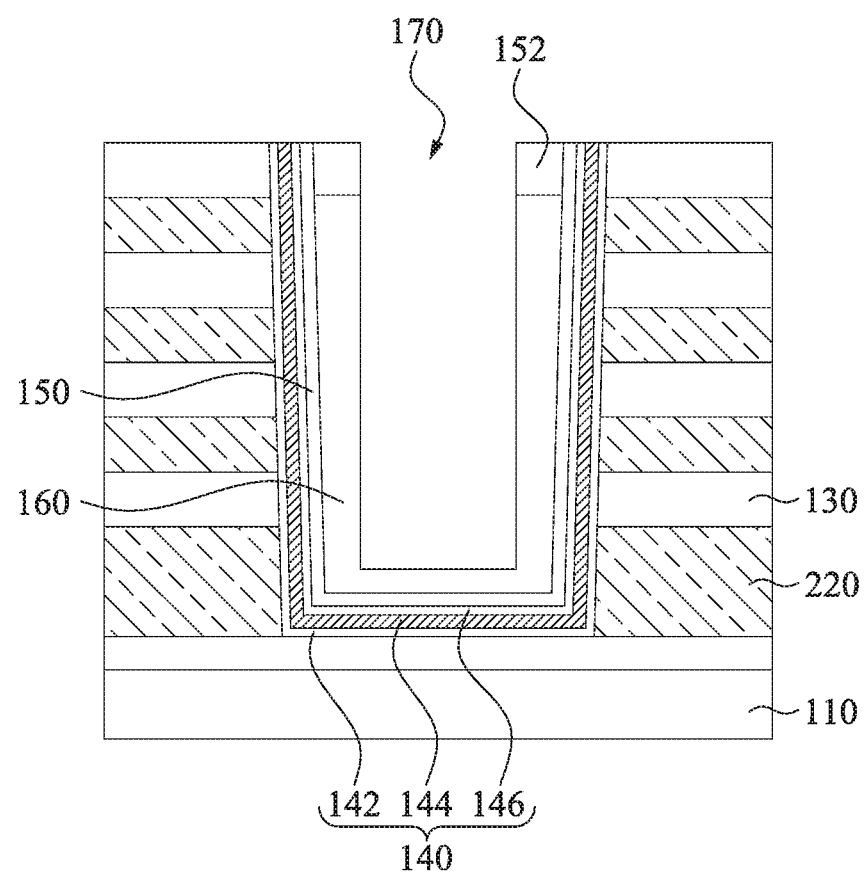
Figure 13C:
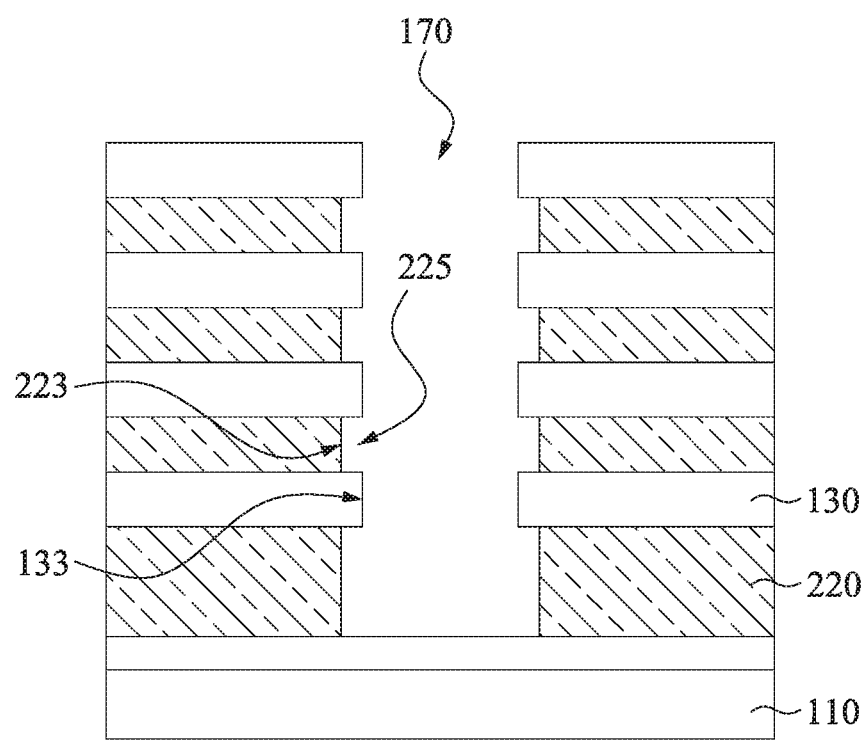
Figure 13D:
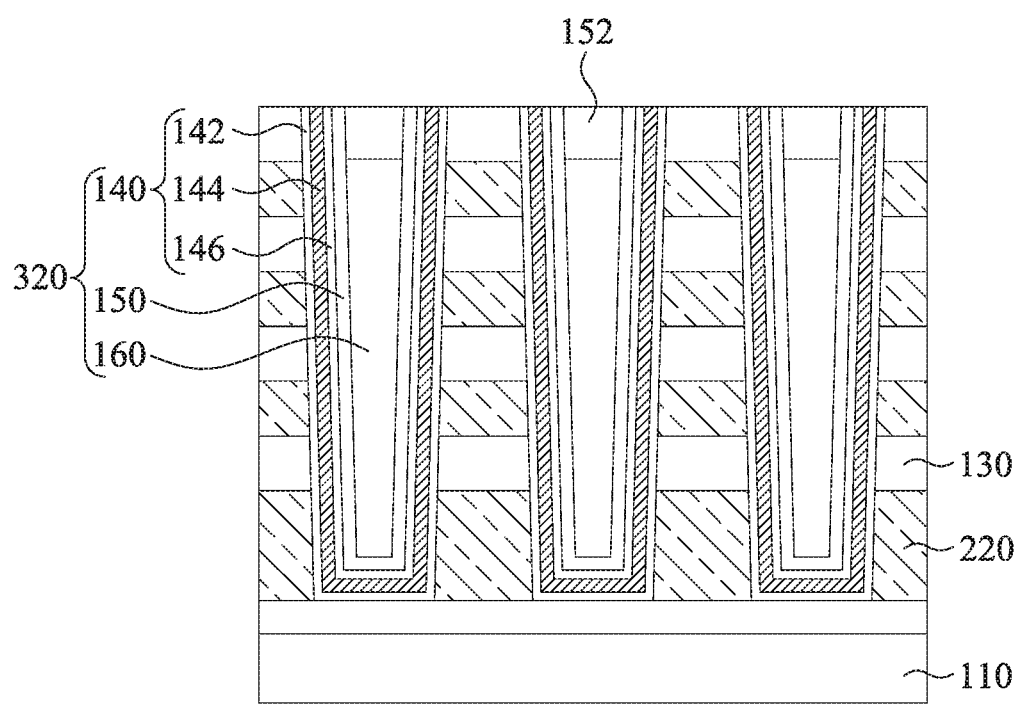
Figure 13E:
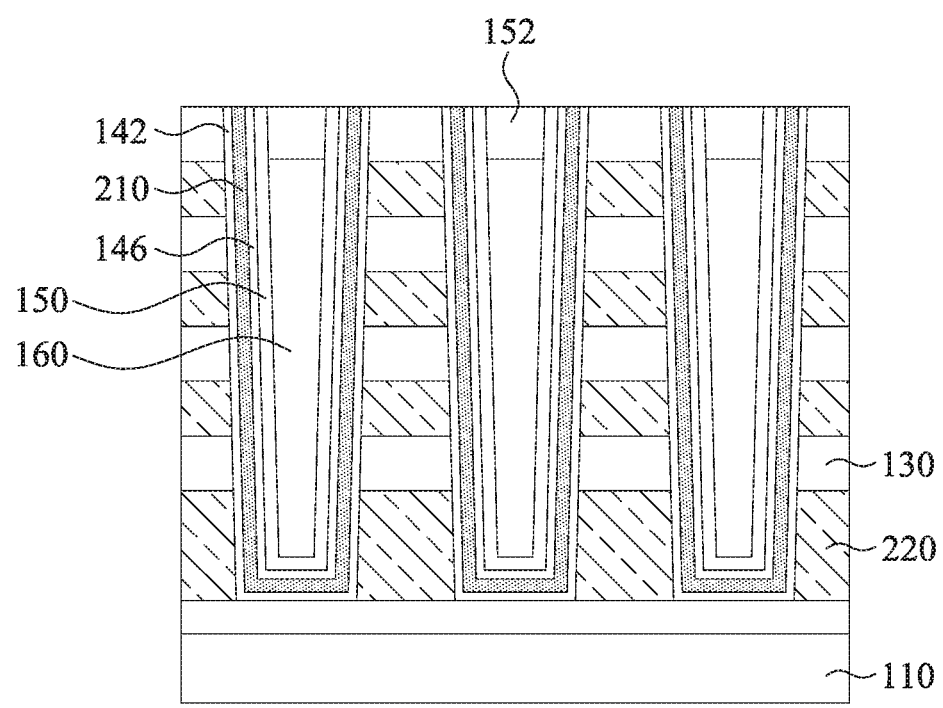

Reference is made to FIGS. 13A-13E, in which FIG. 13A is a top view of step S130 of forming the semiconductor structure 100, FIG. 13B is a cross-sectional view taken along line 13B-13B in FIG. 13A, FIG. 13C is a cross-sectional view taken along line 13C-13C in FIG. 13A, FIG. 13D is a cross-sectional view taken along line 13D-13D in FIG. 13A, and FIG. 13E is a cross-sectional view taken along line 13E-13E in FIG. 13A. In step S130, the high-k dielectric layers 230 and the conductive layers 220 on the first memory structure 310, the second memory structure 320, and the topmost layer of the dielectric layers 130 and in the trench 170 are removed by a selective etching process such that the first memory structure 310 and the second memory structure 320 are exposed from the trench 170. In some embodiments of the present disclosure, as shown in FIG. 13C, sidewalls 223 of the conductive layers 220 and the high-k dielectric layers 230 may not be aligned with sidewalls 133 of the dielectric layers 130; instead, the sidewalls 233 of the conductive layers 220 and the high-k dielectric layers 230 are etched in a deeper depth to respectively form concave portions 225 between the dielectric layers 130. This ensures that the conductive layers 220 and the high-k dielectric layers 230 disposed in the trench 170 are completely removed by the selective etching process.

Figure 14A:
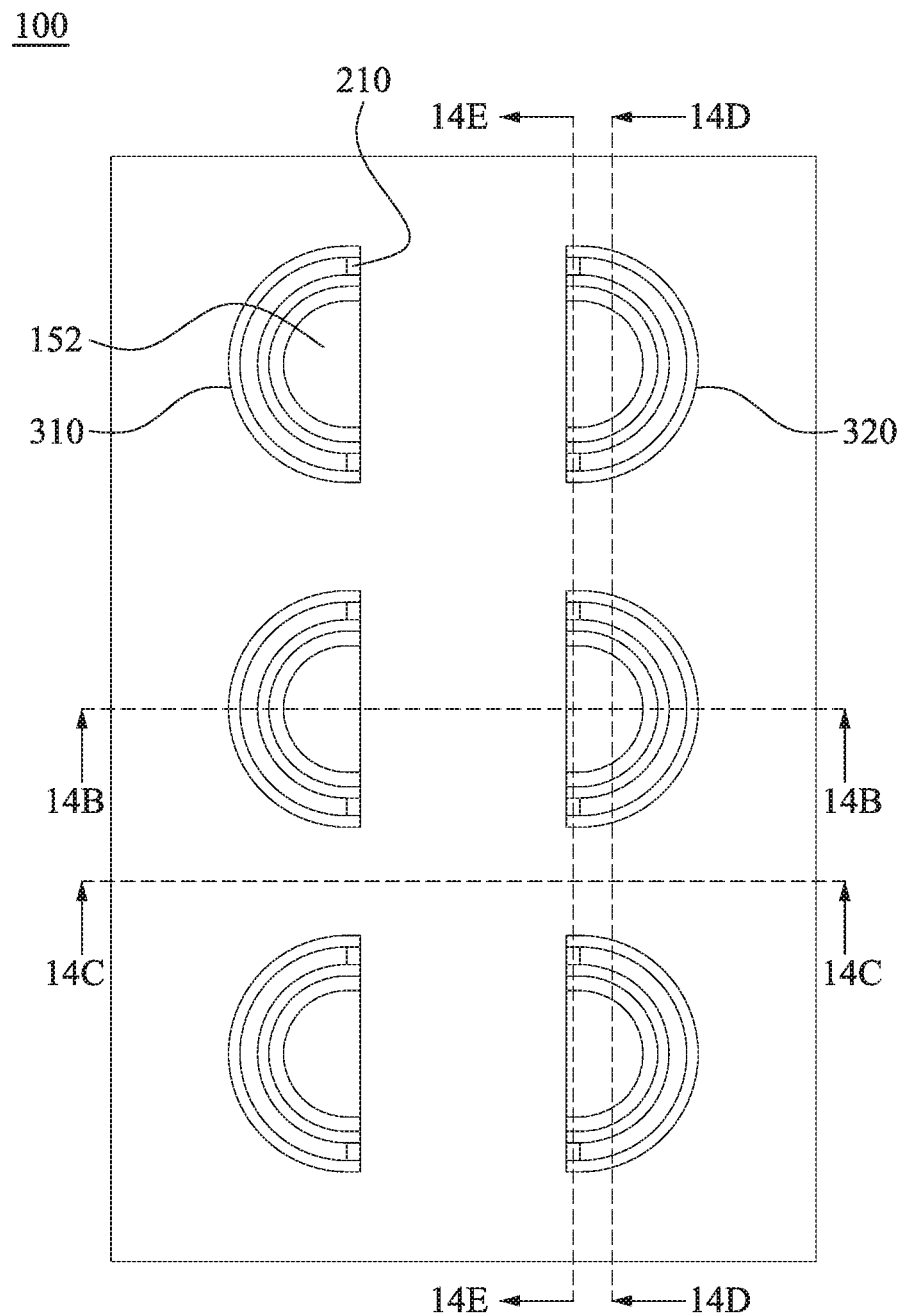
Figure 14B:
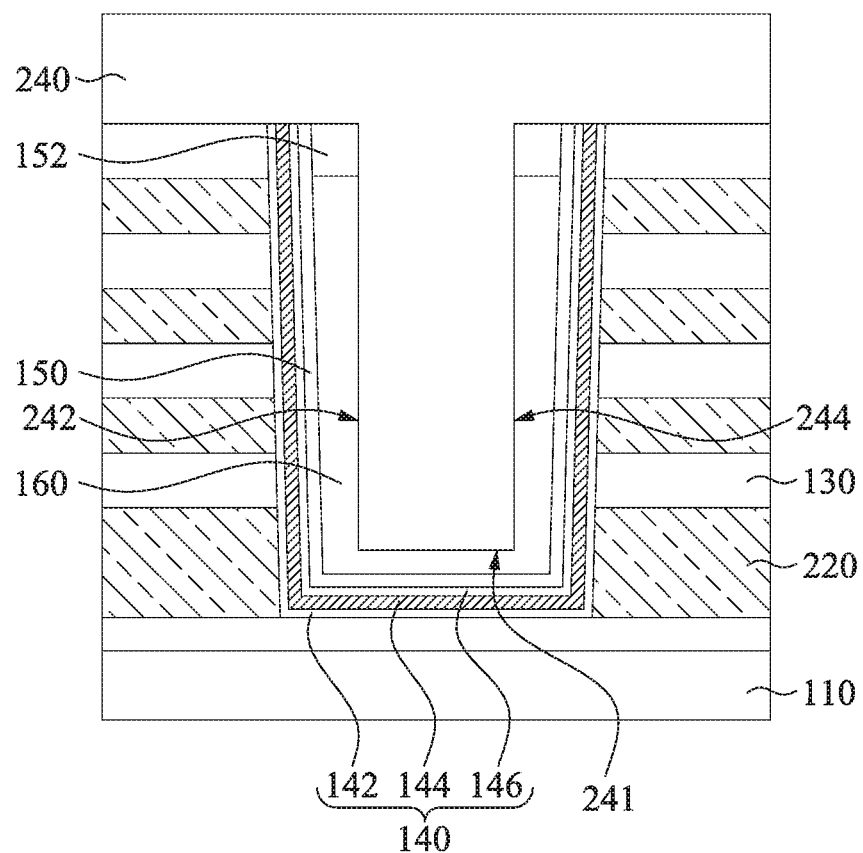
Figure 14C:
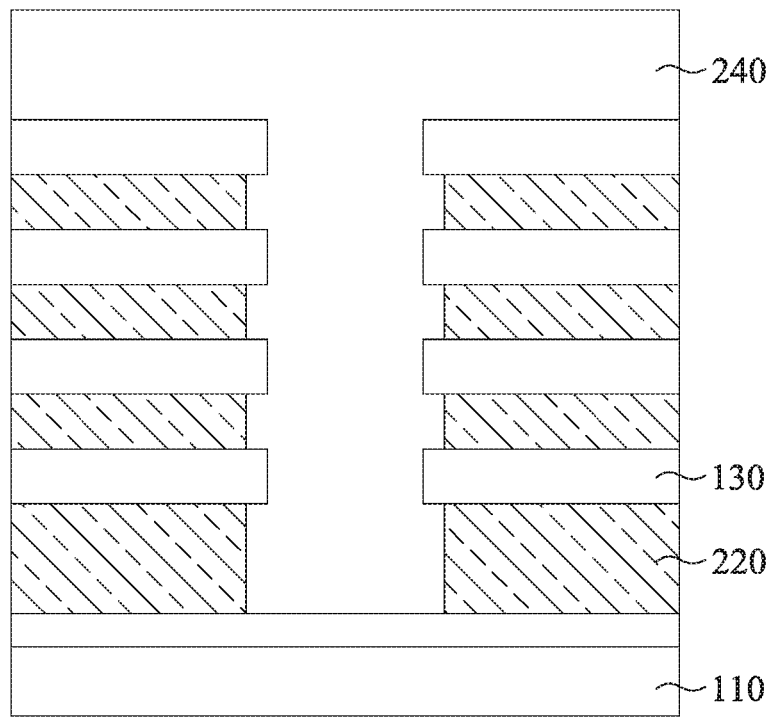
Figure 14D:
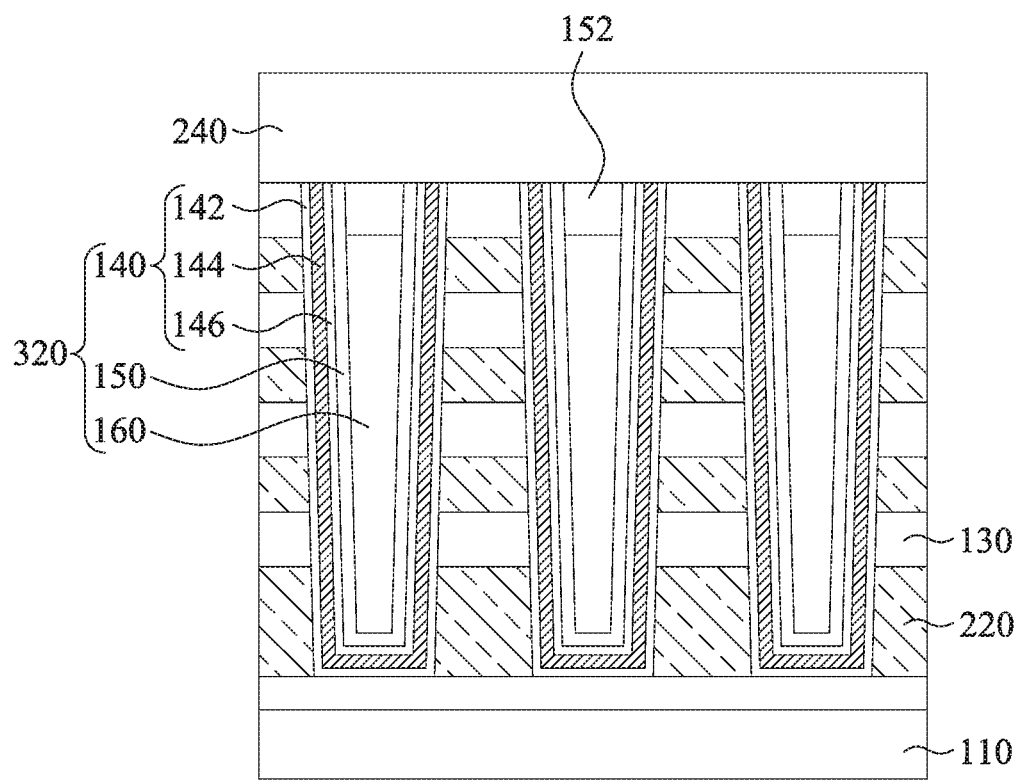
Figure 14E:
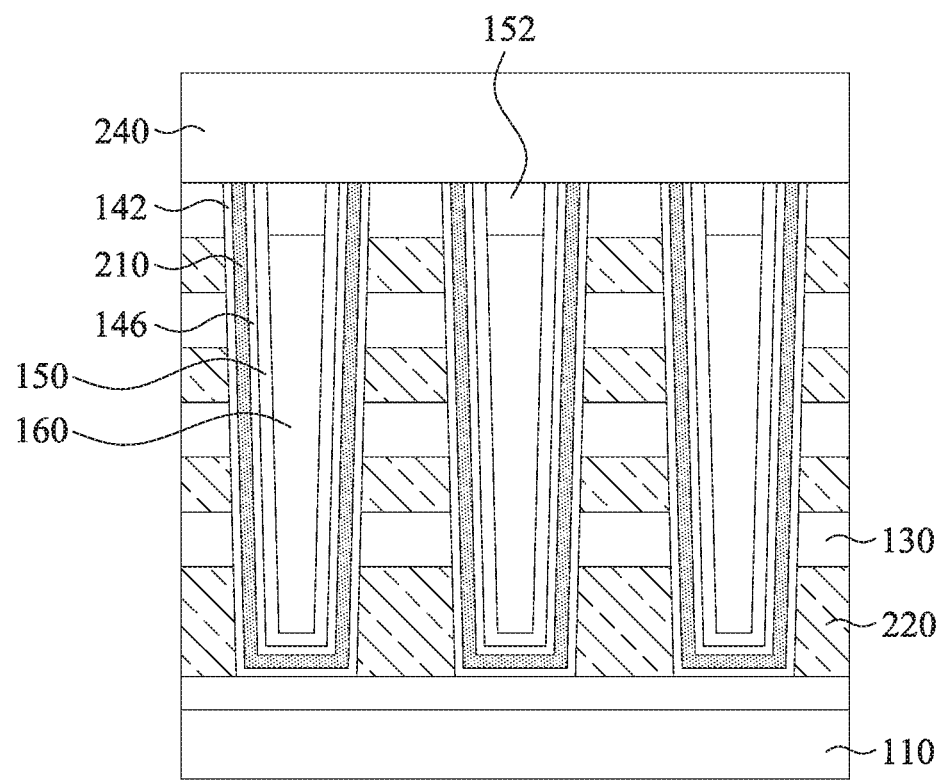

Reference is made to FIGS. 14A-14E, in which FIG. 14A is a top view of step S140 of forming the semiconductor structure 100, FIG. 14B is a cross-sectional view taken along line 14B-14B in FIG. 14A, FIG. 14C is a cross-sectional view taken along line 14C-14C in FIG. 14A, FIG. 14D is a cross-sectional view taken along line 14D-14D in FIG. 14A, and FIG. 14E is a cross-sectional view taken along line 14E-14E in FIG. 14A. In step S140, the isolation structure 240 is then filled in the trench 170 and disposed on the first memory structure 310, the second memory structure 320, and the topmost layer of the dielectric layers 130. The isolation structure 240 has a T-shaped vertical cross section shown in FIG. 14B-14C. Namely, the isolation structure 240 has a first portion interposed between the first memory structure 310 and the second memory structure 320 and a second portion above the semiconductor structure 100. After the isolation structure 240 is disposed, the semiconductor structure 100 including the memory structure cluster 300 (including the first memory structure 310 and the second memory structure 320) of a U-shaped vertical cross section is provided, shown in the FIG. 14A-14B. In some embodiments of the present disclosure, the memory structure layer 140, the channel layer 150, and the dielectric structure 160 corresponding to the first memory structure 310 are respectively interconnected with the memory structure layer 140, the channel layer 150, and the dielectric structure 160 corresponding to the second memory structure 320 at a bottom surface 241 of the isolation structure 240. In some other embodiments of the present disclosure, an interlayer dielectric (ILD) layer (not shown in the drawings) may further be disposed on a top surface of the isolation structure 240, such that a planarization of a top surface of the semiconductor structure 100 may be completed. The interlayer dielectric layer may be made of a material including silicon oxide or other dielectric, but the present disclosure is not limited in this regard.

In the aforementioned embodiments of the present disclosure, the manufactured semiconductor structure 100 includes the substrate 110, the conductive layers 220, the dielectric layers 130, the isolation structure 240, the first memory structure 310, and the second memory structure 320. The conductive layers 220 and the dielectric layers 130 are interlaced and stacked on the substrate 110. The isolation structure 240 is disposed on the substrate 110 and through the conductive layers 240 and the dielectric layers 130. The first memory structure 310 and the second memory structure 320 are disposed on the substrate 110, through the conductive layers 220 and the dielectric layers 130, and on opposite sidewalls 242, 244 of the isolation structure 240. Furthermore, each of the first memory structure 310 and the second memory structure 320 has a radius of curvature. The first memory structure 310 includes the memory structure layer 140, the channel layer 150, the dielectric structure 160, and the protecting structures 210. The second memory structure 320 includes the memory structure layer 140, the channel layer 150, the dielectric structure 160, and the protecting structures 210. The memory structure layer 140 includes the memory storage layer 144. The channel layer 150 is disposed between the memory structure layer 144 and the isolation structure 240. The dielectric structure 160 is disposed between the channel layer 150 and the isolation structure 240, in which a portion of the channel layer 150 is disposed on a top surface of the dielectric structure 160. The protecting structures 210 are disposed between the memory storage layer 144 and the opposite sidewalls 242, 244 of the isolation structure 240 and are disposed at two ends of the memory storage layer 144, in which an etching selectivity to the protecting structures 210 is different from an etching selectivity to the memory storage layer 144.

Since the first memory structure 310 and the second memory structure 320 of the semiconductor structure 100 are separated from each other by the isolation structure 240, the memory density in a unit area is increased, and hence a greater memory storage capacity is achieved. Furthermore, the conductive layers 220 stacked between the dielectric layers 130 can help improve the program speed as well as the erase speed of the semiconductor structure 100 due to the lower resistance.

It is to be noted that the connection relationships, the materials, and the advantages of the elements described above will not be repeated in the following description. In the following description, further details of providing a semiconductor device 500 by processing the manufactured semiconductor structure 100 will be discussed.

Figure 15A:
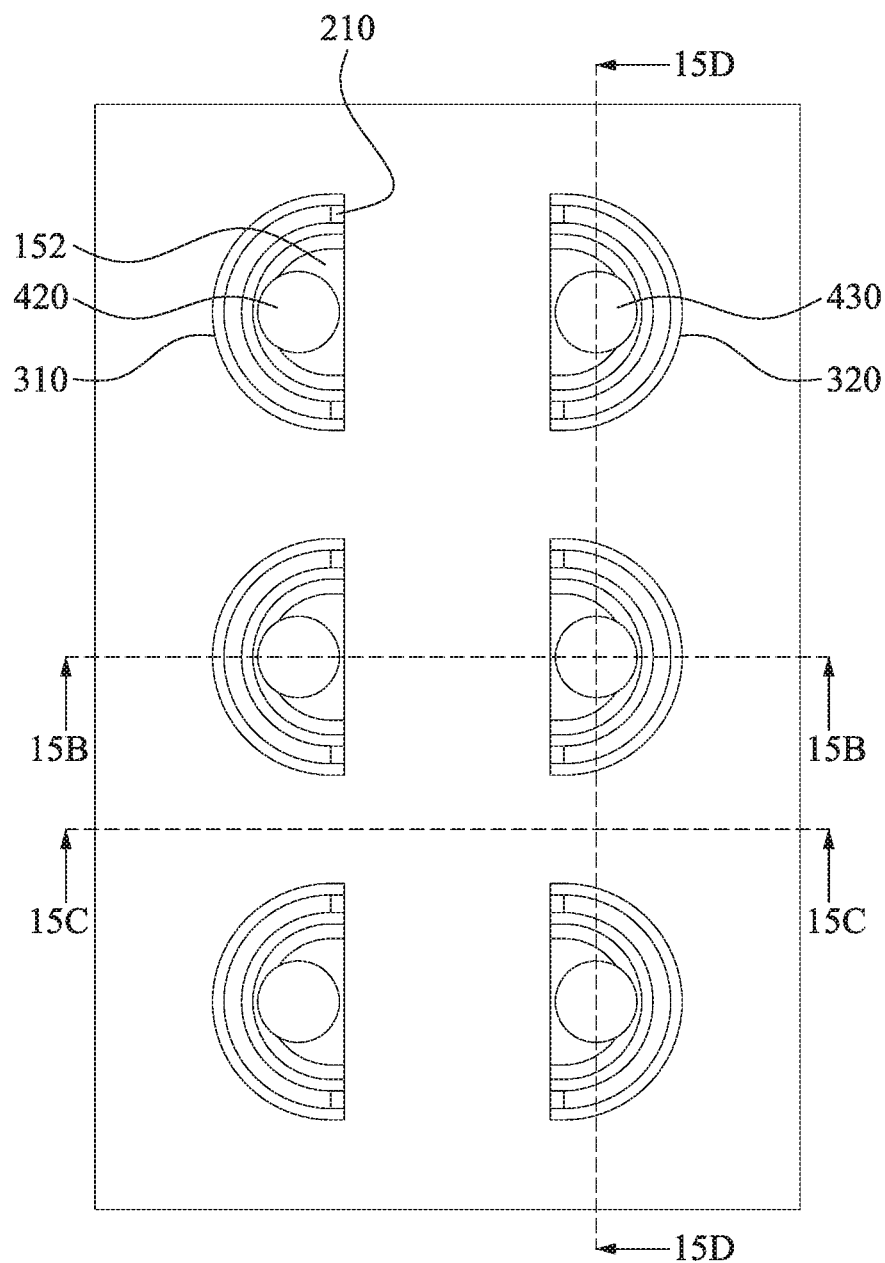
FIGS. 15A, 16A, 17A, 18A and 19A are top views of a process at various stages of a manufacturing method of a semiconductor device according to an embodiment of the present disclosure.
Figure 15B:
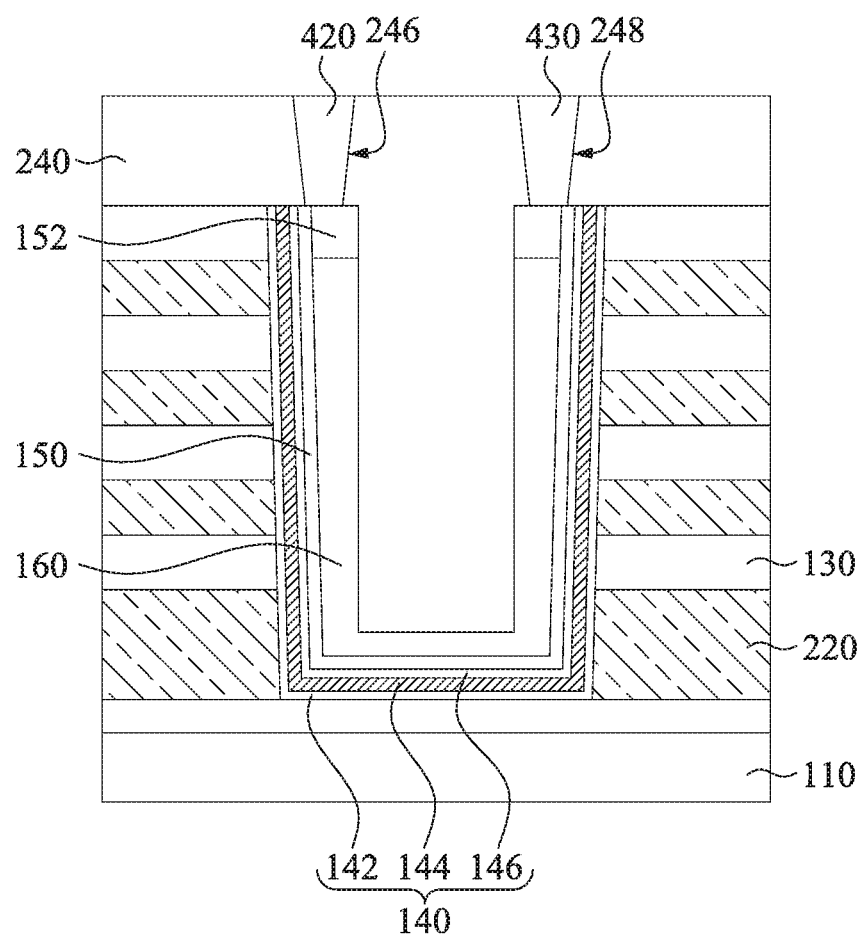
FIGS. 15B-15D, 16B-16D, 17B, 18B, 19B-19D are cross-sectional views of a process at various stages of a manufacturing method of a semiconductor device according to an embodiment of the present disclosure.
Figure 15C:
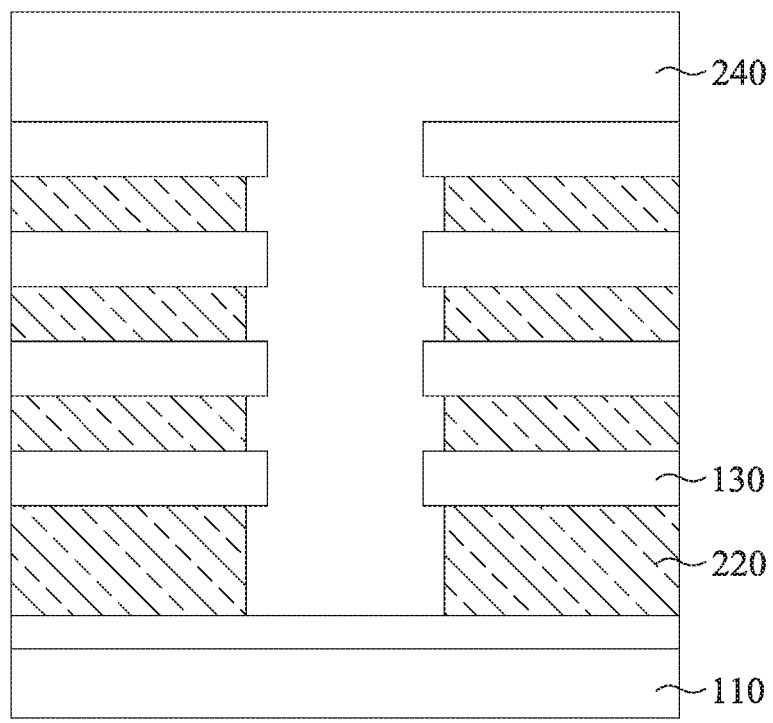
Figure 15D:
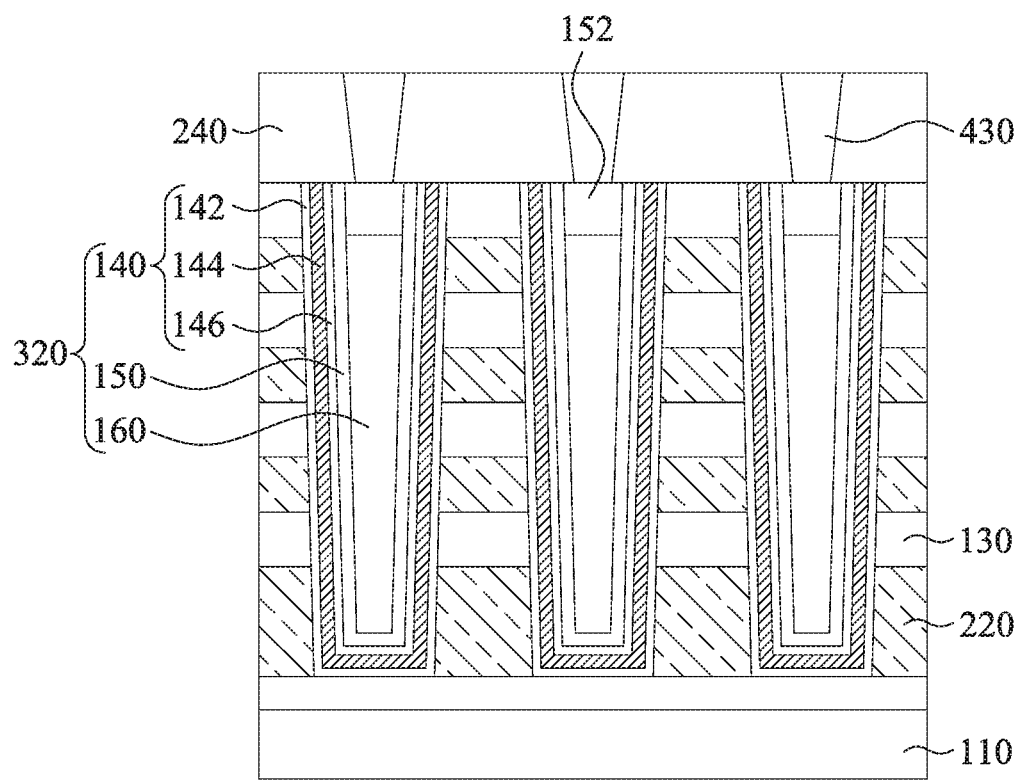

Reference is made to FIGS. 15A-15D, in which FIG. 15A is a top view of step S150 of providing a semiconductor device 500, FIG. 15B is a cross-sectional view taken along line 15B-15B in FIG. 15A, FIG. 15C is a cross-sectional view taken along line 15C-15C in FIG. 15A, and FIG. 15D is a cross-sectional view taken along line 15D-15D in FIG. 15A. In step S150, after the semiconductor structure 100 is provided, two contact holes 246, 248 are then formed in the isolation structure 240 disposed on the memory structure cluster 300, such that a portion of the channel layer 150 and a portion of the conductive plug layer 152 corresponding to the first memory structure 310 and a portion of the channel layer 150 and a portion of the conductive plug layer 152 corresponding to the second memory structure 320 are respectively exposed from the contact hole 246 and the contact hole 248. Next, two first contact structures 420, 430 are then respectively formed in the two contact holes 246, 248, and electrically connected to the channel layer 150 and the conductive plug layer 152 of the first memory structure 310 and the channel layer 150 and the conductive plug layer 152 of the second memory structure 320, respectively.

Figure 16A:
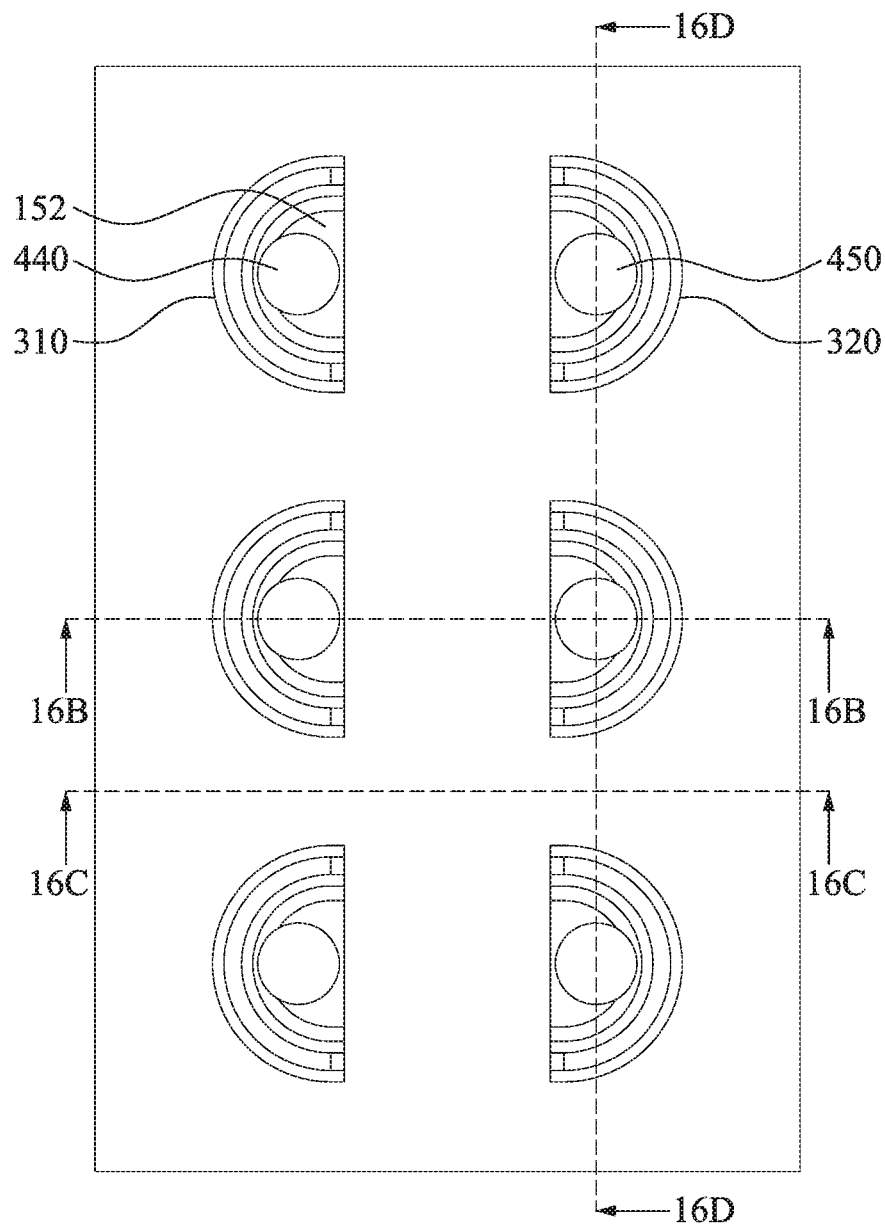
Figure 16B:
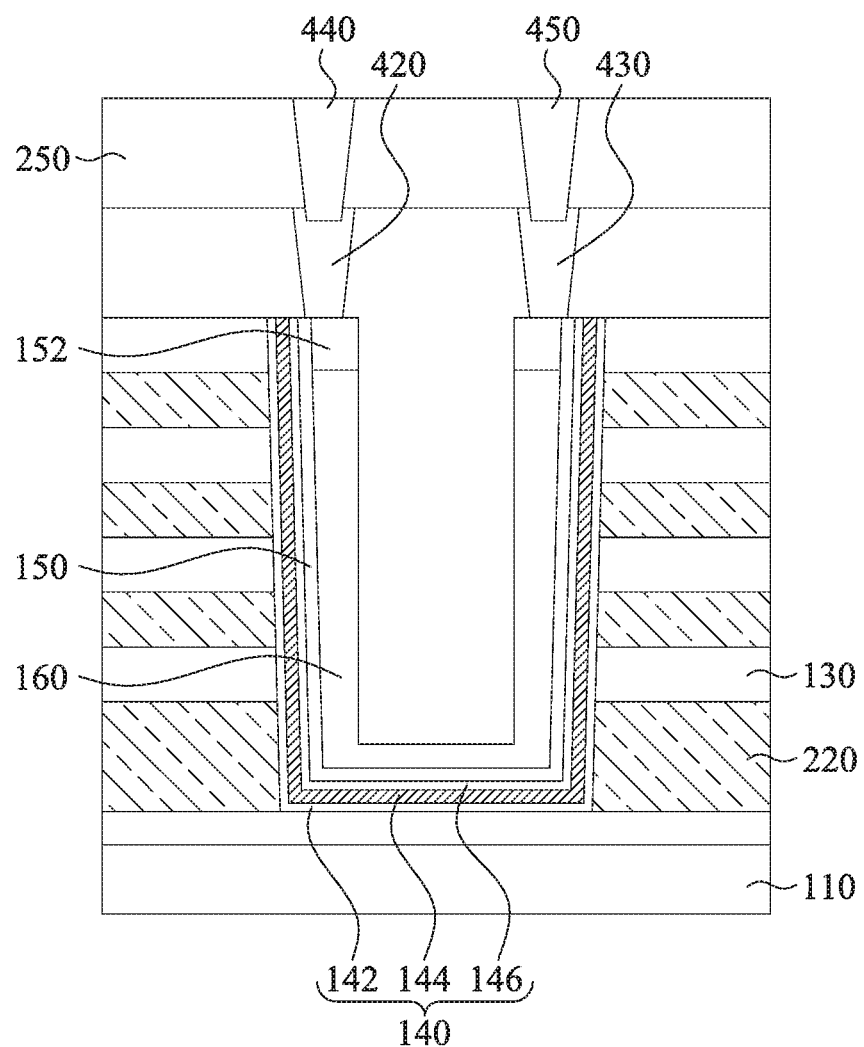
Figure 16C:
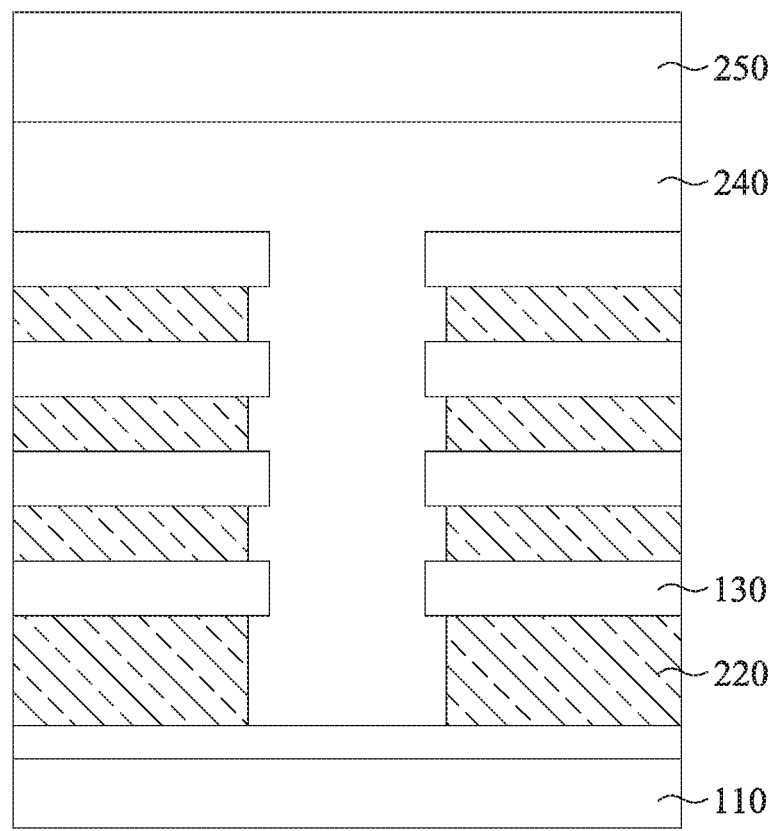
Figure 16D:
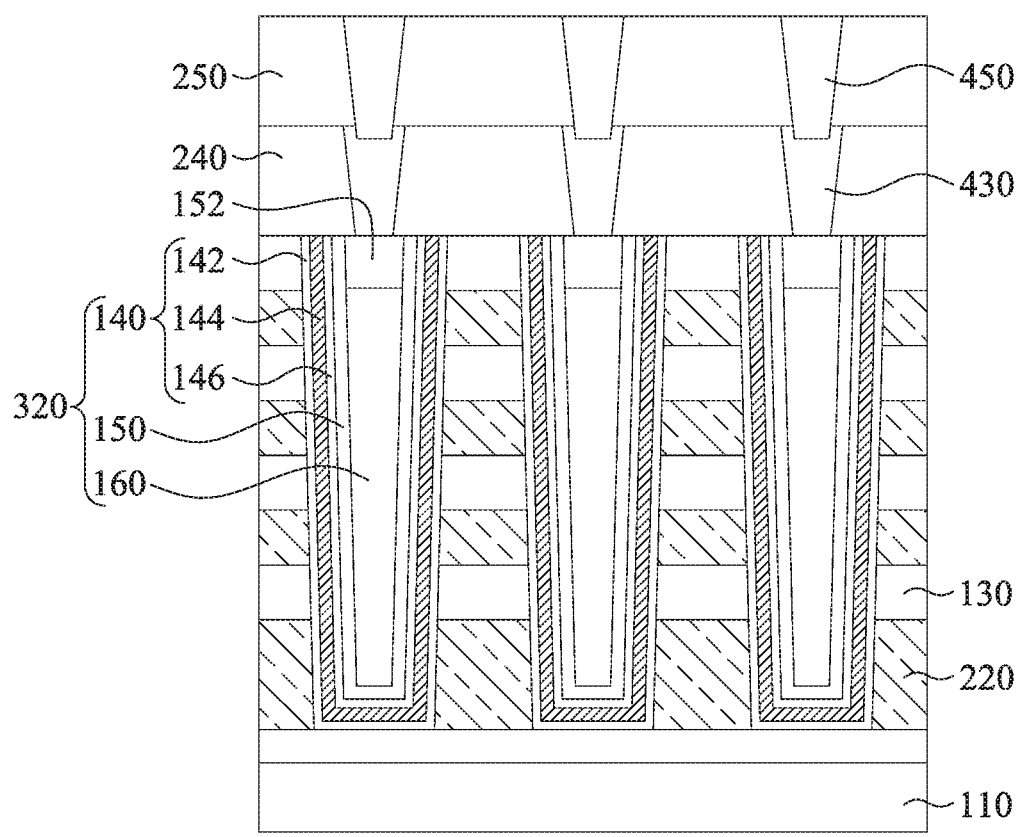

Reference is made to FIGS. 16A-16D, in which FIG. 16A is a top view of step S160 of providing a semiconductor device 500, FIG. 16B is a cross-sectional view taken along line 16B-16B in FIG. 16A, FIG. 16C is a cross-sectional view taken along line 16C-16C in FIG. 16A, and FIG. 16D is a cross-sectional view taken along line 16D-16D in FIG. 16A. In step S160, an isolation layer 250 is further formed on the isolation structure 240, and two second contact structures 440, 450 are then formed in the isolation layer 250 and respectively electrically connected to the two first contact structures 420, 430.

Figure 17A:
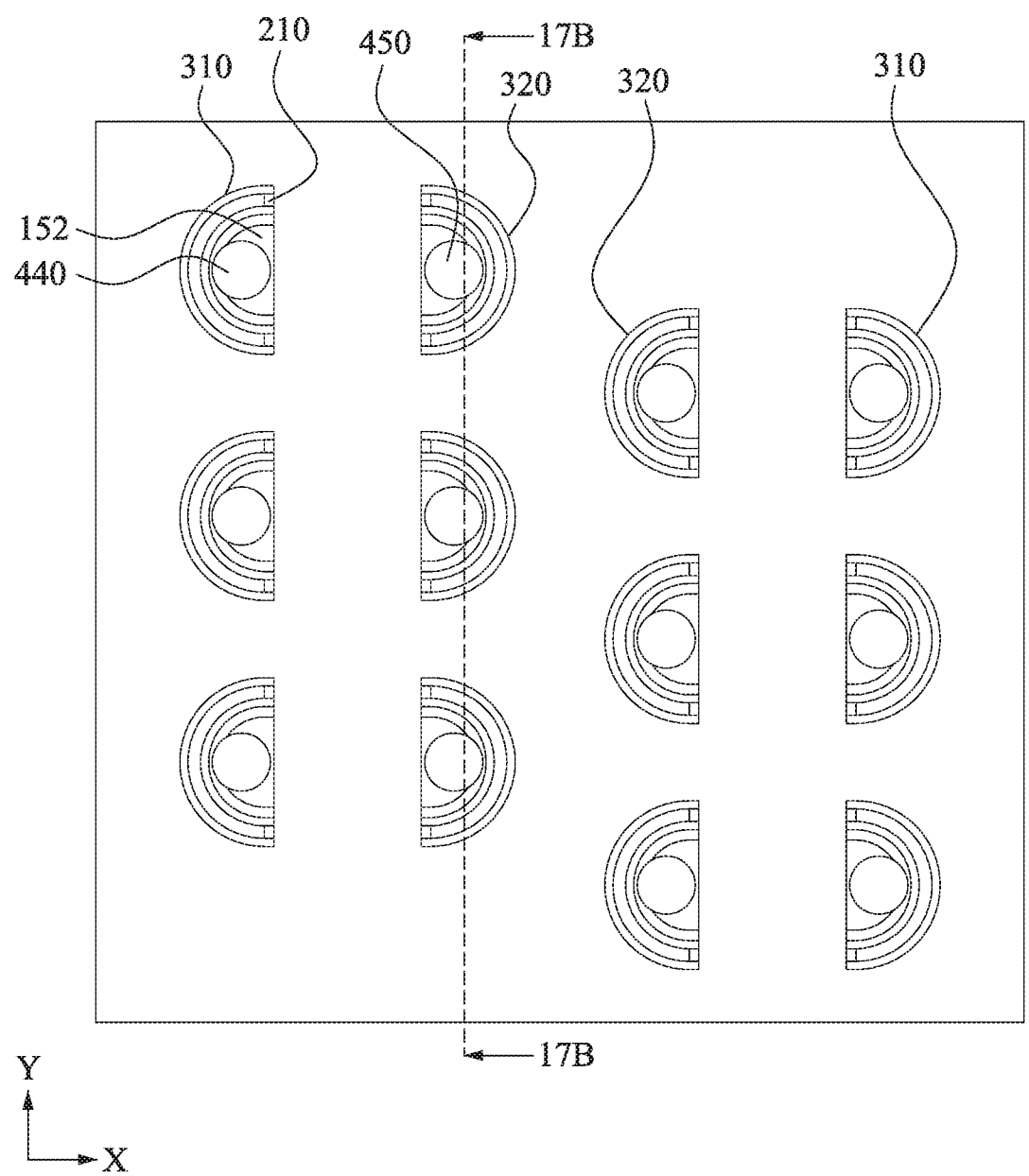
Figure 17B:
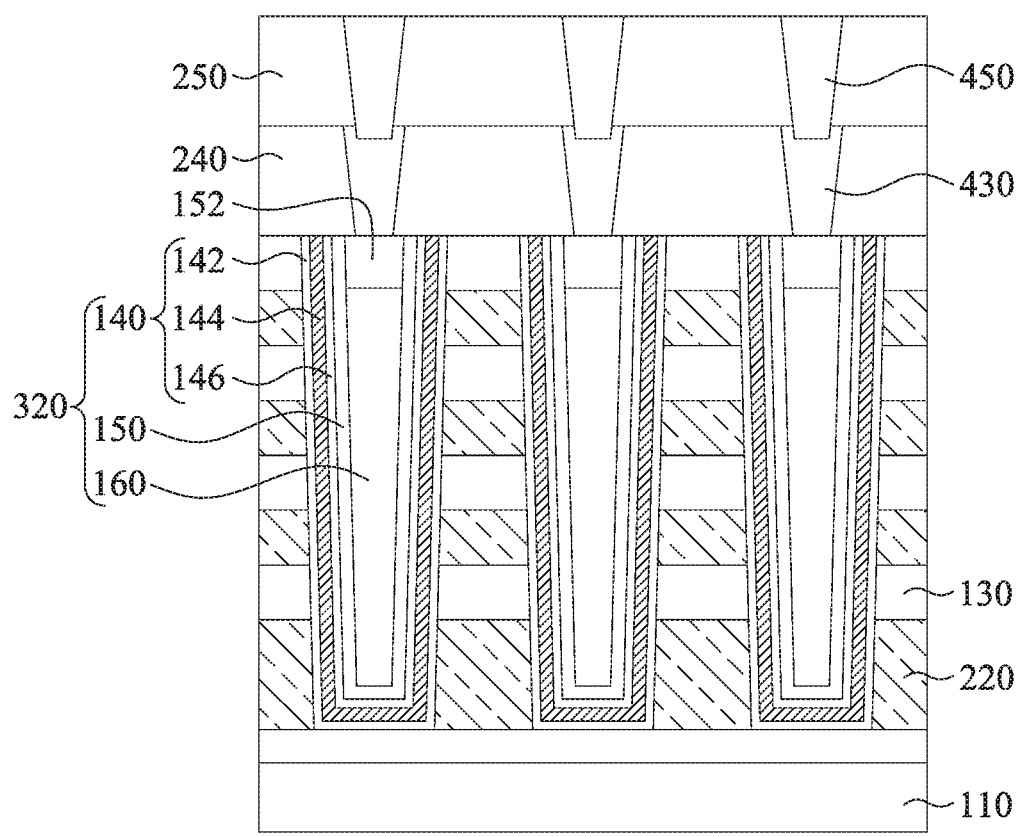

Reference is made to FIGS. 17A and 17B, in which FIG. 17A is a top view of step S170 of providing a semiconductor device 500, and FIG. 17B is a cross-sectional view taken along line 17B-17B in FIG. 17A. In step S170, multiple semiconductor structures 100 are aligned parallel to each other along the Y axis. In other words, the isolation structures 240 of the semiconductor structures 100 may be formed continuously along the Y axis. Furthermore, the semiconductor structures 100 may be staggered with each other along the X axis.

Figure 18A:
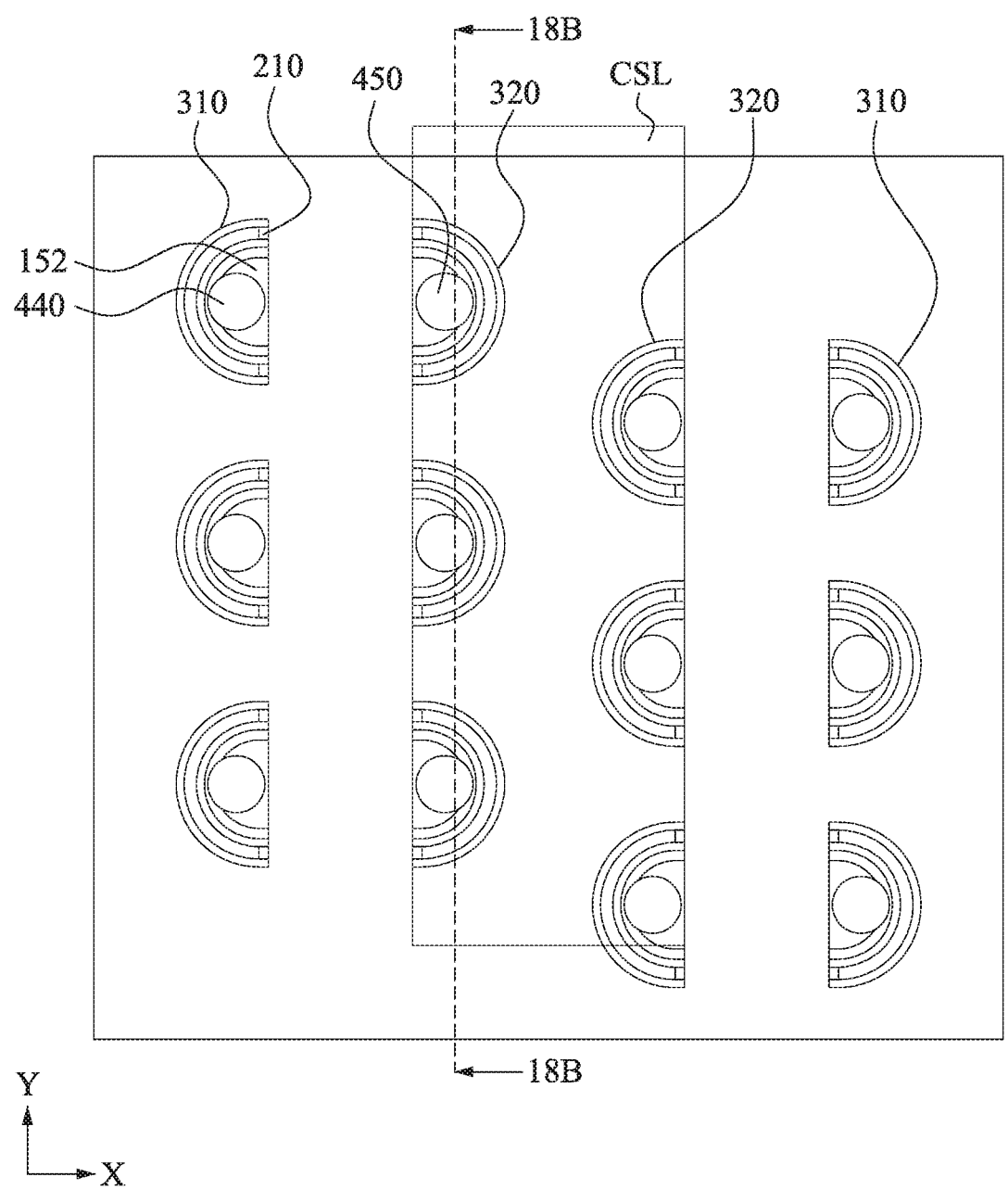
Figure 18B:
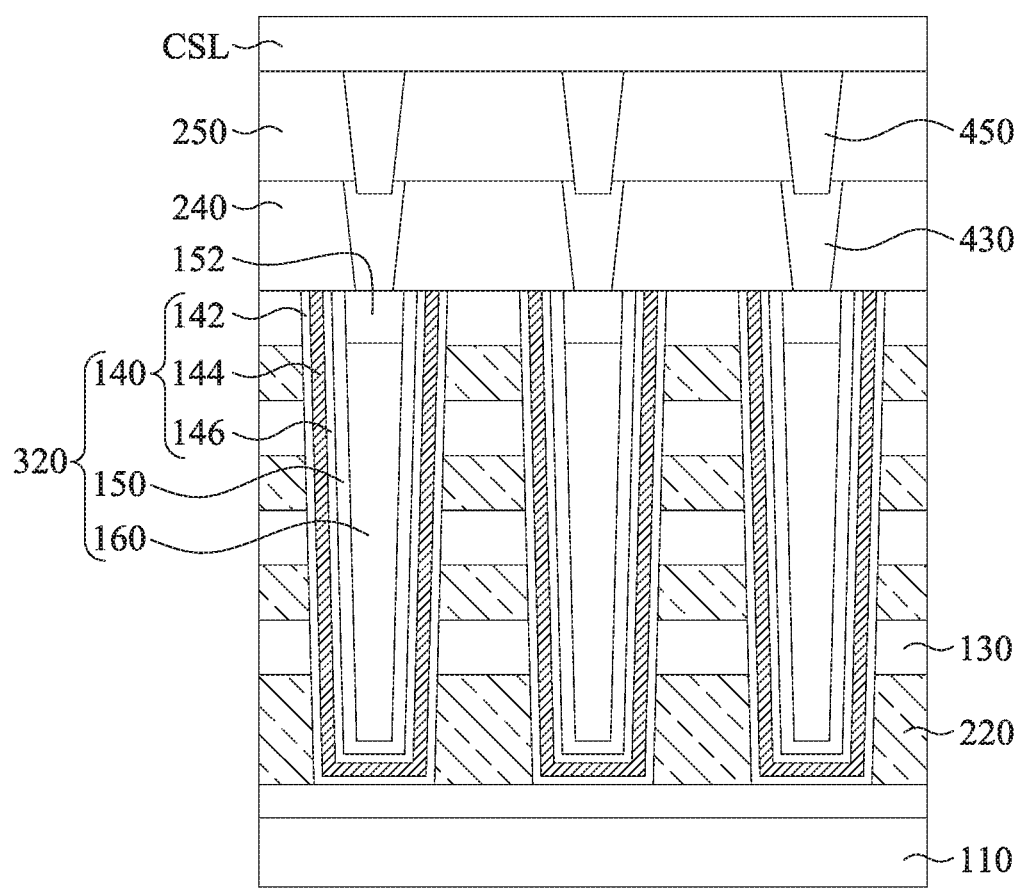

Reference is made to FIGS. 18A and 18B, in which FIG. 18A is a top view of step S180 of providing a semiconductor device 500, and FIG. 18B is a cross-sectional view taken along line 18B-18B in FIG. 18A. In step S180, signal line such as a common source line (CSL) may then be formed to electrically connect to the second contact structures 440 formed on the adjacent semiconductor structures 100, and the common source line is parallel to the continuously formed isolation structures 240.

Figure 19A:
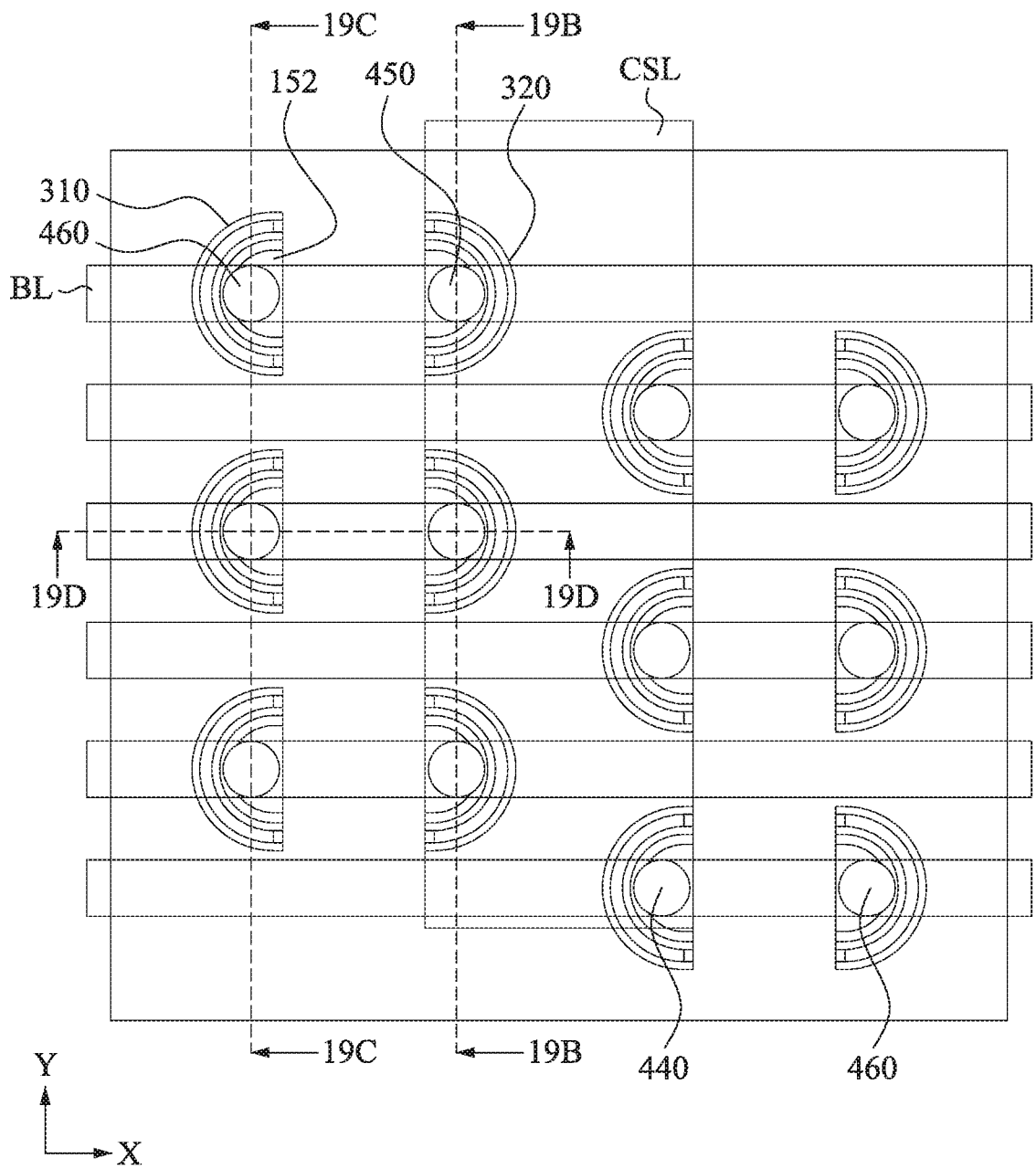
Figure 19B:
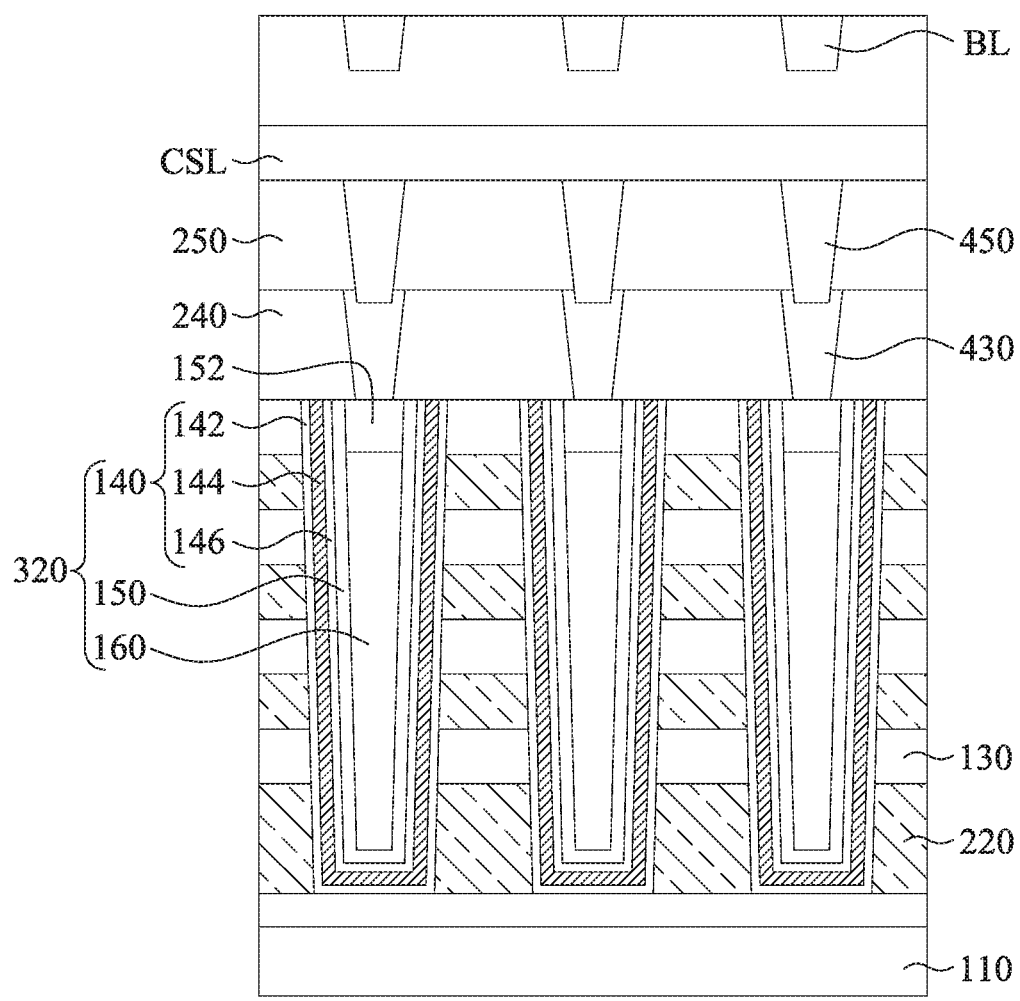
Figure 19C:
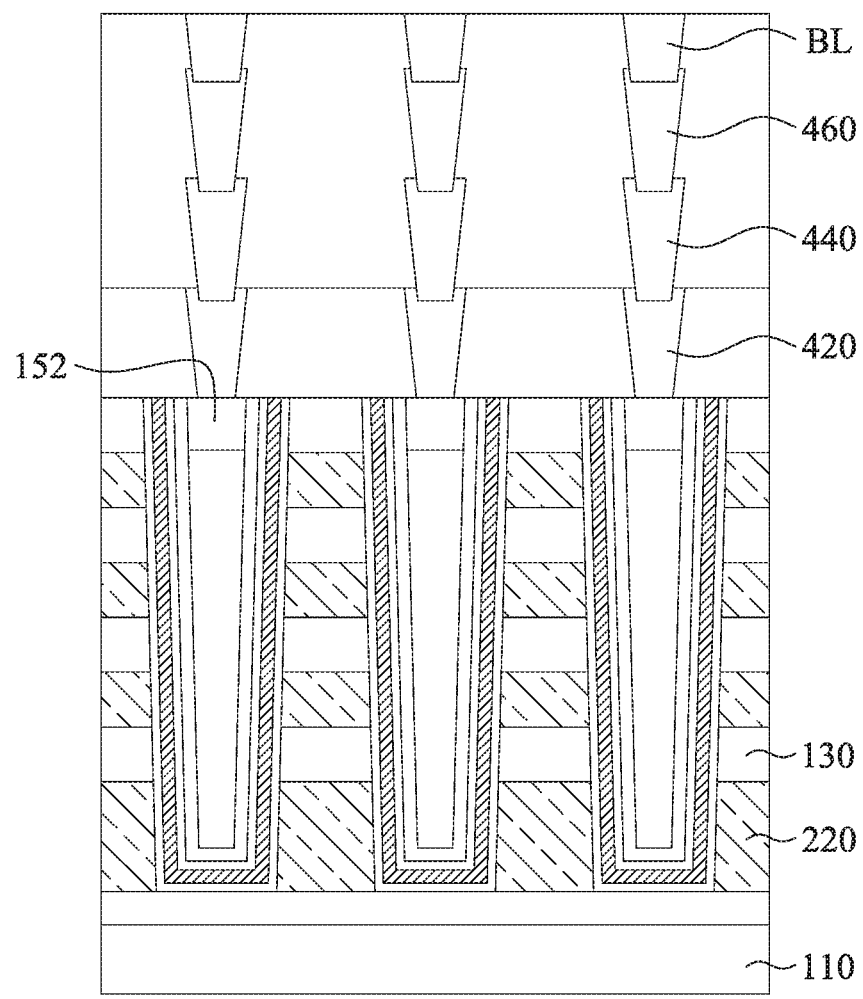
Figure 19D:
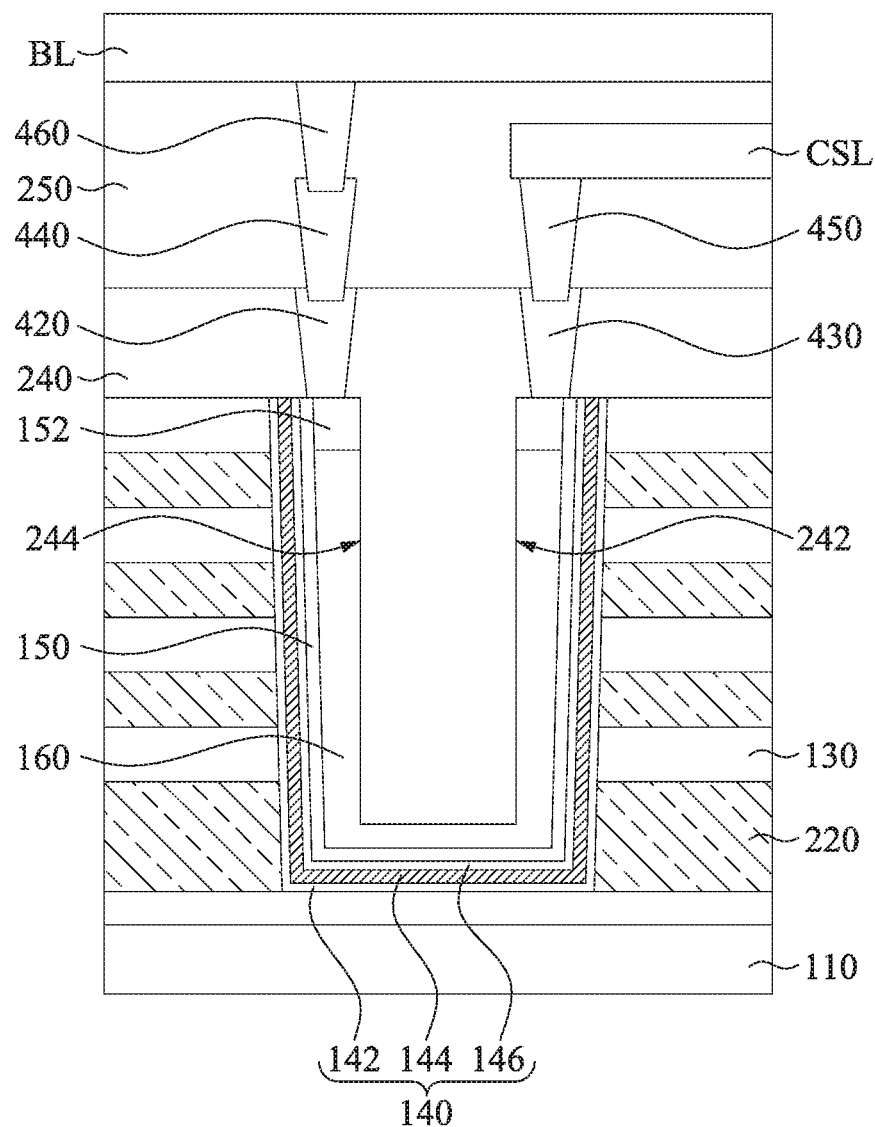

Reference is made to FIGS. 19A-19D, in which FIG. 19A is a top view of step S190 of providing a semiconductor device 500, FIG. 19B is a cross-sectional view taken along line 19B-19B in FIG. 19A, FIG. 19C is a cross-sectional view taken along line 19C-19C in FIG. 19A, and FIG. 19D is a cross-sectional view taken along line 19D-19D in FIG. 19A. In step S190, third contact structures 460 are then electrically connected to the second contact structures 440/450 which are not electrically connected to the common source line. Next, bit lines (or namely signal lines) may be formed over the common source line and electrically connected to the third contact structures 460. The bit lines are generally orthogonal to the common source line and the continuous isolation structures 240. After forming the bit lines, the semiconductor device 500 is provided.

In the aforementioned embodiments of the present disclosure, as shown in FIG. 19D, while the semiconductor device 500 is used in a 3D memory device, the topmost layers of the conductive layers 220 on the opposite sidewalls 242, 244 of the isolation structure 240 may respectively function as a ground select line (GSL) and a string select line (SSL), and the semiconductor device 500 is such as a vertical channel type memory device.

Figure 20A:
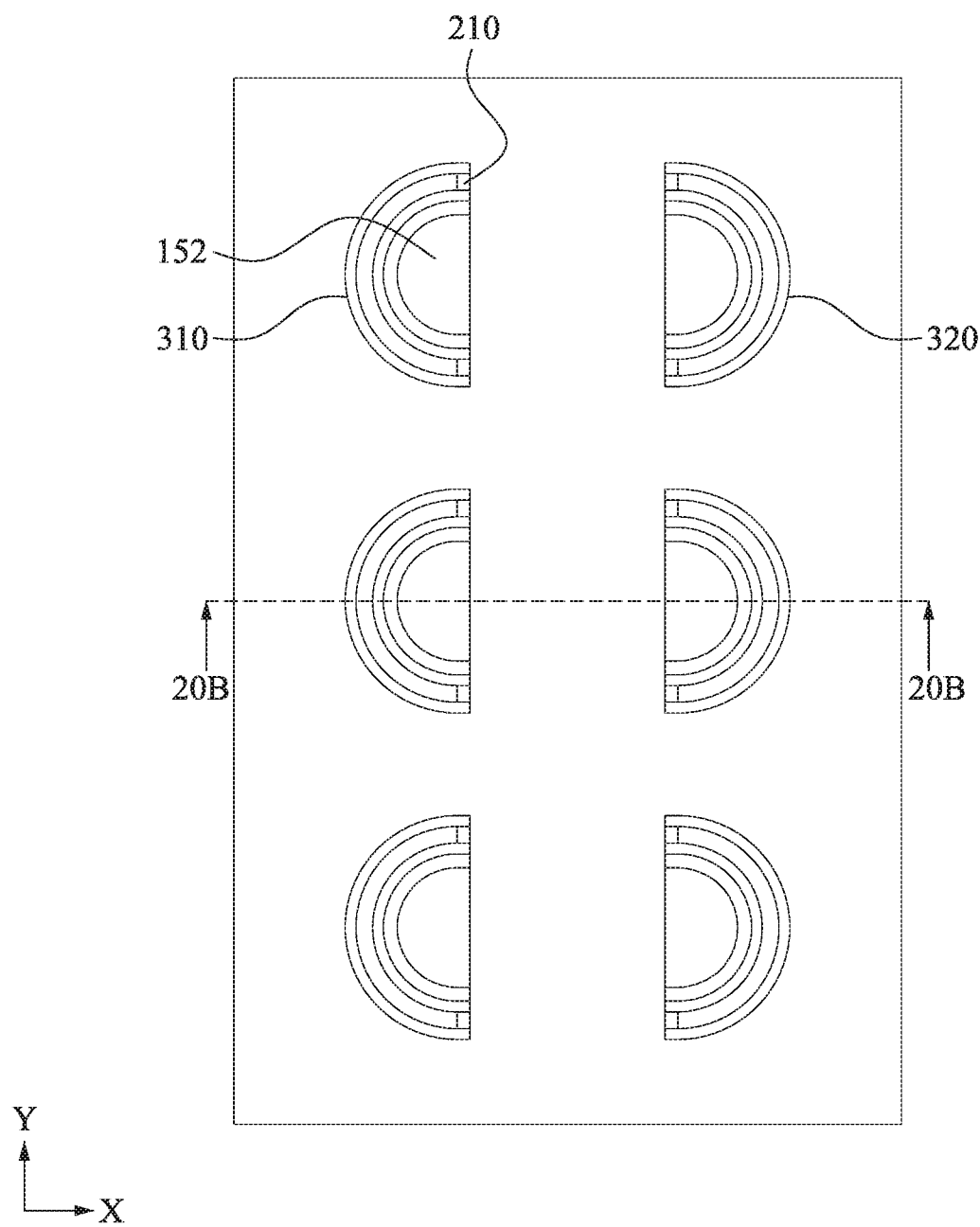
FIG. 20A is a top view of a process at various stages of a manufacturing method of a semiconductor structure according to another embodiment of the present disclosure.
Figure 20B:
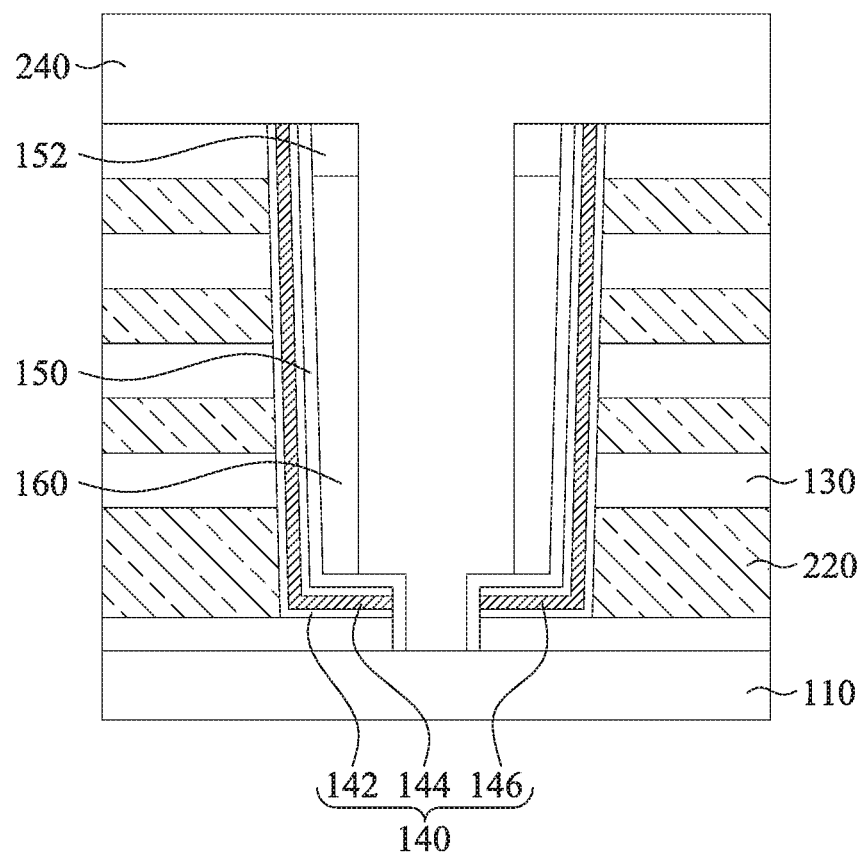
FIG. 20B is a cross-sectional view of a process at various stages of a manufacturing method of a semiconductor structure according to another embodiment of the present disclosure.

In the following description, another embodiment of the present disclosure of a semiconductor structure 100a is provided. FIGS. 20A-20B are the embodiment of the present disclosure of the semiconductor structure 100a.

Reference is made to FIGS. 20A and 20B, in which FIG. 20A is a top view of step S200 of forming the semiconductor structure 100a, and FIG. 20B is a cross-sectional view taken along line 20B-20B in FIG. 20A. Compared to the semiconductor structure 100 shown in FIGS. 14A-14E, the semiconductor structure 100a includes the memory structure cluster 300 without a U-shaped vertical cross section. In the embodiment, the memory structure layer 140, the channel layer 150, and the dielectric structure 160 corresponding to the first memory structure 310 are respectively separated from the memory structure layer 140, the channel layer 150, and the dielectric structure 160 corresponding to the second memory structure 320 by the isolation structure 240, and the isolation structure 240 and each of the channel layers 150 are in contact with the substrate 110. For example, each of the channel layers 150 is electrically connected to the circuits configured on the substrate 110.

In order to provide the semiconductor structure 100a shown in FIGS. 20A-20B, a manufacturing method is further provided. The manufacturing method herein is substantially the same as the manufacturing method mentioned above. Some differences occur at forming the recess 400 shown in FIGS. 1A-1B and the trench 170 shown in FIGS. 7A-7C. In detail, a difference of the manufacturing method herein further includes a step of extending the recess 400 through the memory structure layer 140 after forming the memory structure layer 140 in the recess 400, such that a portion of the substrate 110 is exposed from a bottom of the recess 400. Next, the channel layer 150 is formed on the memory structure layer 140 and the portion of the substrate 110. The subsequent steps are referred to the manufacturing method mentioned in the aforementioned embodiments. Another difference occurs when coming to the step of forming the trench 170 through the insulating layers 120, the dielectric layers 130, and the memory structure cluster 300. The trench 170 herein is formed by removing portions of the insulating layers 120, portions of the dielectric layers 130, a portion of the channel layer 150, a portion of the conductive plug layer 152, and a portion of the dielectric structure 160 such that the memory structure layer 140, the channel layer 150, the conductive plug layer 152, and the dielectric structure 160 corresponding to the first memory structure 310 are respectively separated from the memory structure layer 140, the channel layer 150, the conductive plug layer 152, and the dielectric structure 160 corresponding to the second memory structure 320, by the trench 170 and the subsequently disposed isolation structure 240. Each of the channel layers 150 is in contact with the substrate 110, such that the circuits on the substrate can be electrically connected to the channel layers 150.

It is to be noted that the connection relationships, the materials, and the advantages of the elements described above will not be repeated in the following description. In the following description, further details of providing a semiconductor device 500a by processing the manufactured semiconductor structure 100a will be discussed.

Figure 21A:
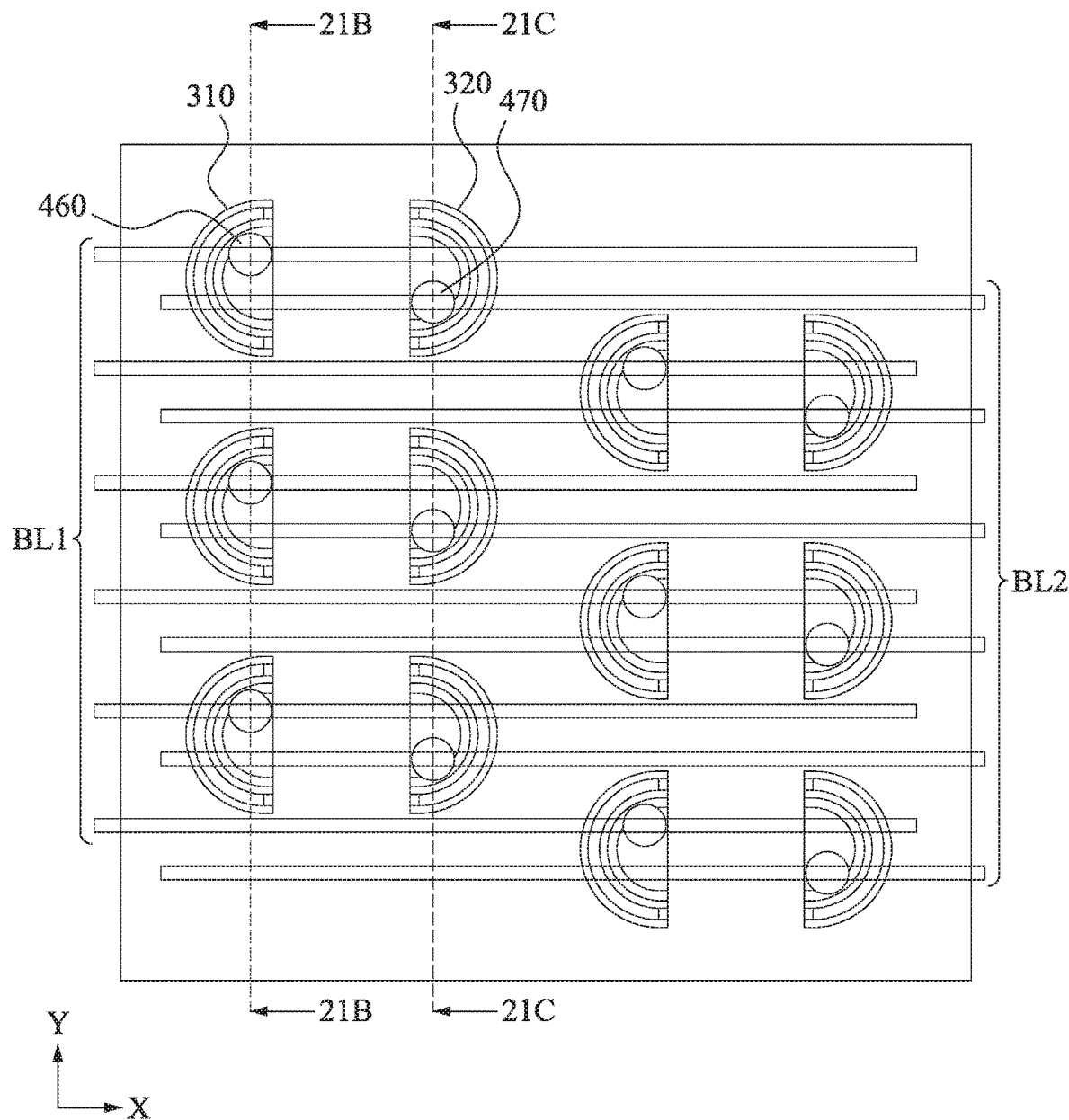
FIG. 21A is a top view of a process at various stages of a manufacturing method of a semiconductor device according to another embodiment of the present disclosure.
Figure 21B:
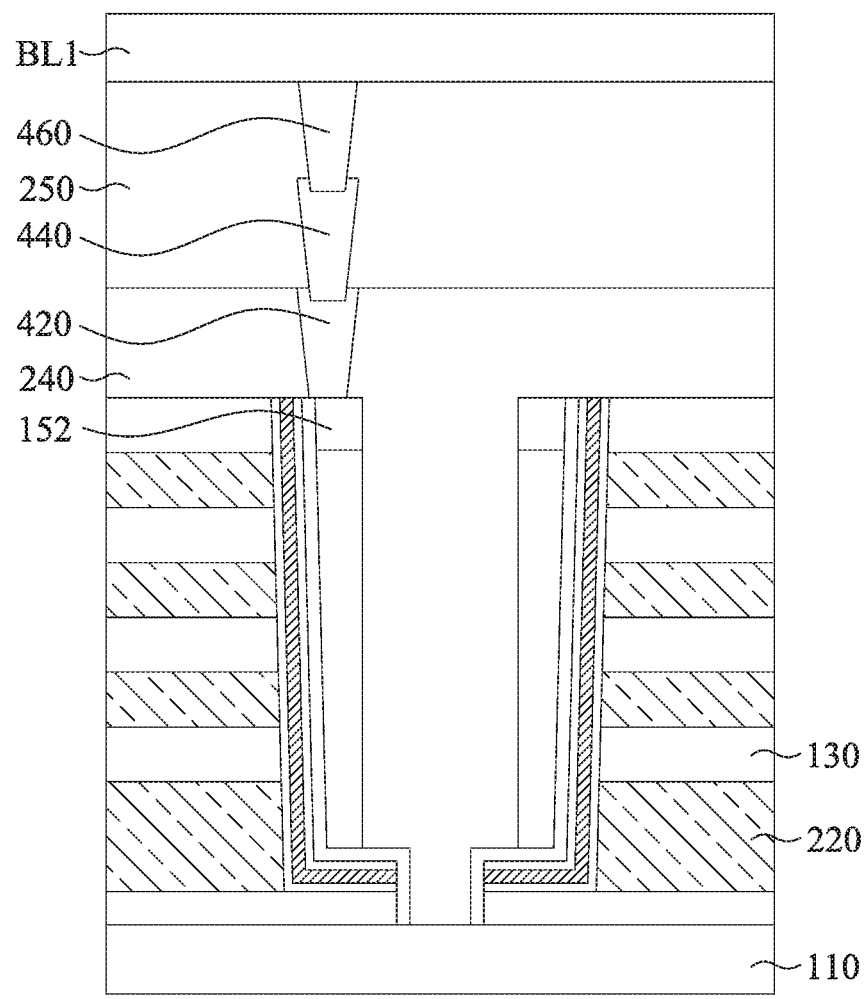
FIGS. 21B-21C are cross-sectional views of a process at various stages of a manufacturing method of a semiconductor device according to another embodiment of the present disclosure.
Figure 21C:
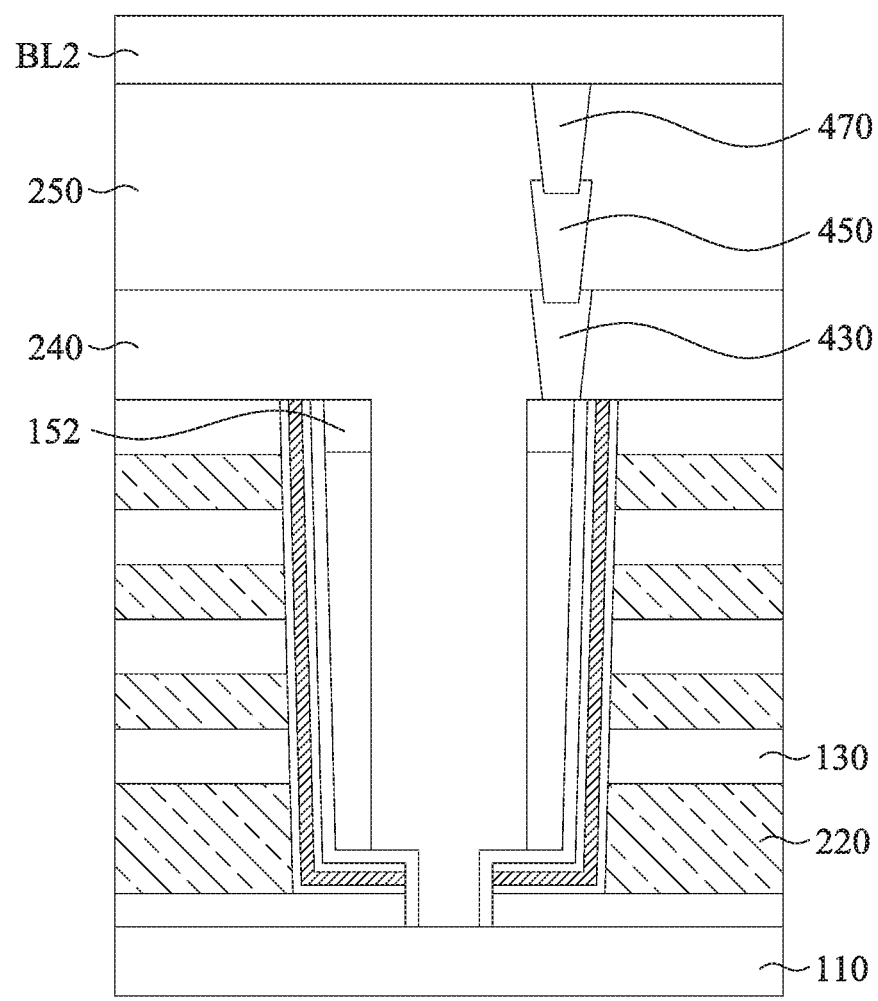

Reference is made to FIGS. 21A-21C, in which FIG. 21A is a top view of step S210 of providing a semiconductor device 500a, FIG. 21B is a cross-sectional view taken along line 21B-21B in FIG. 21A, and FIG. 21C is a cross-sectional view taken along line 21C-21C in FIG. 21A. Compared to the semiconductor device 500 shown in FIGS. 19A-19D, there is no common source line formed on the two second contact structures 440, 450 of the semiconductor structure 100a, instead, two third contact structures 460, 470 are formed on both of the second contact structures 440, 450, respectively. Furthermore, the first contact structure 420, the second contact structure 440, and the third contact structure 460 corresponding to the first memory structure 310 are respectively staggered with the first contact structure 430, the second contact structure 450, and the third contact structure 470 corresponding to the second memory structure 320. Bit lines are formed on semiconductor device 500a to form a first group of bit lines (BL1) and a second group of bit lines (BL2). The first group of bit lines is electrically connected to the third contact structures 460 disposed on the first memory structures 310 while the second group of bit lines is electrically connected to the third contact structures 470 disposed on the second memory structures 320.

In the aforementioned embodiments of the present disclosure, while the semiconductor device 500a is used in a 3D memory device, the substrate 110 may function as a bottom source, the bottommost layer of the conductive layers 220 is such as a ground select line (GSL), the topmost layer of the conductive layers 220 is such as a string select line (SSL), and the semiconductor device 500a is such as a vertical channel type memory device. Furthermore, since the bilaterally symmetrically arranged first memory structure 310 and second memory structure 320 are respectively connected to different bit lines (BL1 and BL2, also signal lines), the memory density is increased, and different program/erase operations can be processed simultaneously since different vertical memory structures can be selected via different bit lines simultaneously, and thus the processing speed can be further increased.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A manufacturing method of a semiconductor structure, comprising the following steps of:

forming a plurality of insulating layers and a plurality of dielectric layers on a substrate, wherein the insulating layers and the dielectric layers are interlaced and stacked on the substrate;

forming a memory structure cluster on the substrate and through the insulating layers and the dielectric layers, wherein the memory structure cluster comprises a channel layer, a conductive plug layer, and a memory structure layer comprising a memory storage layer;

forming a trench through the insulating layers, the dielectric layers, and the memory structure cluster, such that the memory structure cluster is separated into a first memory structure and a second memory structure, and portions of the insulating layers and portions of the memory storage layer are exposed from the trench;

removing the exposed portions of the insulating layers and the exposed portions of the memory storage layer to respectively form a first group of spaces and a second group of spaces;

filling a plurality of protecting structures in the first group of spaces and the second group of spaces;

removing portions of the protecting structures such that the insulating layers are exposed from the first group of spaces; and replacing the insulating layers with a plurality of conductive layers.

2. The manufacturing method of claim 1, wherein replacing the insulating layers with the conductive layers comprises:

removing the insulating layers, after the insulating layers are exposed, to form a third group of spaces between the dielectric layers; and filling the conductive layers in the first group of spaces and the third group of spaces.

3. The manufacturing method of claim 2, further comprising:

forming an isolation structure in the trench and on the memory structure cluster and a topmost layer of the dielectric layers after filling the conductive layers in the first group of spaces and the third group of spaces.

4. The manufacturing method of claim 1, wherein the memory structure cluster further comprises a dielectric structure, the tunneling layer is disposed between the dielectric structure and the memory structure layer, and forming the memory structure cluster on the substrate and through the insulating layers and the dielectric layers comprises:

forming a recess with an elliptical profile, wherein the recess penetrates the insulating layers and the dielectric layers;

forming the memory structure layer in the recess and on a topmost layer of the dielectric layers;

forming the channel layer on the memory structure layer;

forming the dielectric structure on the channel layer to fill the recess;

replacing a top portion of the dielectric structure with the conductive plug layer; and removing a portion of the memory structure layer, a portion of the conductive plug layer, and a portion of the channel layer which are exceeded outside the recess.

5. The manufacturing method of claim 1, wherein forming the trench through the insulating layers, the dielectric layers, and the memory structure cluster comprises:

removing portions of the insulating layers, portions of the dielectric layers, a portion of the channel layer, and a portion of the conductive plug layer, such that the memory structure layer and the channel layer corresponding to the first memory structure are respectively interconnected with the memory structure layer and the channel layer corresponding to the second memory structure at a bottom of the trench.

6. The manufacturing method of claim 1, wherein forming the trench through the insulating layers, the dielectric layers, and the memory structure cluster comprises:

removing portions of the insulating layers, portions of the dielectric layers, a portion of the channel layer, and a portion of the conductive plug layer, such that the memory structure layer and the channel layer corresponding to the first memory structure are respectively separated from the memory structure layer and the channel layer corresponding to the second memory structure by the trench.

7. The manufacturing method of claim 1, further comprising:

forming an isolation layer on the memory structure cluster and a topmost layer of the dielectric layers; and forming two contact structures, each electrically connected to the first memory structure and the second memory structure.

\* \* \* \* \*